(12) United States Patent
Nishikawa et al.

(10) Patent No.: US 11,631,691 B2
(45) Date of Patent: Apr. 18, 2023

(54) THREE-DIMENSIONAL FLAT MEMORY DEVICE INCLUDING A DUAL DIPOLE BLOCKING DIELECTRIC LAYER AND METHODS OF MAKING THE SAME

(71) Applicant: SANDISK TECHNOLOGIES LLC, Addison, TX (US)

(72) Inventors: Masatoshi Nishikawa, Nagoya (JP); Kiyohiko Sakakibara, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 345 days.

(21) Appl. No.: 16/876,395

(22) Filed: May 18, 2020

(65) Prior Publication Data

US 2020/0279866 A1 Sep. 3, 2020

Related U.S. Application Data

(62) Division of application No. 16/136,652, filed on Sep. 20, 2018, now Pat. No. 10,720,444.
(Continued)

(51) Int. Cl.
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ......... H01L 27/11582; H01L 21/02532; H01L 27/11524; H01L 27/11529;
(Continued)

(56) References Cited

U.S. PATENT DOCUMENTS 6,713,332 B2 3/2004 Chung
7,026,682 B2 4/2006 Chung
(Continued)

OTHER PUBLICATIONS

Lue, H.T. et al., "A 128Gb (MLC)/192Gb (TLC) Single-Gate Vertical Channel (SGVC) Architecture 3D NAND Using Only 16 Layers with Robust Read Disturb, Long-Retention and Excellent Scaling Capability," IEDM Proceedings, pp. IEDM 17-461-17-464, (2017).
(Continued)

*Primary Examiner* — Shahed Ahmed
*Assistant Examiner* — Sun Mi Kim King
(74) *Attorney, Agent, or Firm* — The Marbury Law Group PLLC

(57) ABSTRACT

A three-dimensional memory device includes alternating stacks of insulating strips and electrically conductive strips located over a substrate and laterally spaced apart among one another by line trenches which laterally extend along a first horizontal direction and are spaced apart along a second horizontal direction, and memory stack structures arranged in rows extending along the first horizontal direction. Each row of memory stack structures is located on a respective sidewall of the line trenches. Each of the memory stack structures includes a vertical semiconductor channel, a tunneling dielectric contacting the vertical semiconductor channel, a charge storage layer contacting the tunneling dielectric, and a composite blocking dielectric. The composite blocking dielectric includes a first dipole-containing blocking dielectric layer stack, a homogeneous blocking dielectric layer, and a second dipole-containing blocking dielectric layer stack.

7 Claims, 44 Drawing Sheets

Related U.S. Application Data

(60) Provisional application No. 62/719,865, filed on Aug. 20, 2018.

(58) Field of Classification Search
CPC ......... H01L 27/11556; H01L 27/11565; H01L 27/1157; H01L 27/11578; H01L 29/40117
See application file for complete search history.

(56) References Cited

U.S. PATENT DOCUMENTS

| | | |
|---|---|---|
| 7,053,448 B2 | 5/2006 | Jeon et al. |
| 7,541,241 B2 | 6/2009 | Sim et al. |
| 7,541,638 B2 | 6/2009 | Shone |
| 7,560,764 B2 | 7/2009 | Park et al. |
| 7,737,488 B2 | 6/2010 | Lai et al. |
| 8,076,200 B2 | 12/2011 | Forbes et al. |
| 8,349,681 B2 | 1/2013 | Alsmeier et al. |
| 8,384,155 B2 | 2/2013 | Lin et al. |
| 8,614,124 B2 | 12/2013 | Jenne et al. |
| 8,698,313 B2 | 4/2014 | Hirano et al. |
| 9,449,980 B2 | 9/2016 | Rabkin |
| 9,449,985 B1 | 9/2016 | Rabkin et al. |
| 9,620,514 B2 | 4/2017 | Kai et al. |
| 9,627,399 B2 | 4/2017 | Kanakamedala et al. |
| 9,666,594 B2 | 5/2017 | Mizuno et al. |
| 9,728,546 B2 | 8/2017 | Serov et al. |
| 9,837,431 B2 | 12/2017 | Nishikawa et al. |
| 9,972,637 B2 | 5/2018 | Xiao |
| 9,991,277 B1 | 6/2018 | Tsutsumi et al. |
| 2003/0211690 A1 | 11/2003 | Chung |
| 2004/0185619 A1 | 9/2004 | Chung |
| 2005/0205920 A1 | 9/2005 | Jeon et al. |
| 2005/0285184 A1 | 12/2005 | Jung |
| 2006/0022252 A1 | 2/2006 | Doh et al. |
| 2006/0192244 A1 | 8/2006 | Shone |
| 2006/0255399 A1 | 11/2006 | Kim et al. |
| 2006/0284245 A1 | 12/2006 | Park et al. |
| 2007/0075358 A1 | 4/2007 | Chen et al. |
| 2007/0131982 A1 | 6/2007 | Sim et al. |
| 2008/0019165 A1 | 1/2008 | Lin et al. |
| 2008/0099829 A1 | 5/2008 | Forbes et al. |
| 2008/0121984 A1 | 5/2008 | Chen et al. |
| 2008/0290400 A1 | 11/2008 | Jenne et al. |
| 2009/0039414 A1 | 2/2009 | Lue et al. |
| 2009/0039416 A1 | 2/2009 | Lai et al. |
| 2009/0127611 A1 | 5/2009 | Park et al. |
| 2009/0166717 A1 | 7/2009 | Jung |
| 2009/0170251 A1 | 7/2009 | Jin et al. |
| 2009/0032181 A1 | 12/2009 | Ryu et al. |
| 2009/0321816 A1 | 12/2009 | Son et al. |
| 2010/0001282 A1 | 1/2010 | Mieno |
| 2010/0013000 A1 | 1/2010 | Nakabayashi et al. |
| 2010/0015773 A1 | 1/2010 | Park et al. |
| 2010/0193859 A1 | 8/2010 | Lai et al. |
| 2010/0200835 A1 | 8/2010 | Jin et al. |
| 2010/0276743 A1 | 11/2010 | Kuniya et al. |
| 2011/0001183 A1 | 1/2011 | Yoo et al. |
| 2011/0073866 A1 | 3/2011 | Kim et al. |
| 2011/0101438 A1 | 5/2011 | Yoo et al. |
| 2012/0080740 A1 | 4/2012 | Forbes et al. |
| 2012/0099361 A1 | 4/2012 | Lin et al. |
| 2012/0305883 A1 | 12/2012 | Lv et al. |
| 2013/0175604 A1 | 7/2013 | Polishchuk et al. |
| 2013/0207173 A1 | 8/2013 | Cui et al. |
| 2013/0210209 A1 | 8/2013 | Ramkumar |
| 2013/0228847 A1 | 9/2013 | Mieno |
| 2013/0248983 A1 | 9/2013 | Jang et al. |
| 2013/0270624 A1 | 10/2013 | Yun et al. |
| 2014/0151778 A1 | 6/2014 | Purayath et al. |
| 2014/0159137 A1 | 6/2014 | Yun et al. |
| 2014/0235046 A1 | 8/2014 | Ramkumar |
| 2014/0239374 A1 | 8/2014 | Ramkumar et al. |
| 2014/0286098 A1 | 9/2014 | Yasuda |
| 2014/0312404 A1 | 10/2014 | Chou et al. |
| 2015/0035043 A1 | 2/2015 | Forbes et al. |
| 2015/0123190 A1 | 5/2015 | Chou et al. |
| 2015/0214237 A1 | 7/2015 | Hsieh et al. |
| 2015/0371998 A1 | 12/2015 | Lue |
| 2016/0000561 A1 | 1/2016 | Ramkumar et al. |
| 2016/0071861 A1 | 3/2016 | Serov et al. |
| 2016/0071876 A1* | 3/2016 | Mizuno ............ H01L 27/11565 438/269 |
| 2016/0086972 A1 | 3/2016 | Zhang et al. |
| 2016/0099253 A1 | 4/2016 | Ramkumar |
| 2016/0111434 A1 | 4/2016 | Pachamuthu et al. |
| 2016/0172366 A1 | 6/2016 | Koka et al. |
| 2016/0211272 A1 | 7/2016 | Koka et al. |
| 2016/0225780 A1 | 8/2016 | Hsieh et al. |
| 2016/0240476 A1 | 8/2016 | Takahashi et al. |
| 2016/0284726 A1 | 9/2016 | Sakakibara |
| 2016/0300848 A1 | 10/2016 | Pachamuthu et al. |
| 2017/0053934 A1 | 2/2017 | Lue |
| 2017/0084465 A1 | 3/2017 | Ramkumar et al. |
| 2017/0092781 A1 | 3/2017 | Polishchuk et al. |
| 2017/0104079 A1 | 3/2017 | Xiao et al. |
| 2017/0229472 A1 | 8/2017 | Lu et al. |
| 2017/0256557 A1 | 9/2017 | Xiao |
| 2017/0345705 A1 | 11/2017 | Pang et al. |
| 2017/0373086 A1 | 12/2017 | Pang et al. |
| 2018/0040623 A1 | 2/2018 | Kanakamedala et al. |
| 2018/0053777 A1 | 2/2018 | Xiao |
| 2018/0151588 A1 | 5/2018 | Tsutsumi et al. |
| 2018/0158919 A1 | 6/2018 | Polishchuk et al. |

OTHER PUBLICATIONS

Robertson, J., "Band Offsets of High Dielectric Constant Gate Oxides on Silicon," Abstract from Journal of Non-Crystalline Solids, vol. 303, Issue 1, pp. 94-100, (2002).

Robertson, J., "High Dielectric Constant Oxides," Eur. Phys. J. Appl. Phys., vol. 28, pp. 265-291, (2004).

Wong, H. et al., "On the Scaling Issues and High-k Replacement of Ultrathin Gate Dielectrics for NanoScale MOS Transistors," Microelectronic Engineering, vol. 83, pp. 1867-1904, (2006).

Notification of Transmittal of the International Search Report and Written Opinion of the International Search Authority for International Patent Application No. PCT/US2019/032984, dated Sep. 5, 2019, 12 pages.

U.S. Appl. No. 15/971,525, filed May 4, 2018, SanDisk Technologies LLC.

U.S. Appl. No. 16/002,294, filed Jun. 5, 2018, SanDisk Technologies LLC.

U.S. Appl. No. 16/020,505, filed Jun. 27, 2018, SanDisk Technologies LLC.

U.S. Appl. No. 16/021,899, filed Jun. 28, 2018, SanDisk Technologies LLC.

* cited by examiner

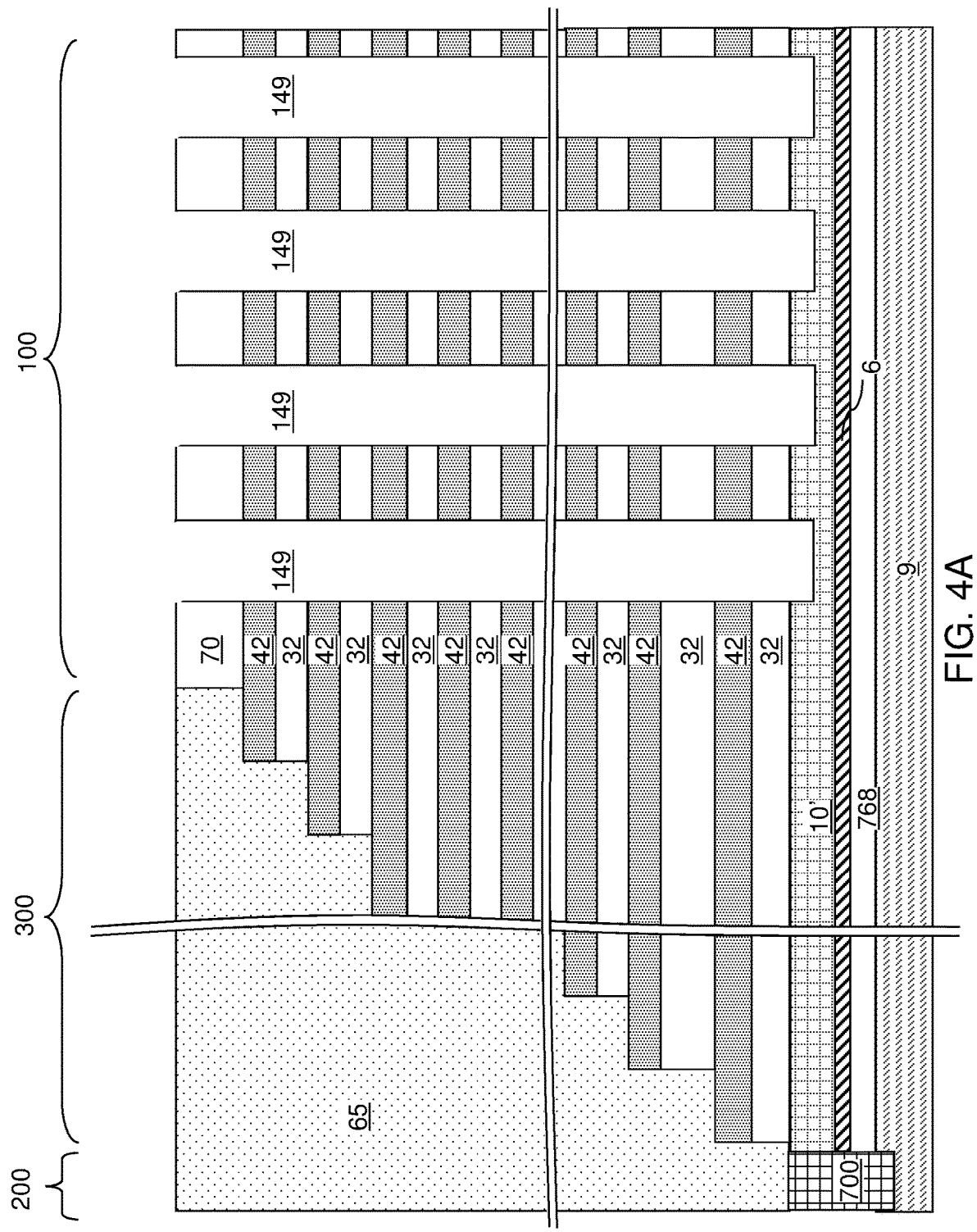

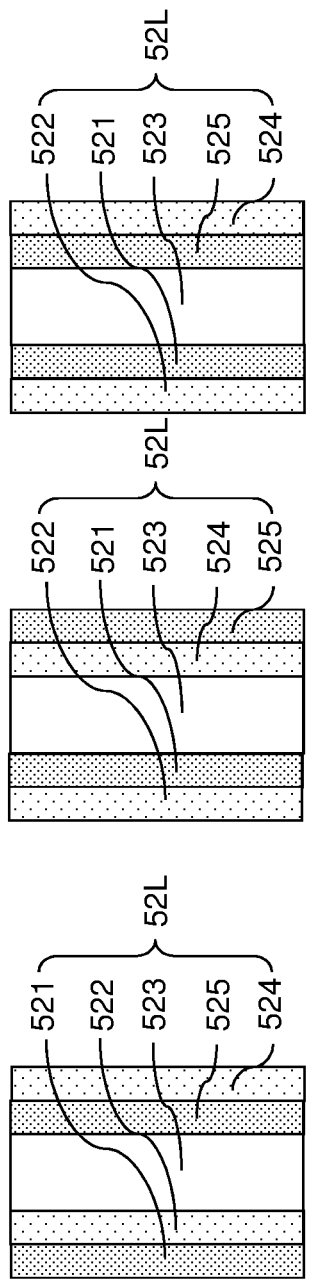

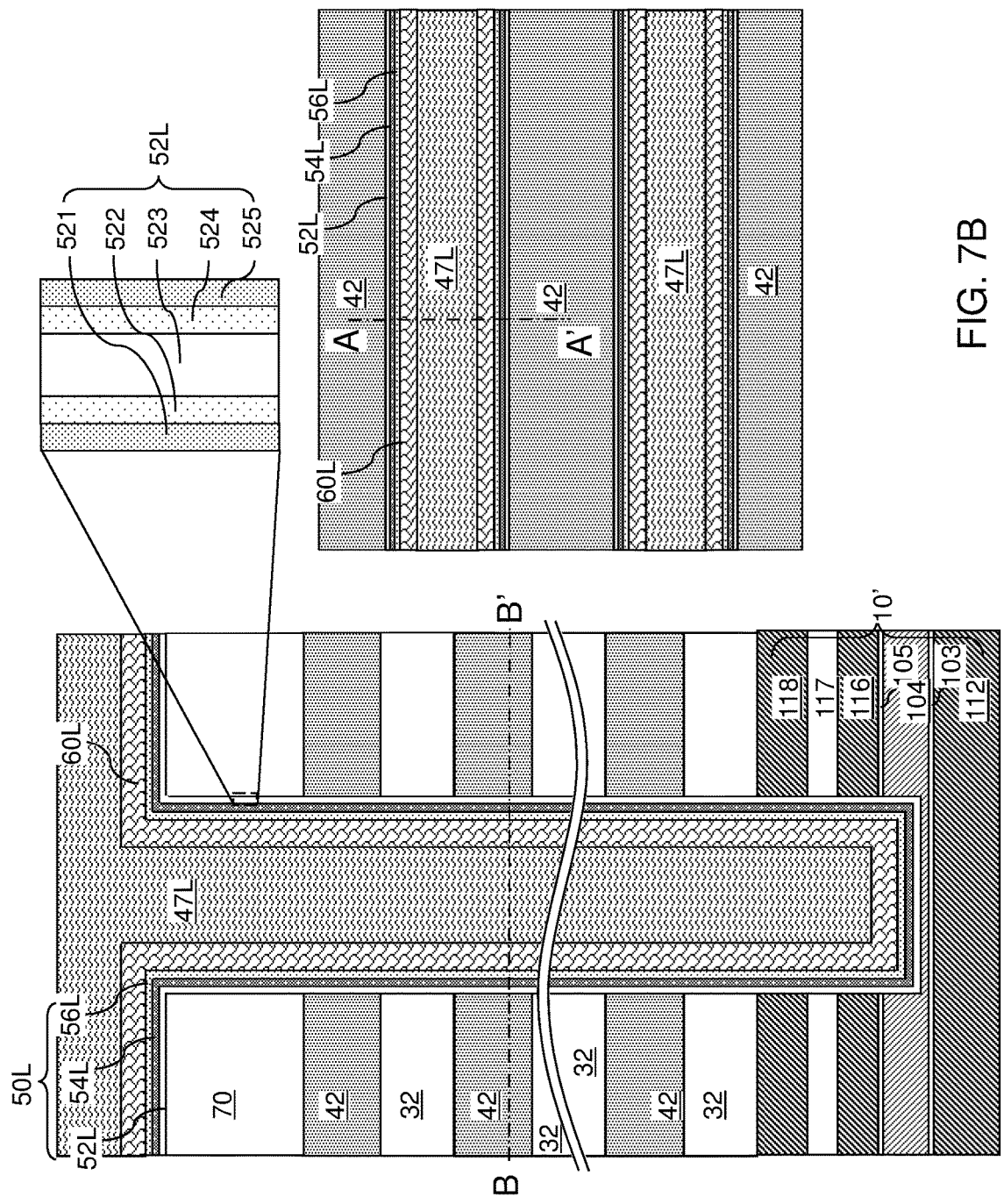

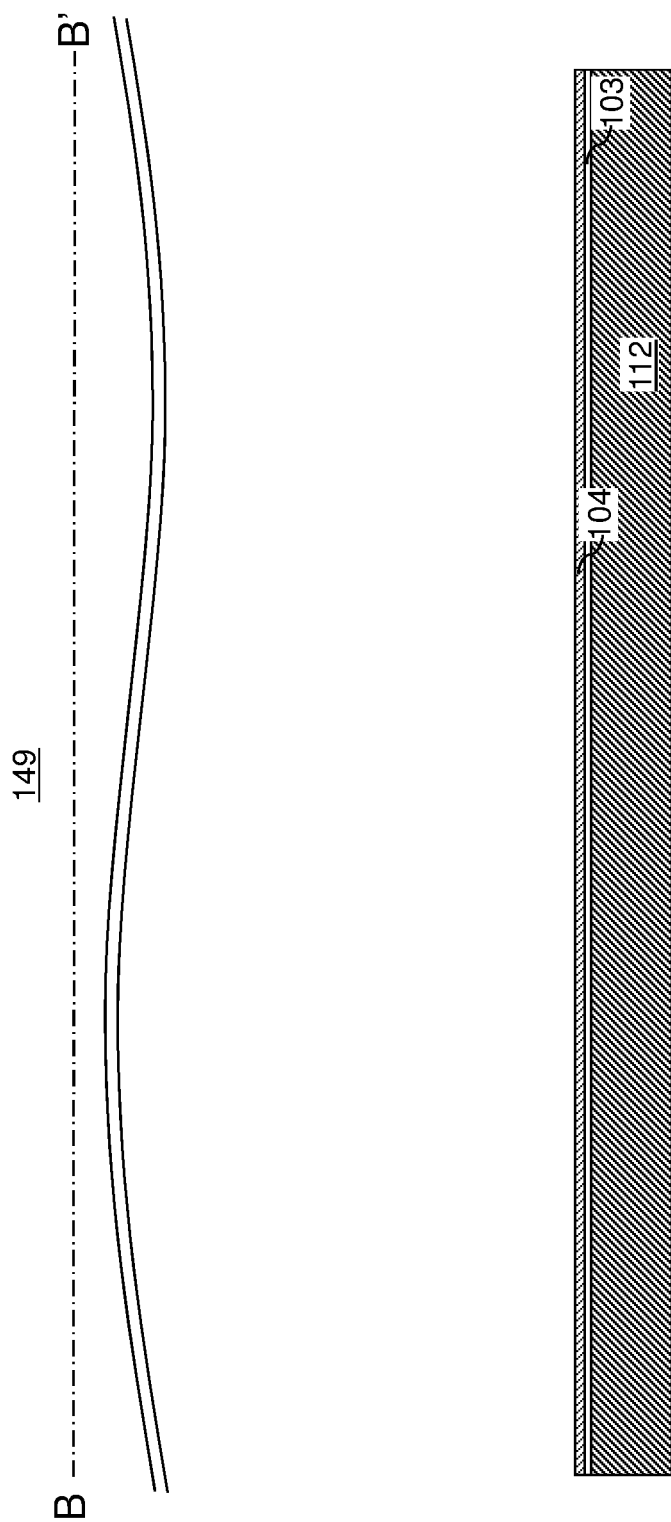

THREE-DIMENSIONAL FLAT MEMORY DEVICE INCLUDING A DUAL DIPOLE BLOCKING DIELECTRIC LAYER AND METHODS OF MAKING THE SAME

FIELD

The present disclosure relates generally to the field of semiconductor devices, and particular to a three-dimensional flat memory device including a dual dipole blocking dielectric layer and methods of manufacturing the same.

BACKGROUND

A configuration of a three-dimensional NAND memory device employs flat memory cells in which tunneling dielectrics have flat vertical surfaces. Such flat memory devices are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 461.

SUMMARY

According to an aspect of the present disclosure, a three-dimensional memory device is provided, which comprises: alternating stacks of insulating strips and electrically conductive strips located over a substrate and laterally spaced apart among one another by line trenches laterally extending along a first horizontal direction and are spaced apart along a second horizontal direction; and memory stack structures arranged in rows extending along the first horizontal direction, wherein: each row of memory stack structures is located on a respective sidewall of the line trenches; each of the memory stack structures comprises: a vertical semiconductor channel, a tunneling dielectric contacting the vertical semiconductor channel, a charge storage layer contacting the tunneling dielectric, and a composite blocking dielectric contacting the charge storage layer and insulating strips within one of the alternating stacks, wherein the composite blocking dielectric comprises, from one side to another, a first dipole-containing blocking dielectric layer stack, a homogeneous blocking dielectric layer, and a second dipole-containing blocking dielectric layer stack.

According to another aspect of the present disclosure, a method of forming a three-dimensional memory device is provided, which comprises: forming a vertically alternating sequence of insulating layers and sacrificial material layers over a substrate; forming line trenches laterally extending along a first horizontal direction through the vertically alternating sequence, wherein alternating stacks of insulating strips and sacrificial material strips are formed by remaining portions of the vertically alternating sequence; forming memory stack structures arranged in rows extending along the first horizontal direction in the line trenches, wherein each row of memory stack structures is formed on a respective sidewall of the line trenches, and each of the memory stack structures comprises: a vertical semiconductor channel, a tunneling dielectric contacting the vertical semiconductor channel, a charge storage layer contacting the tunneling dielectric, and a composite blocking dielectric contacting the tunneling dielectric and contacting sacrificial material strips within one of the alternating stacks and comprising, from one side to another, a first dipole-containing blocking dielectric layer stack, a homogeneous blocking dielectric layer, and a second dipole-containing blocking dielectric layer stack; and replacing the sacrificial material strips with electrically conductive strips.

BRIEF DESCRIPTION OF THE DRAWINGS

FIG. 4A is a schematic vertical cross-sectional view of the exemplary structure after formation of line trenches according to an embodiment of the present disclosure.

FIGS. 6C-6E are alternative configurations for the continuous blocking dielectric layer of FIGS. 6A and 6B.

FIG. 7A is a vertical cross-sectional view of a line trench after formation of a sacrificial fill material layer according to an embodiment of the present disclosure.

FIG. 7B is a horizontal cross-sectional view along the plane B-B' of FIG. 7A. The vertical plane A-A' corresponds to the plane of the vertical cross-sectional view of FIG. 7A.

FIG. 11C is a vertical cross-sectional view along the vertical plane C-C' of FIG. 11B.

DETAILED DESCRIPTION

Figure 1A:
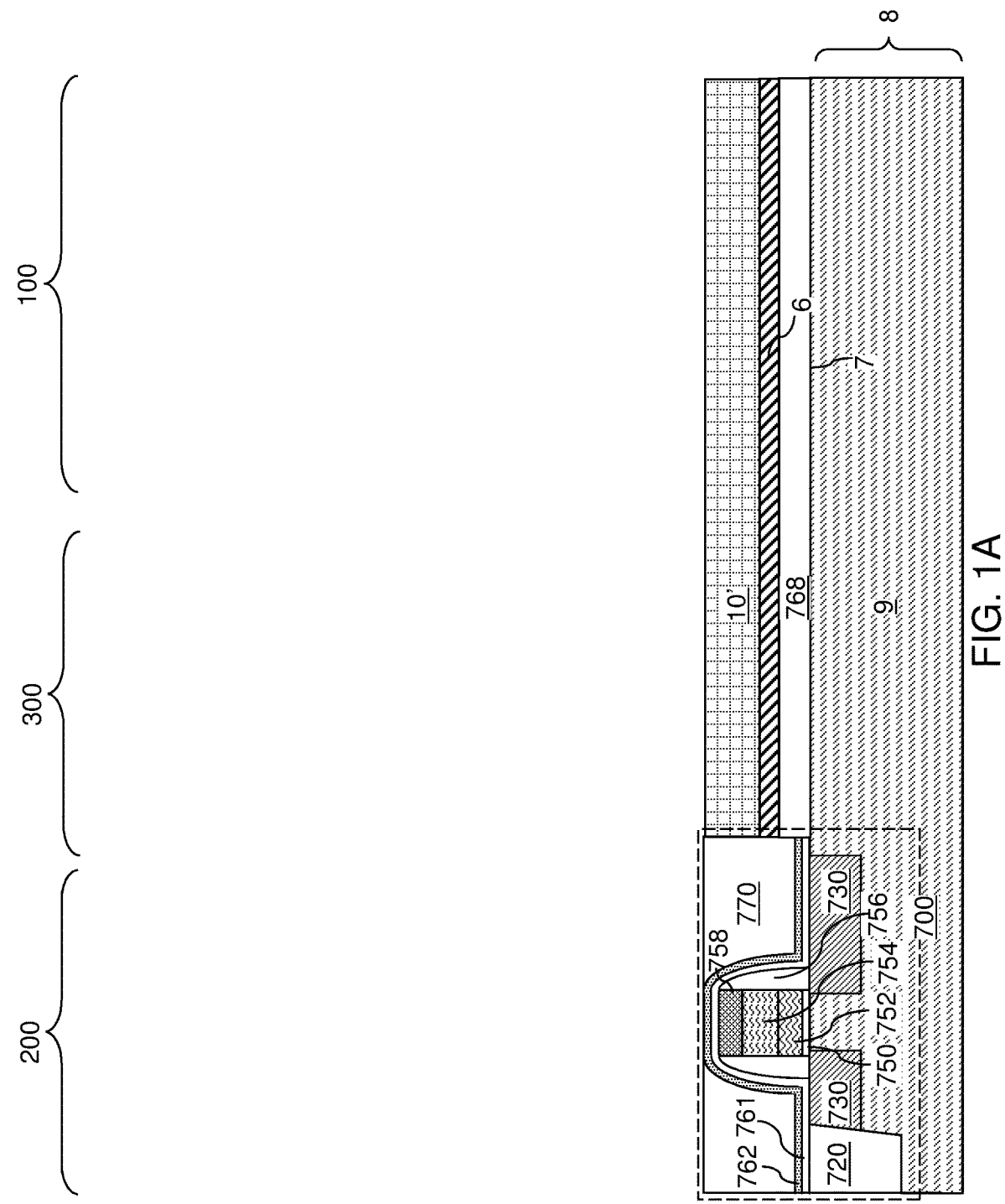
FIG. 1A is a vertical cross-sectional view of an exemplary structure after formation of at least one peripheral device and a semiconductor material layer according to a first embodiment of the present disclosure.

The embodiments of the present disclosure are directed to a three-dimensional flat memory device including a dual dipole blocking dielectric layer and methods of manufacturing the same, the various aspects of which are described below. The embodiments of the disclosure can be employed to form a three-dimensional monolithic memory array device comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
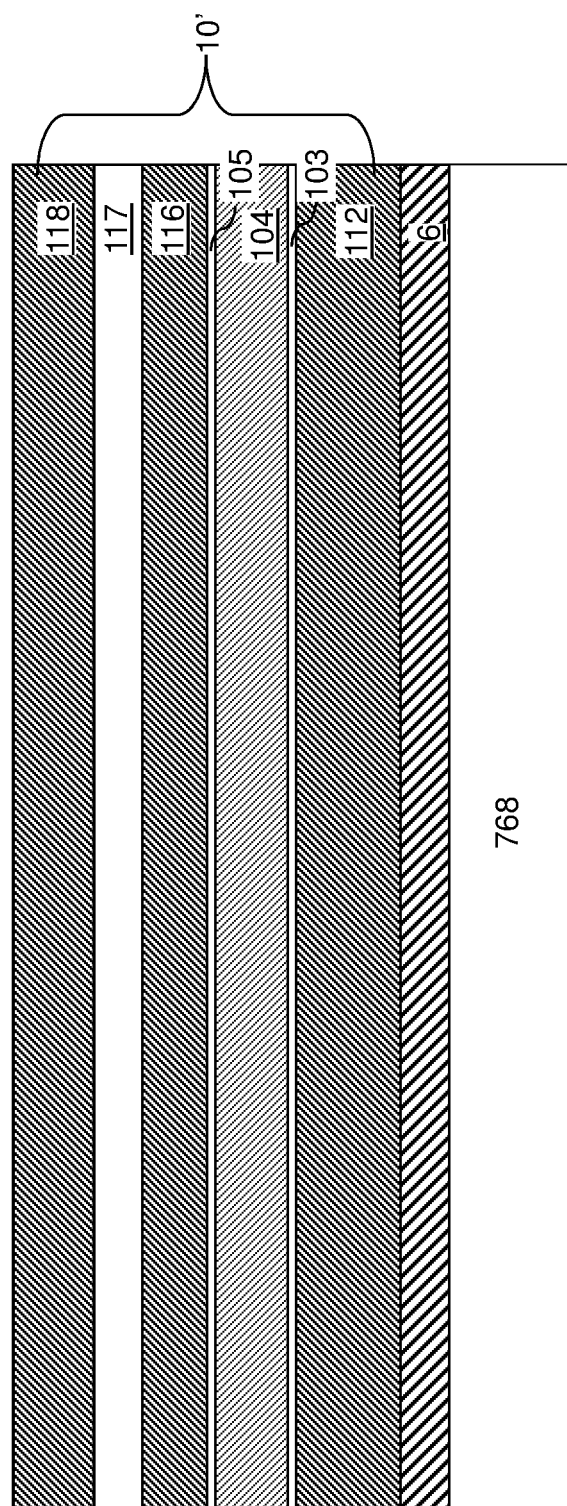
FIG. 1B is a magnified view of an in-process source level material layers of FIG. 1A.

Referring to FIGS. 1A and 1B, an exemplary structure according to an embodiment of the present disclosure is illustrated, which can be employed, for example, to fabricate a device structure containing vertical NAND memory devices. The first exemplary structure includes a substrate 8, such as a silicon wafer or a silicon-on-insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the substrate semiconductor layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. As used herein, an "in-process" element refers to an element that is modified during a subsequent processing step. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-select-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. Thus, regions in which the in-process source-level material layers 10' are present include a memory array region 100 in which memory devices are to be subsequently formed and a contact region 300 in which stepped surfaces and contact via structures contacting various electrically conductive layers are to be subsequently formed.

Figure 2:
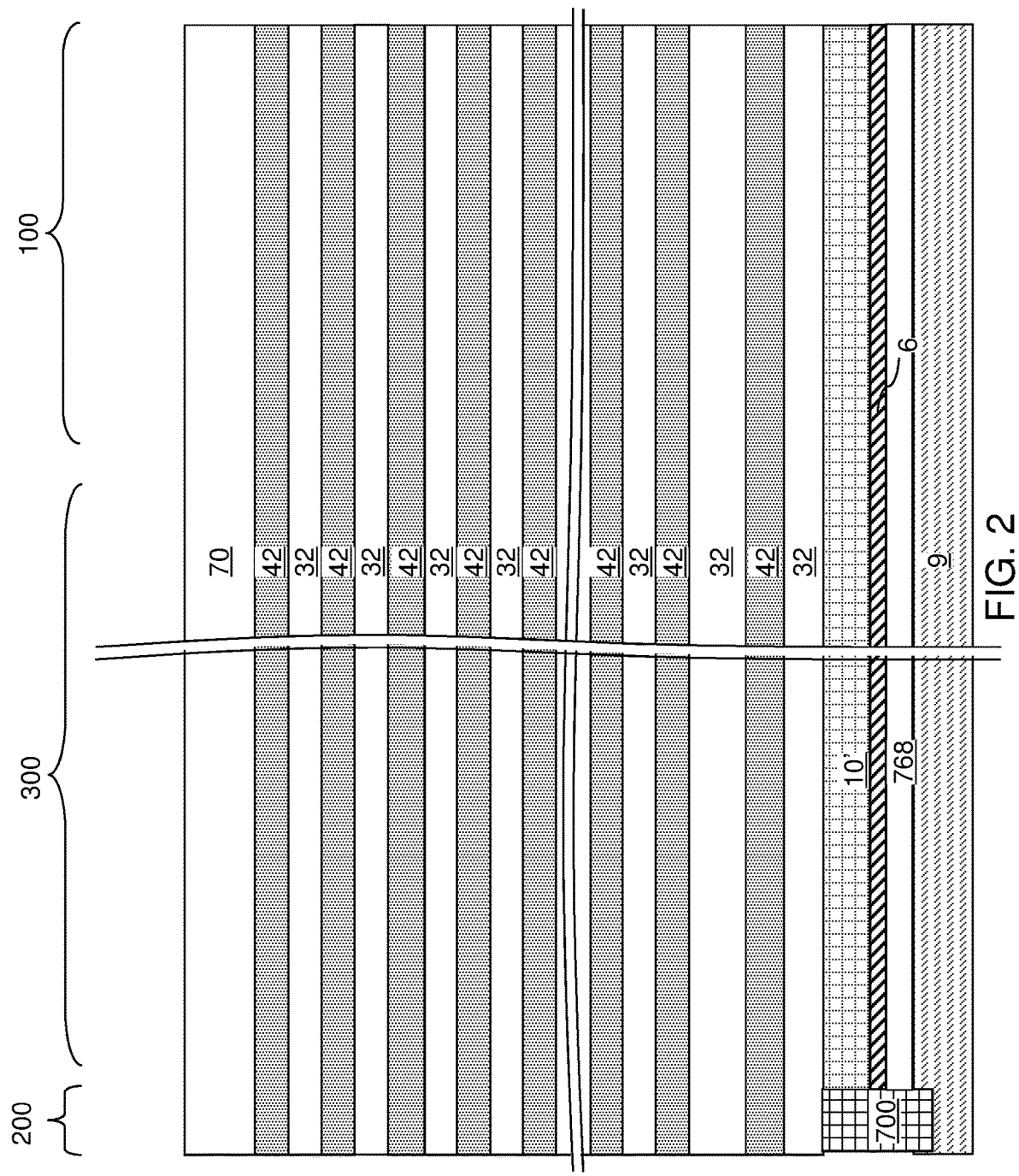
FIG. 2 is a vertical cross-sectional view of the exemplary structure after formation of a vertically alternating sequence of insulating layers and sacrificial material layers according to an embodiment of the present disclosure.

Referring to FIG. 2, a vertically alternating sequence of first material layers (such as insulating layers 32) and second material layers (such as spacer material layers) is formed over the in-process source level material layers 10'. As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32) and second material layers (which can be sacrificial material layer 42). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

In one embodiment, the vertically alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the vertically alternating sequence (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive strips, embodiments are expressly contemplated herein in which the sacrificial material layers are formed as electrically conductive strips. In this case, steps for replacing the spacer material layers with electrically conductive strips can be omitted.

Optionally, an insulating cap layer 70 can be formed over the vertically alternating sequence (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
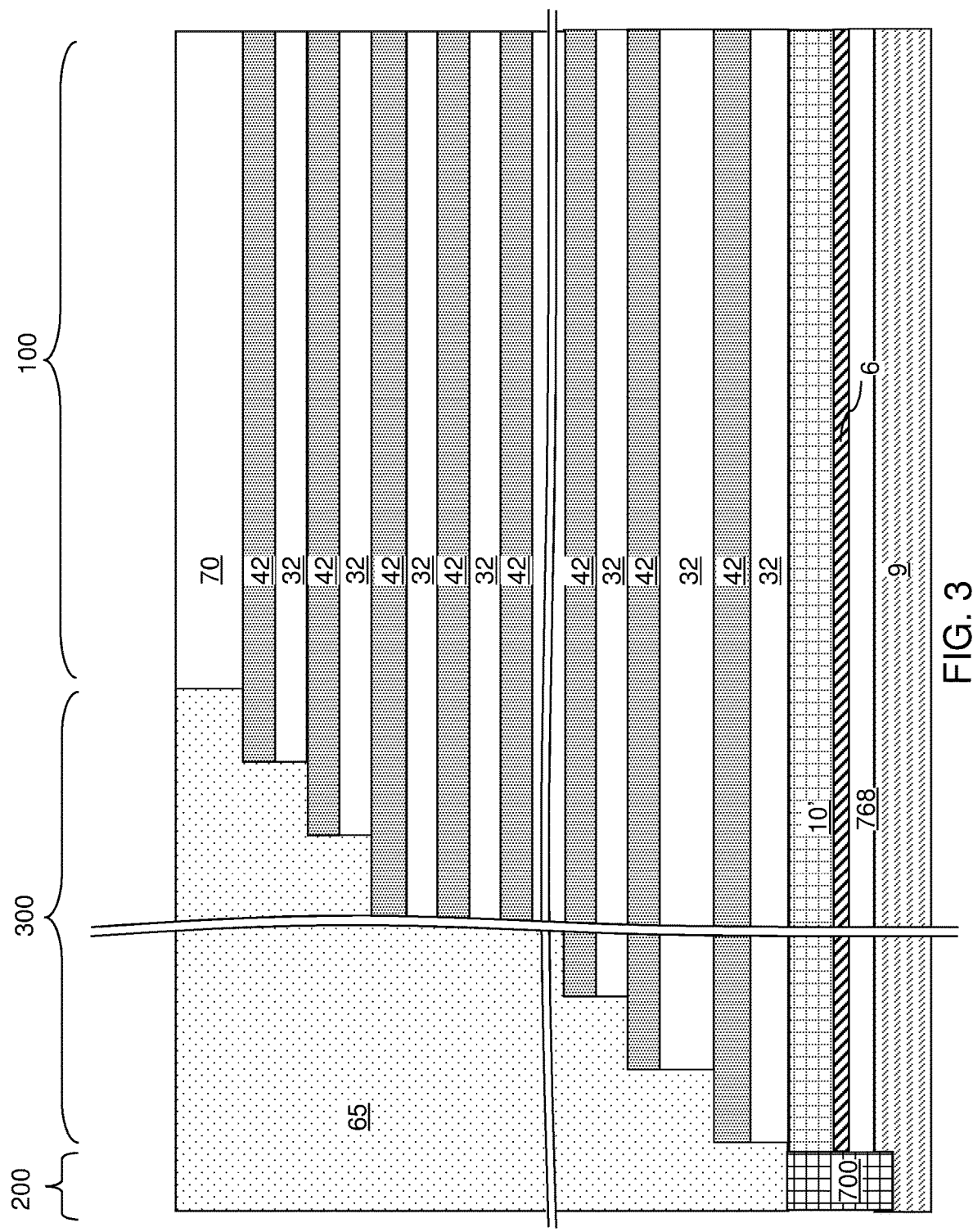
FIG. 3 is a vertical cross-sectional view of the exemplary structure after formation of stepped terraces and a retro-stepped dielectric material portion according to an embodiment of the present disclosure.
Figure 4B:
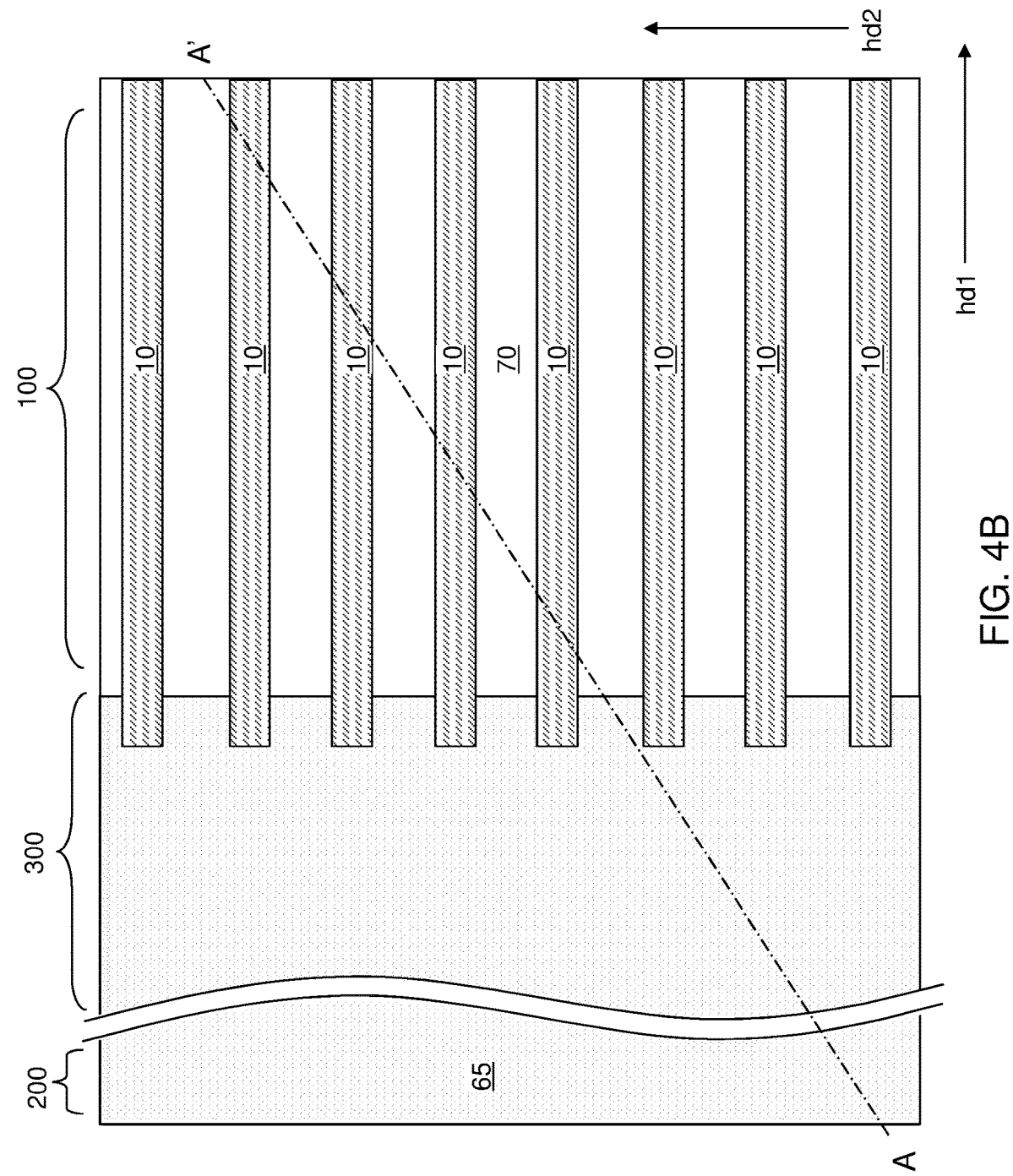
FIG. 4B is a top-down view of the exemplary structure of FIG. 4A. The vertical plane A-A' is the plane of the cross-section for FIG. 4A.
Figure 5B:
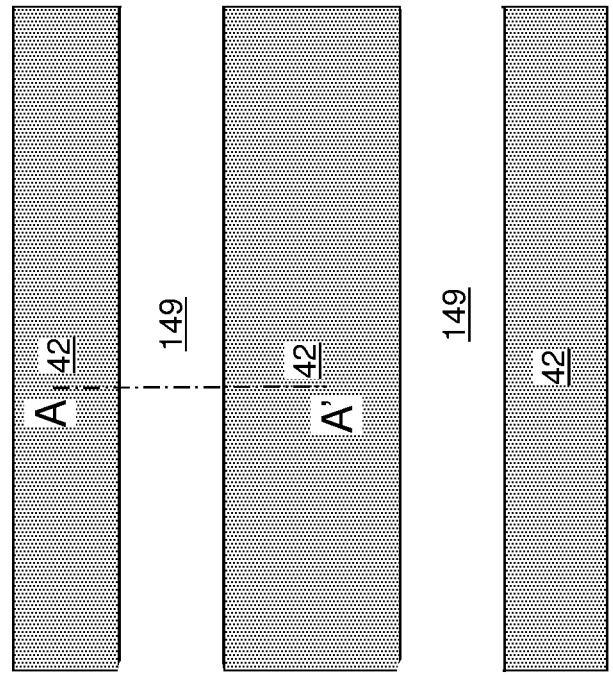
FIG. 5B is a horizontal cross-sectional view along the plane B-B' of the structure of FIG. 5A. The vertical plane A-A' corresponds to the plane of the vertical cross-sectional view of FIG. 5A.
Figure 5A:
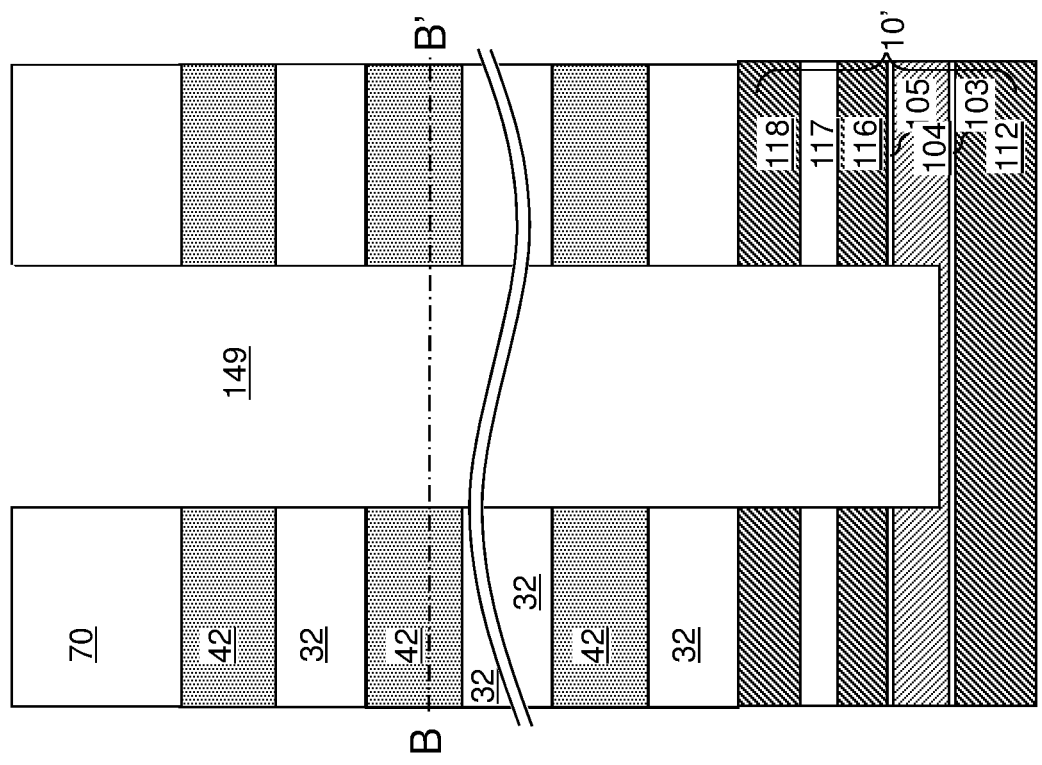
FIG. 5A is a vertical cross-sectional view of a line trench in the exemplary structure of FIGS. 4A and 4B.

Referring to FIG. 3, the vertically alternating sequence of the insulating layers 32 and the spacer material layers (i.e., the sacrificial material layers 42) can be patterned to form stepped surfaces that continuously extend from a bottommost layer of the vertically alternating sequence (32, 42) to a topmost layer of the alternating sequence (32, 42) in the contact region 300. A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32, 42). Each sacrificial material layer 42 other than a topmost sacrificial material layer 42 within the vertically alternating sequence (32, 42) laterally extends farther than any overlying sacrificial material layer 42 within the vertically alternating sequence (32, 42). The terrace region includes stepped surfaces of the vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A, 4B, 5A, and 5B, a lithographic material stack (not shown) including at least a photoresist layer can be formed over the insulating cap layer 70 and the retro-stepped dielectric material portion 65, and can be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack can be transferred through the insulating cap layer 70 or the retro-stepped dielectric material portion 65, and through the vertically alternating sequence (32, 42) by at least one anisotropic etch that employs the patterned lithographic material stack as an etch mask. Portions of the vertically alternating sequence (32, 42) underlying the line-shaped openings in the patterned lithographic material stack are etched to form line trenches 149. As used herein, a "line trench" refers to a trench that has laterally extends straight along a horizontal direction.

The line trenches 149 laterally extend along the first horizontal direction hd1 through the vertically alternating sequence (32, 42). In one embodiment, the line trenches 149 have a respective uniform width that is invariant under translation along the first horizontal direction hd1. In one embodiment, the line trenches 149 can have the same width throughout, and the spacing between neighboring pairs of the line trenches 149 can be the same. In this case, the line trenches 149 can constitute a one-dimensional periodic array of line trenches 149 having a pitch along a second horizontal direction hd2 that is perpendicular to the first horizontal direction hd1. The width of the line trenches 149 along the second horizontal direction hd2 can be in a range from 30 nm to 500 nm, such as from 60 nm to 250 nm, although lesser and greater widths can also be employed.

The line trenches 149 extend through each layer of the vertically alternating sequence (32, 42) and the retro-stepped dielectric material portion 65. The chemistry of the anisotropic etch process employed to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the line trenches 149 can be substantially vertical, or can be tapered. The patterned lithographic material stack can be subsequently removed, for example, by ashing.

The line trenches 149 laterally extend through the entire memory array region 100, and laterally extend into the contact region 300. The line trenches 149 may laterally extend through the entire contact region 300 along the first horizontal direction hd1, or may laterally extend only through part of a width, but not the entire width along the first horizontal direction hd1, of the contact region 300. The line trenches 149 extend into the in-process source level material layers 10'. For example, a surface of the source-level sacrificial layer 104 can be physically exposed at the bottom of each line trench 149. Each of the line trenches 149 may include a sidewall (or a plurality of sidewalls) that extends substantially perpendicular to a respective surface of the source-level sacrificial layer 104.

In one embodiment, strips of each insulating layer 32 and the sacrificial material layers 42 may be interconnected among one another by a connecting portion provided within the contact region 300, and each of the insulating layers 32 may form a continuous structure that extends across the memory array region 100 and the contact region 300. In this case, the vertically alternating sequence (32, 42) includes a plurality of alternating stacks of insulating strips 32 and sacrificial material strips 42 that are laterally spaced apart along the second horizontal direction hd2 and interconnected among one another by connecting portions within the contact region 300. Alternatively, the line trenches 149 may divide at least one, or all, of the insulating layers 32 and the sacrificial material layers 42 into discrete material strips. In this case, the vertically alternating sequence (32, 42) includes a plurality of alternating stacks of insulating strips 32 and sacrificial material strips 42 that are laterally spaced apart along the second horizontal direction hd2 and that are partially, or completely, disjoined from one another and laterally spaced apart by the line trenches 149. Discrete portions of the insulating layers 32 between a neighboring pair of line trenches 149 are herein referred to as insulating strips 32. Discrete portions of the sacrificial material layers 42 between a neighboring pair of line trenches 149 are herein referred to as sacrificial material strips 42. It is understood that the same reference numeral 32 is employed for an entire insulating layer 32 that may be a single continuous structure including multiple insulating strips or a collection of discrete insulating strips, and for individual insulating strips 32 that may, or may not, be adjoined with other insulating strips located at the same level. Likewise, the same reference numeral 42 is employed for an entire sacrificial material layer 42 that may be a single continuous structure including multiple sacrificial material strips or a collection of discrete sacrificial material strips, and for individual sacrificial material strips 42 that may, or may not, be adjoined with other sacrificial material strips located at the same level.

Figures 6A, 6B:
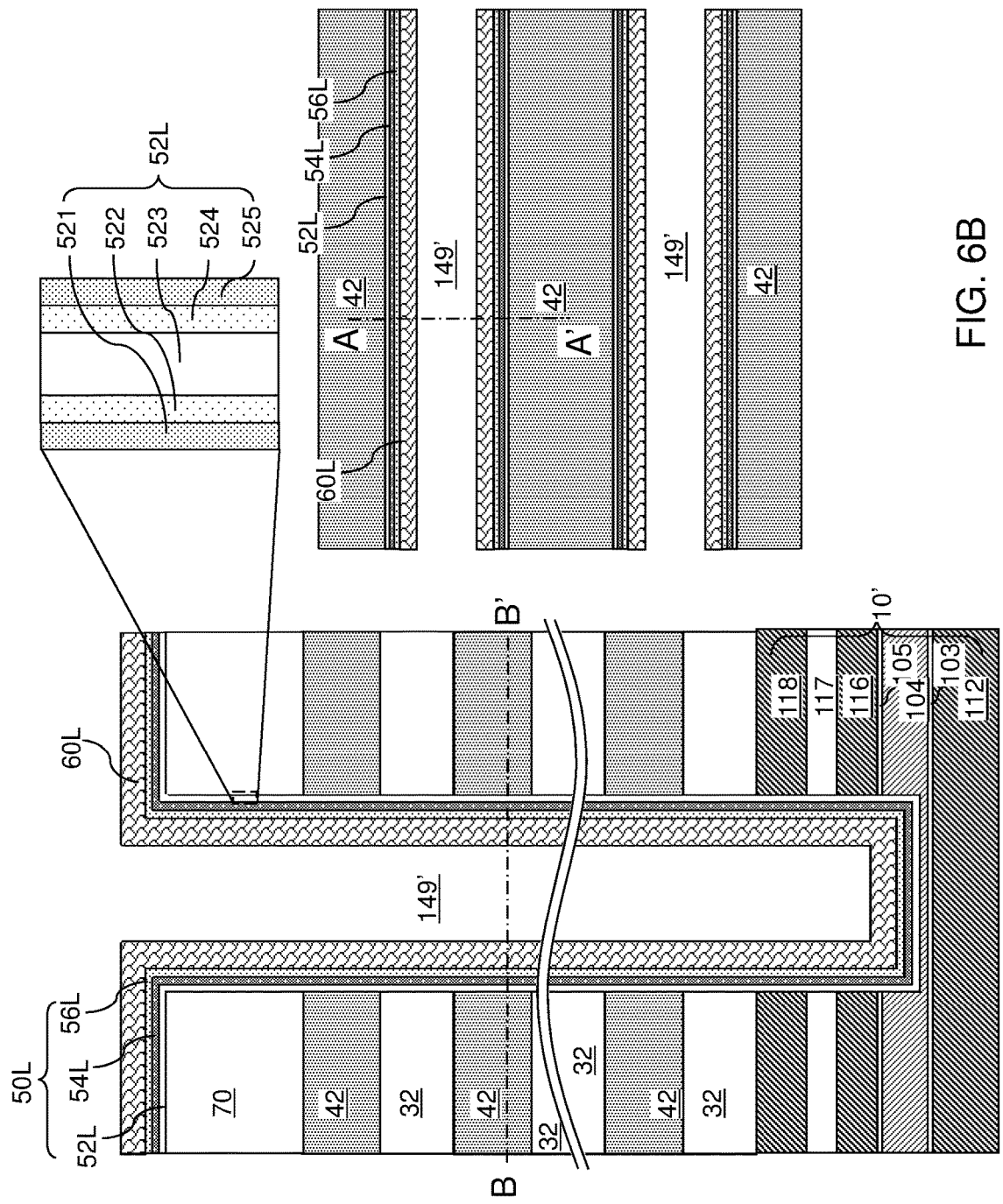
FIG. 6A is a vertical cross-sectional view of a line trench after formation of a continuous blocking dielectric layer, a continuous charge storage layer, and a continuous tunneling dielectric layer, and a continuous semiconductor channel layer according to an embodiment of the present disclosure.
FIG. 6B is a horizontal cross-sectional view along the plane B-B' of the structure of FIG. 6A. The vertical plane A-A' corresponds to the plane of the vertical cross-sectional view of FIG. 6A.

Referring to FIGS. 6A and 6B, a continuous blocking dielectric layer 52L, a continuous charge storage layer 54L, and a continuous tunneling dielectric layer 56L are sequentially formed in the line trenches 149 and over the insulating cap layer 70.

The continuous blocking dielectric layer 52L can include a continuous composite blocking dielectric material layer including, from one side to another, a first dipole-containing blocking dielectric layer stack (521, 522), a homogeneous blocking dielectric layer 523, and a second dipole-containing blocking dielectric layer stack (524, 525). The first dipole-containing blocking dielectric layer stack (521, 522) is formed directly on sidewalls and bottom surfaces of the line trenches 149. The first dipole-containing blocking dielectric layer stack (521, 522) includes a first dielectric metal oxide layer 521 and a second dielectric metal oxide layer 522. The homogeneous blocking dielectric layer 523 includes a dielectric material having a homogeneous composition throughout. The second dipole-containing blocking dielectric layer stack (524, 525) includes a third dielectric metal oxide layer 524 and a fourth dielectric metal oxide layer 525. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen.

The second dielectric metal oxide layer 522 includes a dielectric metal oxide that generates a dipole moment at the interface with the homogeneous blocking dielectric layer 523. The third dielectric metal oxide layer 524 includes a dielectric metal oxide that generates a dipole moment at the interface with the homogeneous blocking dielectric layer 523. The materials of the second dielectric metal oxide layer 522 and the third dielectric metal oxide layer 524 are selected such that the directions of the dipole moments at the two interfaces with the homogeneous blocking dielectric layer 523 point in opposite directions. For example, the materials of the second dielectric metal oxide layer 522 and the third dielectric metal oxide layer 524 can be selected such that positive charges are induced on the sides of the second dielectric metal oxide layer 522 and the third dielectric metal oxide layer 524 at the two interfaces with the homogeneous blocking dielectric layer 523, while negative charges are induced on the sides of the homogeneous blocking dielectric layer 523 at the interfaces. Alternatively, the materials of the second dielectric metal oxide layer 522 and the third dielectric metal oxide layer 524 can be selected such that negative charges are induced on the sides of the second dielectric metal oxide layer 522 and the third dielectric metal oxide layer 524 at the two interfaces with the homogeneous blocking dielectric layer 523, while positive charges are induced on the sides of the homogeneous blocking dielectric layer 523 at the interfaces. In one embodiment, the homogeneous blocking dielectric layer 523 comprises, and/or consists essentially of, silicon oxide.

The dipole moments generated at the first interface between the first dipole-containing blocking dielectric layer stack (521, 522) and the homogeneous blocking dielectric layer 523 and at the second interface between the second dipole-containing blocking dielectric layer stack (524, 525) and the homogeneous blocking dielectric layer 523 alters the band gap structures within continuous blocking dielectric layer 52L. The dipole moment at the second interface can provide a higher energy barrier for electrical charges trapped in a charge storage layer, and facilitates capture of electrons stored in the charge storage layer. Further, the dipole moment at the second interface can provide a quantum well effect to effectively trap the electrical charges stored in the charge storage layer, thereby improving charge retention characteristics. The dipole moment at the first interface can reduce electrical field strength during an erase operation, and thus, reduces back tunneling during the erase operation.

In one embodiment, the first dielectric metal oxide layer 521 has a higher permittivity and a lower energy barrier height than the second dielectric metal oxide layer 522, and the fourth dielectric metal oxide layer 525 has a higher permittivity and a lower energy barrier height than the third dielectric metal oxide layer 524. The higher permittivity and the lower energy barrier height of the first and fourth dielectric metal oxide layers (521, 525) relative to the second and third dielectric metal oxide layers (522, 523) can provide further enhancement to device performance during a programming operation and an erase operation through band structure modification.

In one embodiment, the second dielectric metal oxide layer 522 and the third dielectric metal oxide layer 524 can comprise a same dielectric metal oxide material. In one embodiment, the second dielectric metal oxide layer 522 and the third dielectric metal oxide layer 524 comprise, and/or consist essentially of, aluminum oxide. In one embodiment, at least one of the first dielectric metal oxide layer 521 and the fourth dielectric metal oxide layer 525 comprises zirconium oxide or hafnium oxide. In one embodiment, both of the first dielectric metal oxide layer 521 and the fourth dielectric metal oxide layer 525 comprises zirconium oxide or hafnium oxide. In one embodiment, at least one of the first dielectric metal oxide layer 521 and the fourth dielectric metal oxide layer 525 comprises, and/or consists essentially of, zirconium oxide. In one embodiment, both of the first dielectric metal oxide layer 521 and the fourth dielectric metal oxide layer 525 comprises, and/or consists essentially of, zirconium oxide. In one embodiment, both of the first dielectric metal oxide layer 521 and the fourth dielectric metal oxide layer 525 comprises hafnium oxide or hafnium oxide. In one embodiment, at least one of the first dielectric metal oxide layer 521 and the fourth dielectric metal oxide layer 525 comprises, and/or consists essentially of, hafnium oxide. In one embodiment, both of the first dielectric metal oxide layer 521 and the fourth dielectric metal oxide layer 525 comprises, and/or consists essentially of, hafnium oxide.

Each of the first, second, third, and fourth dielectric metal oxide layers (521, 522, 524, 525) can be deposited by a respective conformal deposition process. The homogeneous blocking dielectric layer 523 can be deposited by a conformal deposition process. The conformal deposition processes may include chemical vapor deposition or atomic layer deposition. The thickness of the first dielectric metal oxide layer 521 can be in a range from 1 nm to 6 nm, although lesser and greater thicknesses can also be employed. The thickness of the second dielectric metal oxide layer 522 can be in a range from 1 nm to 6 nm, although lesser and greater thicknesses can also be employed. The thickness of the homogeneous blocking dielectric layer 523 can be in a range from 1 nm to 6 nm, although lesser and greater thicknesses can also be employed. The thickness of the third dielectric metal oxide layer 524 can be in a range from 1 nm to 6 nm, although lesser and greater thicknesses can also be employed. The thickness of the fourth dielectric metal oxide layer 524 can be in a range from 1 nm to 6 nm, although lesser and greater thicknesses can also be employed. The thickness of the continuous blocking dielectric layer 52L can be in a range from 5 nm to 20 nm, although lesser and greater thicknesses can also be employed. In one embodiment, the composite blocking dielectric can be symmetric in composition and in thickness with respect to a symmetry plane passing through the homogeneous blocking dielectric layer 523. In this case, the first and fourth dielectric metal oxide layers (521, 525) can have the same composition and thickness, and the second and third dielectric metal oxide layers (522, 524) can have the same composition and thickness. The two dipole moments generated at the first and second interfaces can be equal in magnitude and opposite in directions.

FIGS. 6C, 6D, and 6E illustrate alternative embodiment configurations in which the order of the various component layers within the continuous blocking dielectric layer 52L is changed from the order of the various component layers in the configuration of FIG. 6B. In each configuration, a first dipole-containing blocking dielectric layer stack (521, 522) is deposited first, a homogeneous blocking dielectric layer 523 is deposited next, and a second dipole-containing blocking dielectric layer stack (524, 525) is deposited last.

In some configurations, the order of layers within the second dipole-containing blocking dielectric layer stack (524, 525) may be reversed as illustrated in FIGS. 6C and 6E. In such configurations, the fourth dielectric metal oxide layer 525 can be deposited directly on the homogeneous blocking dielectric layer 523, and the third dielectric metal oxide layer 524 can be deposited on the fourth dielectric metal oxide layer 525.

In some configurations, the order of layers within the first dipole-containing blocking dielectric layer stack (521, 522) may be reversed as illustrated in FIGS. 6D and 6E. In such configurations, the second dielectric metal oxide layer 522 can be deposited directly on the sidewalls and the bottom surfaces of the line trenches 149, and the first dielectric metal oxide layer 521 can be deposited on the second dielectric metal oxide layer 522.

Referring back to FIG. 6A, the continuous charge storage layer 54L can be formed. In one embodiment, the continuous charge storage layer 54L can be a dielectric charge trapping material, which can be, for example, silicon nitride. The continuous charge storage layer 54L can be formed, for example, by chemical vapor deposition (CVD), atomic layer deposition (ALD), physical vapor deposition (PVD), or any suitable deposition technique for storing electrical charges therein. The thickness of the continuous charge storage layer 54L can be in a range from 2 nm to 20 nm, although lesser and greater thicknesses can also be employed.

The continuous tunneling dielectric layer 56L includes a dielectric material through which charge tunneling can be performed under suitable electrical bias conditions. The charge tunneling may be performed by Fowler-Nordheim tunneling. The continuous tunneling dielectric layer 56L can include silicon oxide, silicon nitride, silicon oxynitride, dielectric metal oxides (such as aluminum oxide or zirconium oxide), dielectric metal oxynitride, dielectric metal silicates, alloys thereof, and/or combinations thereof. In one embodiment, the continuous tunneling dielectric layer 56L can include a stack of a first silicon oxide layer, a silicon oxynitride layer, and a second silicon oxide layer, which is commonly known as an ONO stack. In one embodiment, the continuous tunneling dielectric layer 56L can include a silicon oxide layer that is substantially free of carbon or a silicon oxynitride layer that is substantially free of carbon. The thickness of the continuous tunneling dielectric layer 56L can be in a range from 2 nm to 20 nm, although lesser and greater thicknesses can also be employed.

The stack of the continuous blocking dielectric layer 52L, the continuous charge storage layer 54L, and the continuous tunneling dielectric layer 56L constitutes a continuous memory film layer 50L that continuously extends over the line trenches 149 and the insulating cap layer 70. In an alternative embodiment, the locations of the blocking dielectric layer 52L and the continuous tunneling dielectric layer 56L can be switched to form an inverse device having a blocking dielectric adjacent to the channel and a tunneling dielectric layer adjacent to the word lines/control gate electrodes. An inverse flat cell memory device is described in U.S. patent application Ser. No. 15/971,525 filed on May 4, 2018, which is incorporated herein by reference in its entirety.

Subsequently, a continuous semiconductor channel material layer 60L can be deposited directly on the continuous memory film layer 50L. The continuous semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the continuous semiconductor channel material layer 60L includes amorphous silicon or polysilicon. The continuous semiconductor channel material layer 60L can be formed by a conformal deposition method such as low pressure chemical vapor deposition (LPCVD). The thickness of the continuous semiconductor channel material layer 60L can be in a range from 2 nm to 30 nm, although lesser and greater thicknesses can also be employed. In one embodiment, the continuous semiconductor channel material layer 60L can have a doping of the first conductivity type, which may be p-type or n-type. In one embodiment, the continuous semiconductor channel material layer 60L can comprise a semiconducting material including electrical dopants at an atomic concentration in a range from $1.0 \times 10^{14}/cm^3$ to $1.0 \times 10^{18}/cm^3$.

Referring to FIGS. 7A and 7B, a sacrificial fill material is deposited in unfilled volumes of the line trenches to form a sacrificial fill material layer 47L. In one embodiment, the sacrificial fill material can include a spin-on material that may be spin-coated. For example, the sacrificial fill material can include spin-on-carbon (SOC). A horizontal portion of the sacrificial fill material layer 47L can continuously extend over the insulating cap layer 70.

Figure 8A:
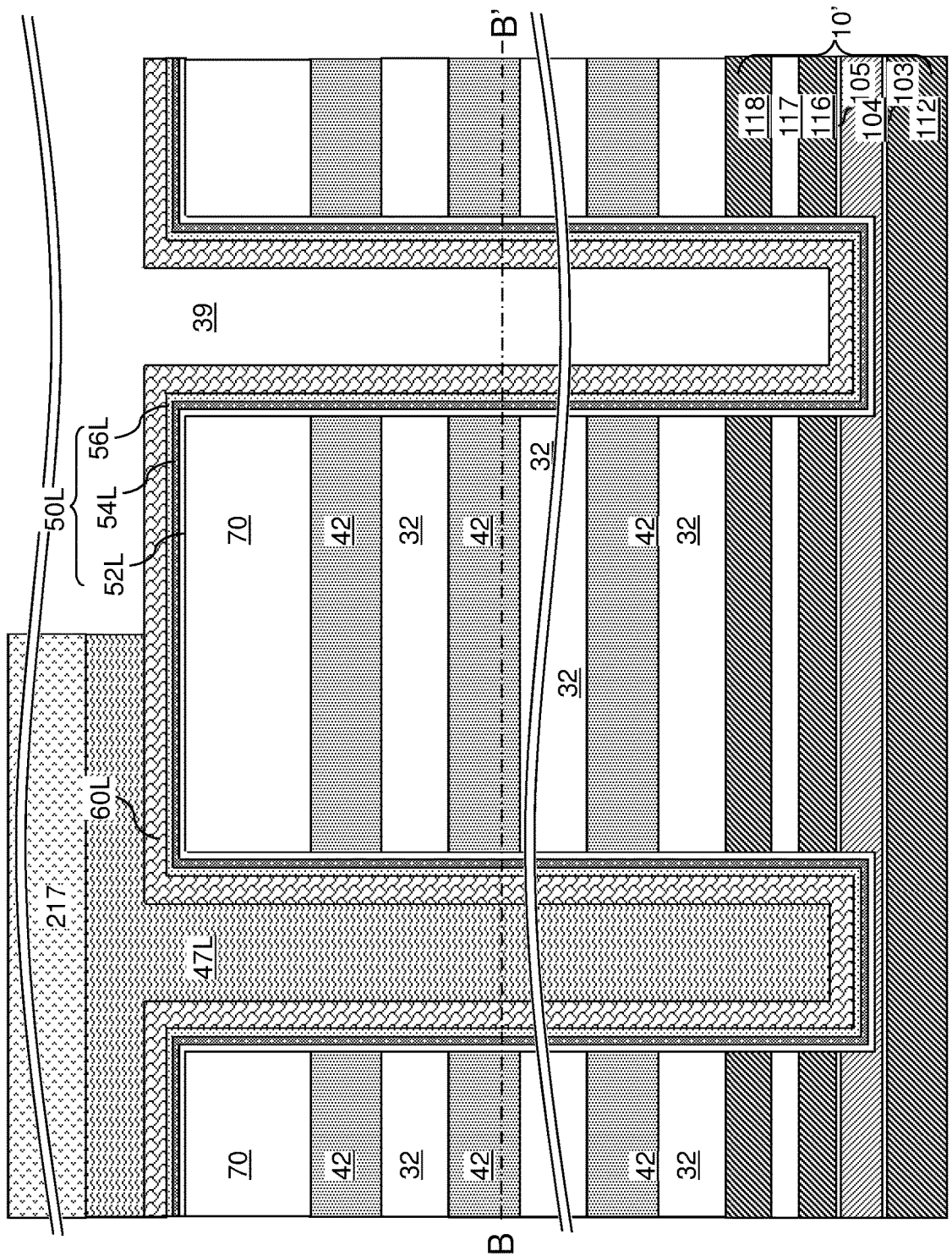
FIG. 8A is a vertical cross-sectional view of line trenches after formation of isolation cavities by patterning the sacrificial fill material layer according to an embodiment of the present disclosure.
Figure 8B:
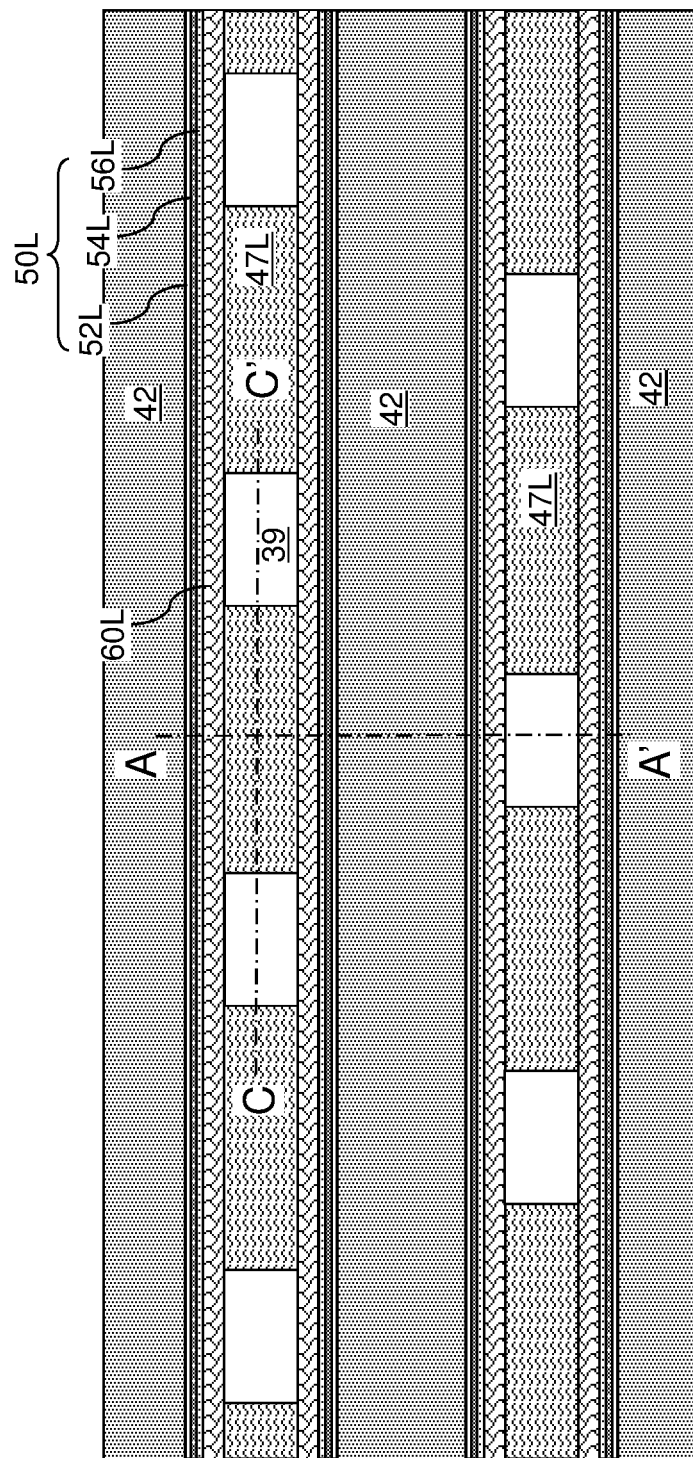
FIG. 8B is a horizontal cross-sectional view along the plane B-B' of FIG. 8A. The vertical plane A-A' corresponds to the plane of the vertical cross-sectional view of FIG. 8A.
Figure 8C:
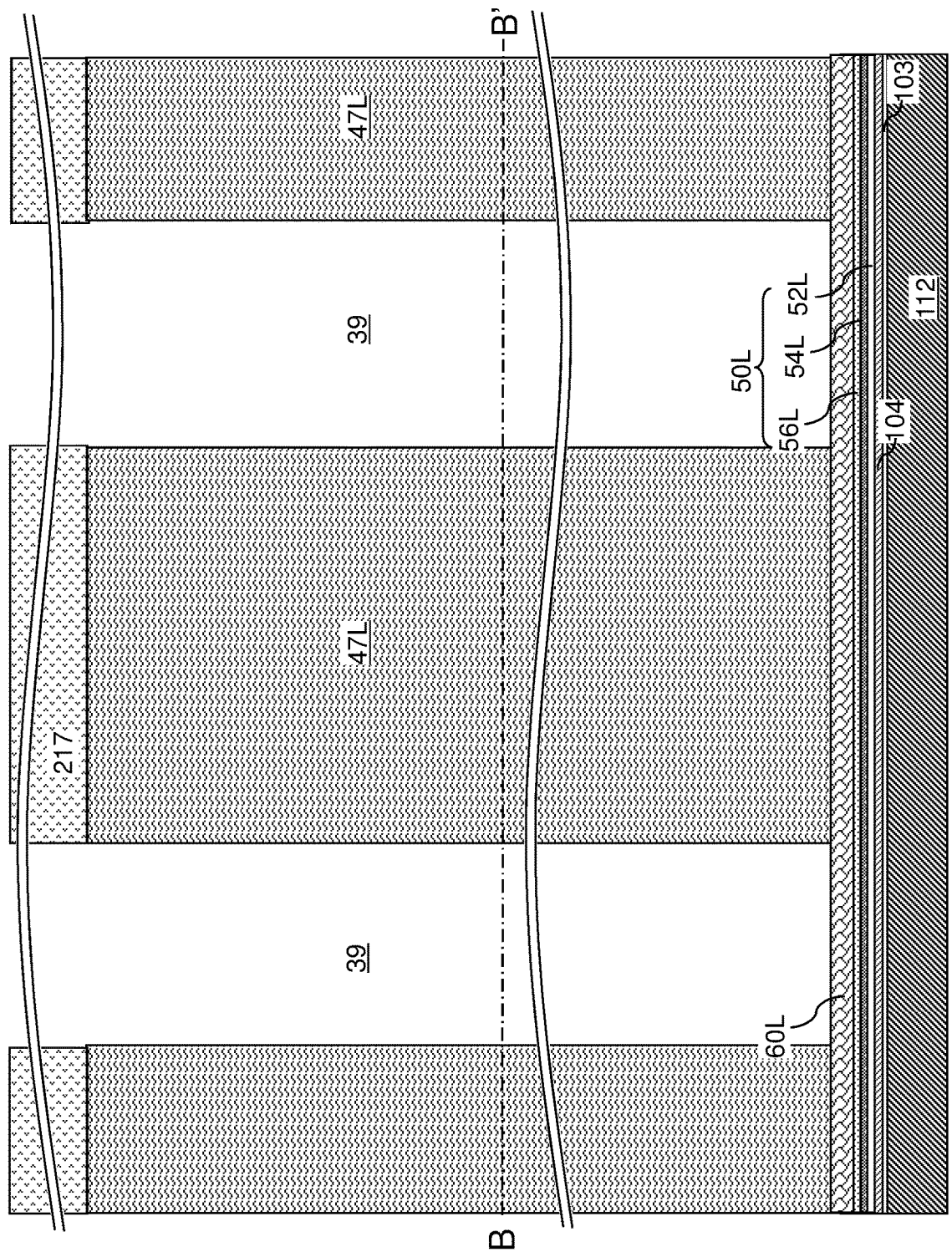
FIG. 8C is a vertical cross-sectional view along the vertical plane C-C' of FIG. 8B.

Referring to FIGS. 8A-8C, a photoresist layer 217 can be applied over the sacrificial fill material layer 47L, and can be lithographically patterned to form a two-dimensional array of discrete openings that overlie the line trenches 149. The two-dimensional array of discrete openings in the photoresist layer 217 can include rows of discrete openings such that each row of discrete openings overlies a respective one of the line trenches 149. An anisotropic etch process is performed to remove unmasked portions of the sacrificial fill material layer 47L. Isolation cavities 39 having substantially vertical or vertical sidewalls can be formed within volumes from which the unmasked portions of the sacrificial fill material layer 47L are removed. Each of the isolation cavities 39 can be laterally bounded by a pair of sidewalls of the continuous semiconductor channel material layer 60L and a pair of sidewalls of the sacrificial fill material layer 47.

A horizontal surface of the continuous semiconductor channel material layer 60L can be physically exposed at the bottom of each isolation cavity 39. The photoresist layer 217 can be subsequently removed, for example, by ashing.

Figure 9A:
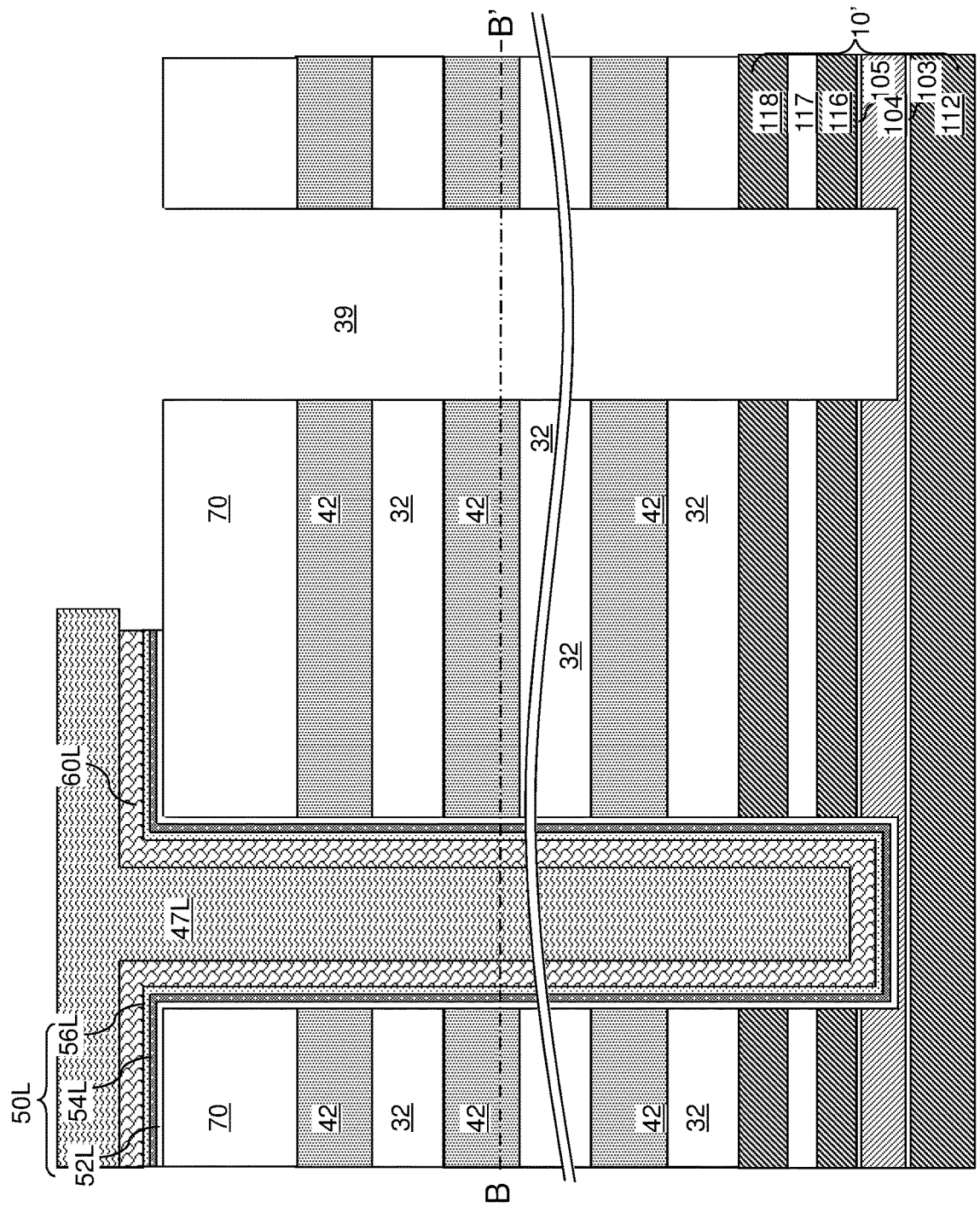
FIG. 9A is a vertical cross-sectional view of line trenches after lateral expansion of the isolation cavities and patterning of the continuous memory film according to an embodiment of the present disclosure.
Figure 9B:
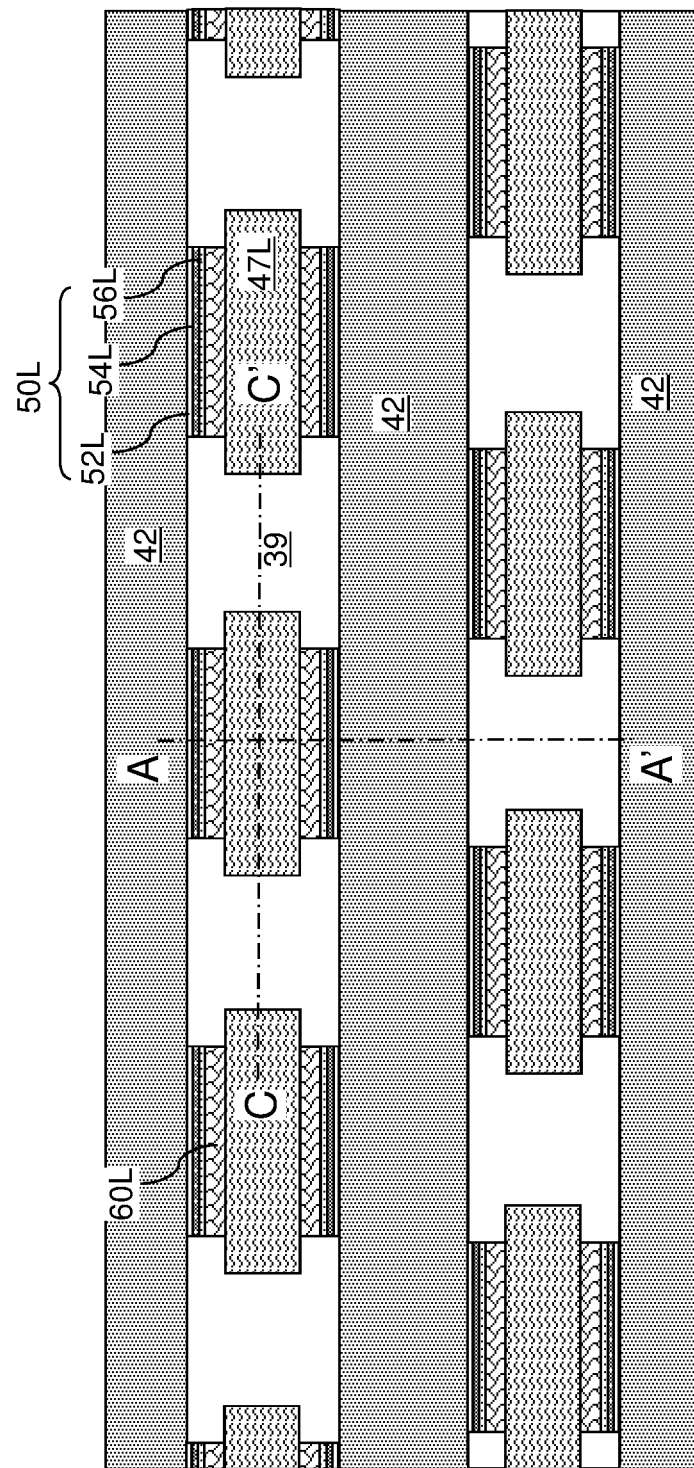
FIG. 9B is a horizontal cross-sectional view along the plane B-B' of FIG. 9A. The vertical plane A-A' corresponds to the plane of the vertical cross-sectional view of FIG. 9A.
Figure 9C:
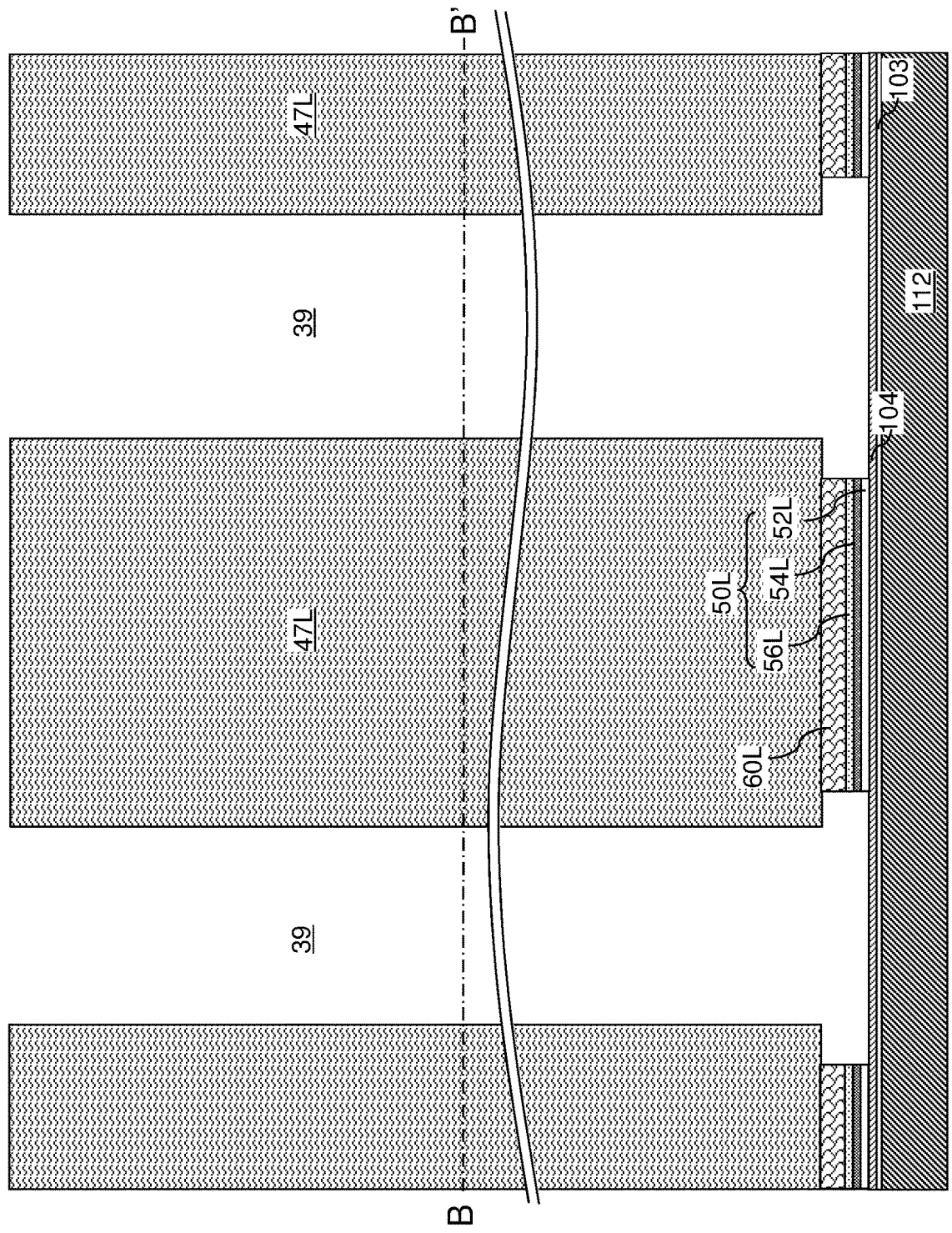
FIG. 9C is a vertical cross-sectional view along the vertical plane C-C' of FIG. 9B.

Referring to FIGS. 9A-9C, physically exposed portions of the continuous semiconductor channel material layer 60L and the continuous memory film 50L can be isotropically or anisotropically etched around the isolation cavities 39. For example, the physically exposed portions of the continuous semiconductor channel material layer 60L can be removed by a wet etch process employing hot trimethyl-2 hydroxyethyl ammonium hydroxide ("hot TMY") or tetramethyl ammonium hydroxide (TMAH).

Physically exposed portions of the continuous memory film 50L can be removed by a sequence of isotropic etch processes that etches the various material layers within the continuous memory film 50L with different etch chemistries. For example, if the continuous tunneling dielectric layer 56L includes silicon oxide or an ONO stack, the continuous tunneling dielectric layer 56L can be etched by a wet etch process employing hydrofluoric acid. If the continuous charge storage layer 54L includes silicon nitride, the continuous tunneling dielectric layer 54L can be etched by a wet etch process employing hot phosphoric acid or a combination of dilute hydrofluoric acid and ethylene glycol. The various layers within the continuous blocking dielectric layer 52L can be sequentially etched by various wet etch processes selected to match the material sequence, from inside to outside, within the continuous blocking dielectric layer 52L. For example, hot phosphoric acid may be used to etch aluminum oxide and zirconium oxide layers.

The isolation cavities 39 are expanded in volume upon removal of discrete portions of the continuous semiconductor channel material layer 60L and the continuous memory film layer 50L. The continuous semiconductor channel material layer 60L includes an array of discrete openings within the areas of the isolation cavities 39. The continuous memory film 50L includes an array of discrete openings within the areas of the isolation cavities 39. Sidewalls of the alternating stacks (32, 42) and sidewalls of the upper sacrificial liner 105, the upper source-level material layer 116, the source-level insulating layer 117, and the optional source-select-level conductive layer 118 can be physically exposed around the isolation cavities 39. A top surface of the source-level sacrificial layer 104 can be physically exposed at the bottom of each isolation cavity 39.

Figure 10A:
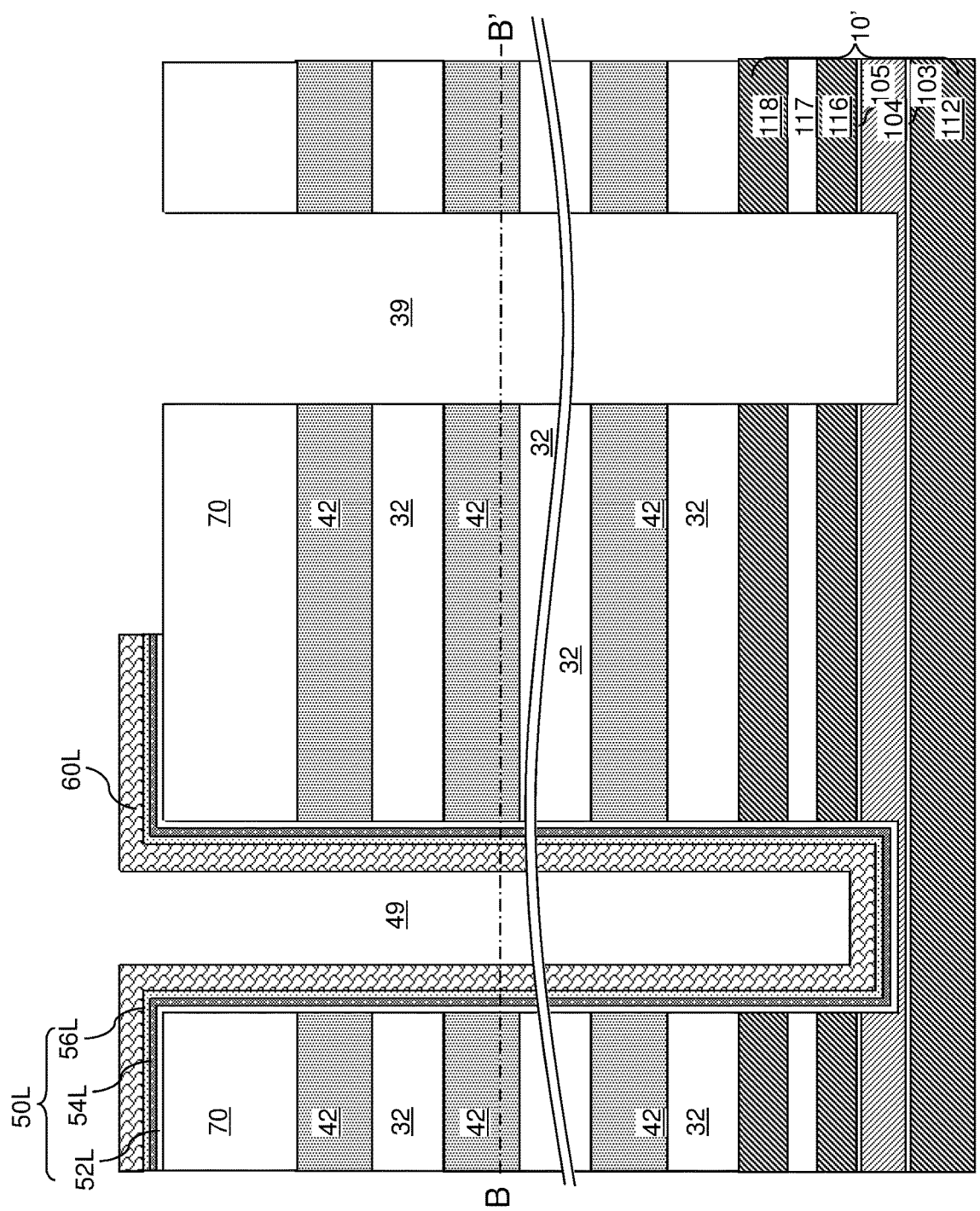
FIG. 10A is a vertical cross-sectional view of line trenches after removal of the sacrificial fill material layer after lateral expansion of the isolation cavities according to an embodiment of the present disclosure.
Figure 10B:
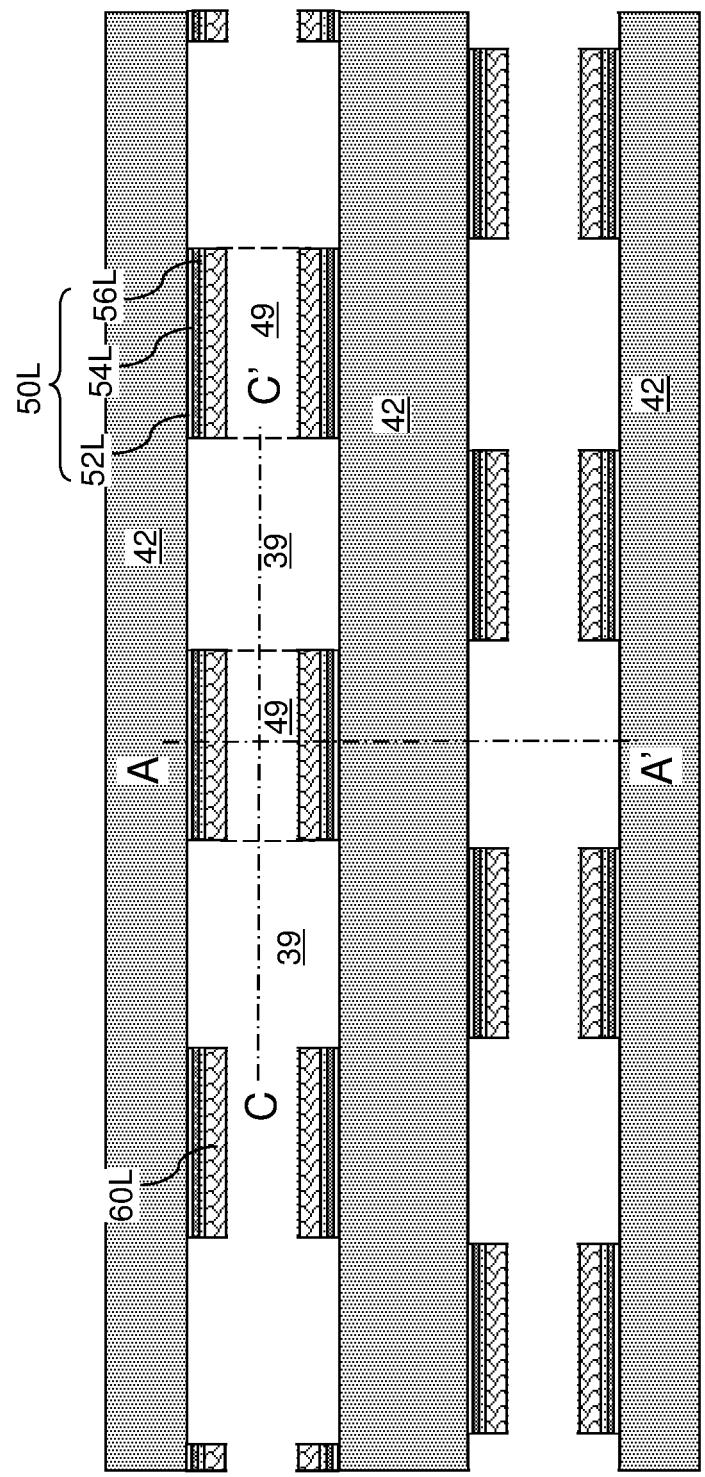
FIG. 10B is a horizontal cross-sectional view along the plane B-B' of FIG. 10A. The vertical plane A-A' corresponds to the plane of the vertical cross-sectional view of FIG. 10A.
Figure 10C:
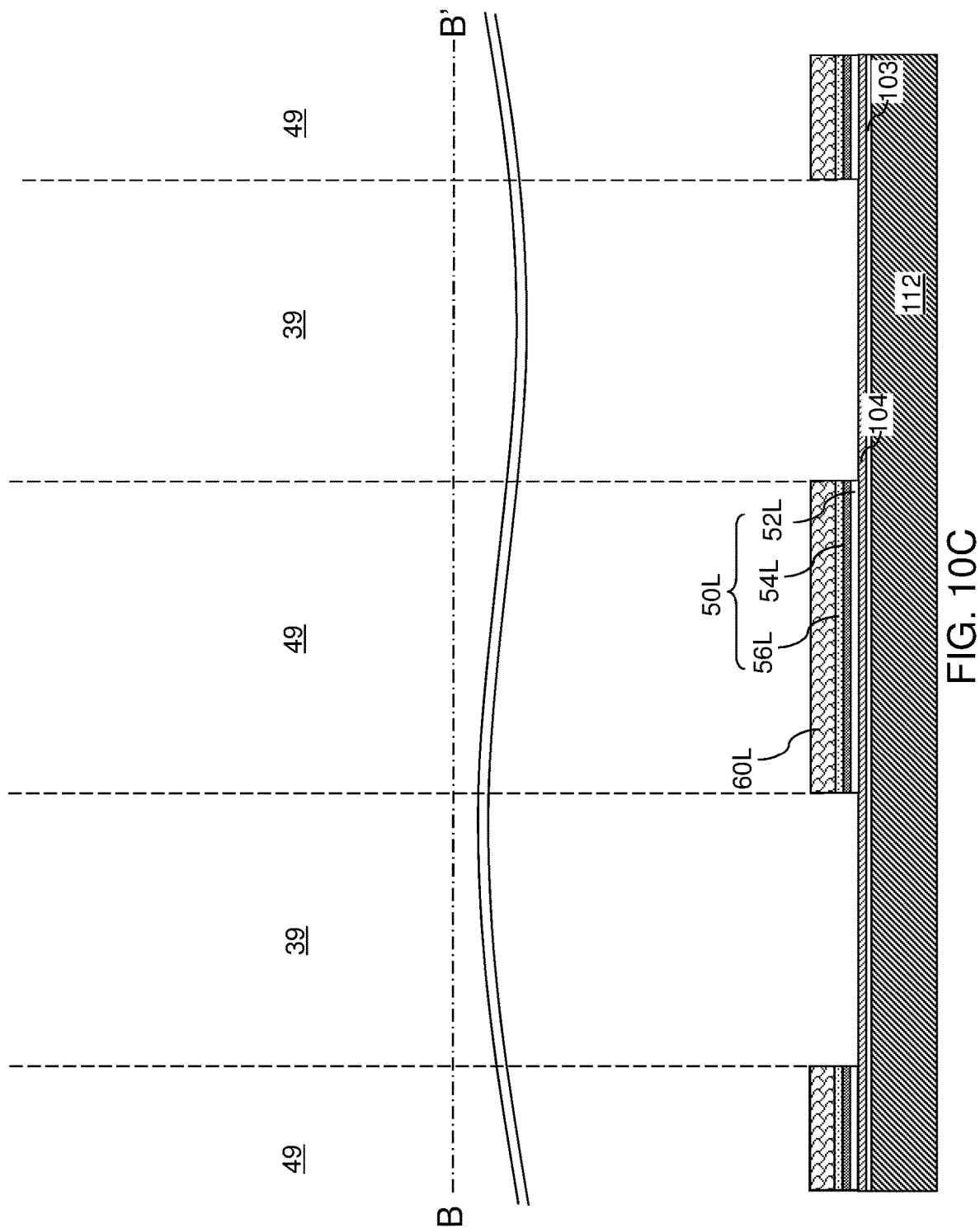
FIG. 10C is a vertical cross-sectional view along the vertical plane C-C' of FIG. 10B.

Referring to FIGS. 10A-10C, remaining portions of the sacrificial fill material layer 47L can be removed selective to the continuous semiconductor channel material layer 60L and the continuous memory film SOL. If the sacrificial fill material layer 47L includes a carbon-containing material derived from spin-on-carbon, the sacrificial fill material layer 47L can be removed by ashing, i.e., by controlled reaction with oxygen in an oxygen-containing environment.

A memory cavity 49 is formed within each volume of the line trenches 149 from which a portion of the sacrificial fill material layer 47L is removed at the processing steps of FIGS. 10A-10C. A width-modulated cavity (39, 49) is formed within in the unfilled volume of each line trench 149. Each width-modulated cavity (39, 49) includes a laterally alternating sequence of neck portions (i.e., portions having a lesser width) and bulbous portions (i.e., portions having a greater width). Each neck portion includes a volume of a memory cavity 49, and each bulbous portion includes a volume of an isolation cavity 39, which has the same width as the line trench 149.

Figure 11A:
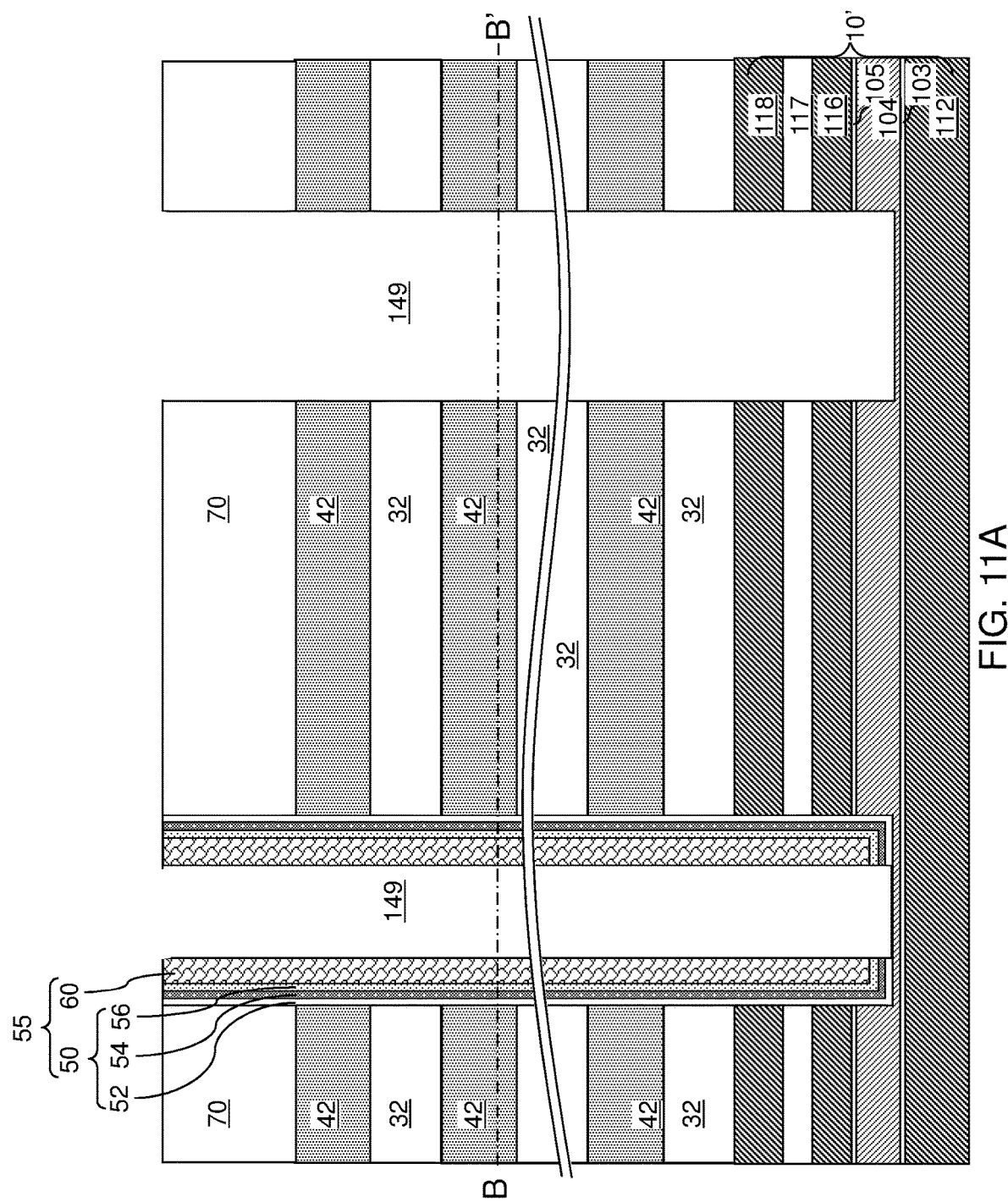
FIG. 11A is a vertical cross-sectional view of line trenches after patterning the continuous memory film and the continuous semiconductor channel material layer into discrete memory films and semiconductor channels by an anisotropic etch process according to an embodiment of the present disclosure.
Figure 11B:
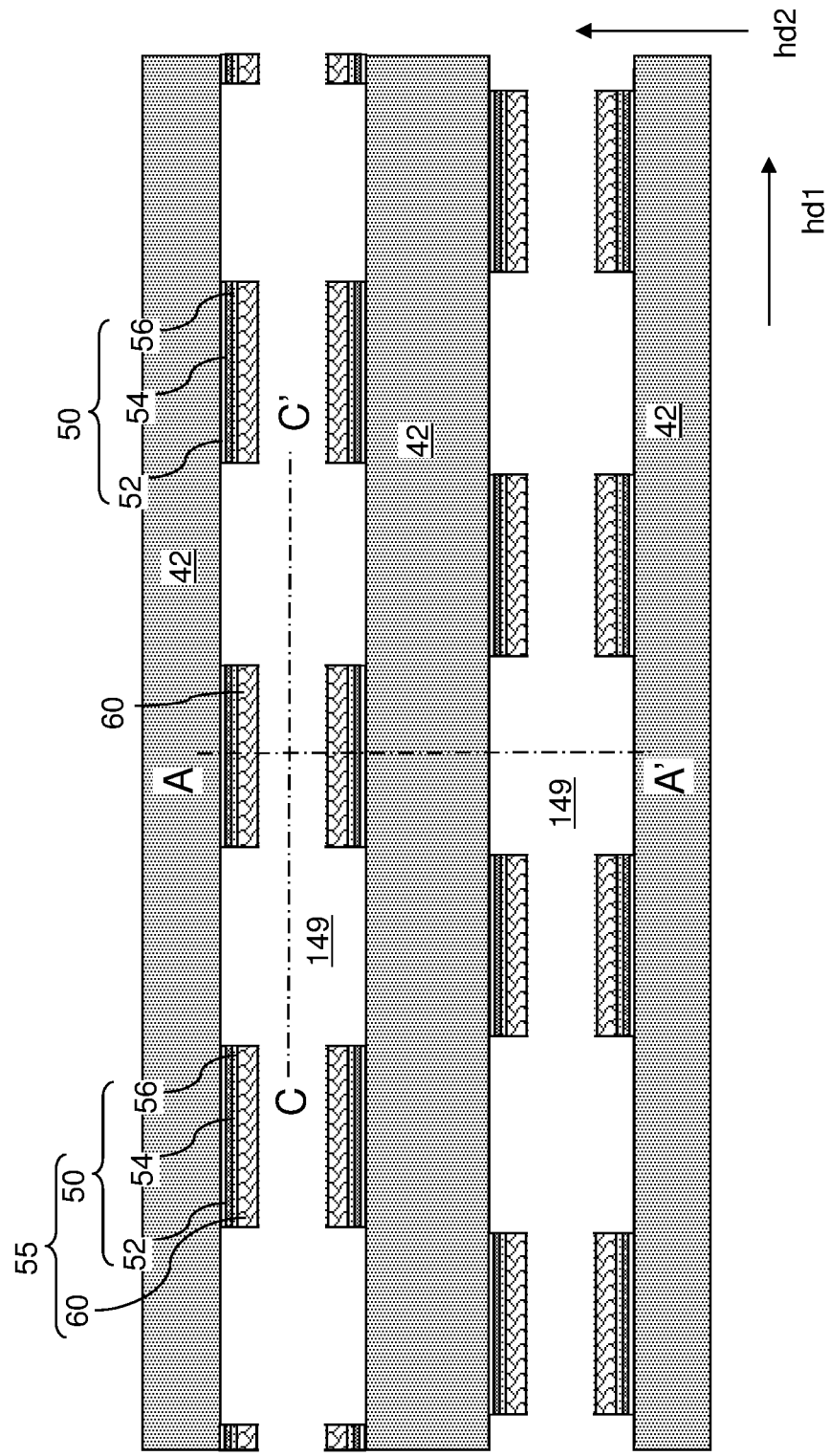
FIG. 11B is a horizontal cross-sectional view along the plane B-B' of FIG. 11A. The vertical plane A-A' corresponds to the plane of the vertical cross-sectional view of FIG. 11A.

Referring to FIGS. 11A-11C, horizontal portions of the continuous layer stack including the continuous semiconductor channel material layer 60L and the continuous memory film layer 50L are etched by an anisotropic etch process. The horizontal portions of the continuous semiconductor channel material layer 60L and the continuous memory film layer 50L are removed from above the insulating cap layer 70 and from the bottom of each line trench 149. The continuous layer stack (60L, 50L) is divided into discrete layer stacks, each of which constitutes a memory stack structure 55. Each remaining discrete vertical portion of the continuous semiconductor channel material layer 60L constitutes a vertical semiconductor channel 60. Each remaining discrete vertical portion of the continuous memory film 50L constitutes a memory film 50. Each memory film 50 includes a composite blocking dielectric 52 that is a patterned portion of the continuous blocking dielectric layer 52L, a charge storage layer 54 that is a patterned portion of the continuous charge storage layer 54L, and a tunneling dielectric 56 that is a patterned portion of the continuous tunneling dielectric layer 56L.

The memory stack structures 55 are arranged in rows extending along the first horizontal direction hd1 in the line trenches 149. Each row of memory stack structures 55 is formed on a respective sidewall of the line trenches 149. Each of the memory stack structures 55 includes: a vertical semiconductor channel 60, a tunneling dielectric 56 contacting the vertical semiconductor channel 60, a charge storage layer 54 contacting the tunneling dielectric 56, and a composite blocking dielectric 52 contacting charge storage layer 54 and contacting sacrificial material layers 42 within one of the alternating stacks (32, 42). The composite blocking dielectric 52 comprises, from one side to another, a first dipole-containing blocking dielectric layer stack (521, 522), a homogeneous blocking dielectric layer 523, and a second dipole-containing blocking dielectric layer stack (524, 525). The interfaces between each row of memory stack structures 55 and a respective alternating stack (32, 42) of insulating layers 32 and sacrificial material layers 42 are located within a respective two-dimensional vertical plane that includes a sidewall of the alternating stack (32, 42). A top surface of the source-level sacrificial layer 104 can be physically exposed at the bottom of each width-modulated cavity (39, 49) located in the line trenches 149. In one embodiment, the entire bottom surface of a width-modulated cavity (39, 49) can be a surface of the source-level sacrificial layer 104.

Figure 12A:
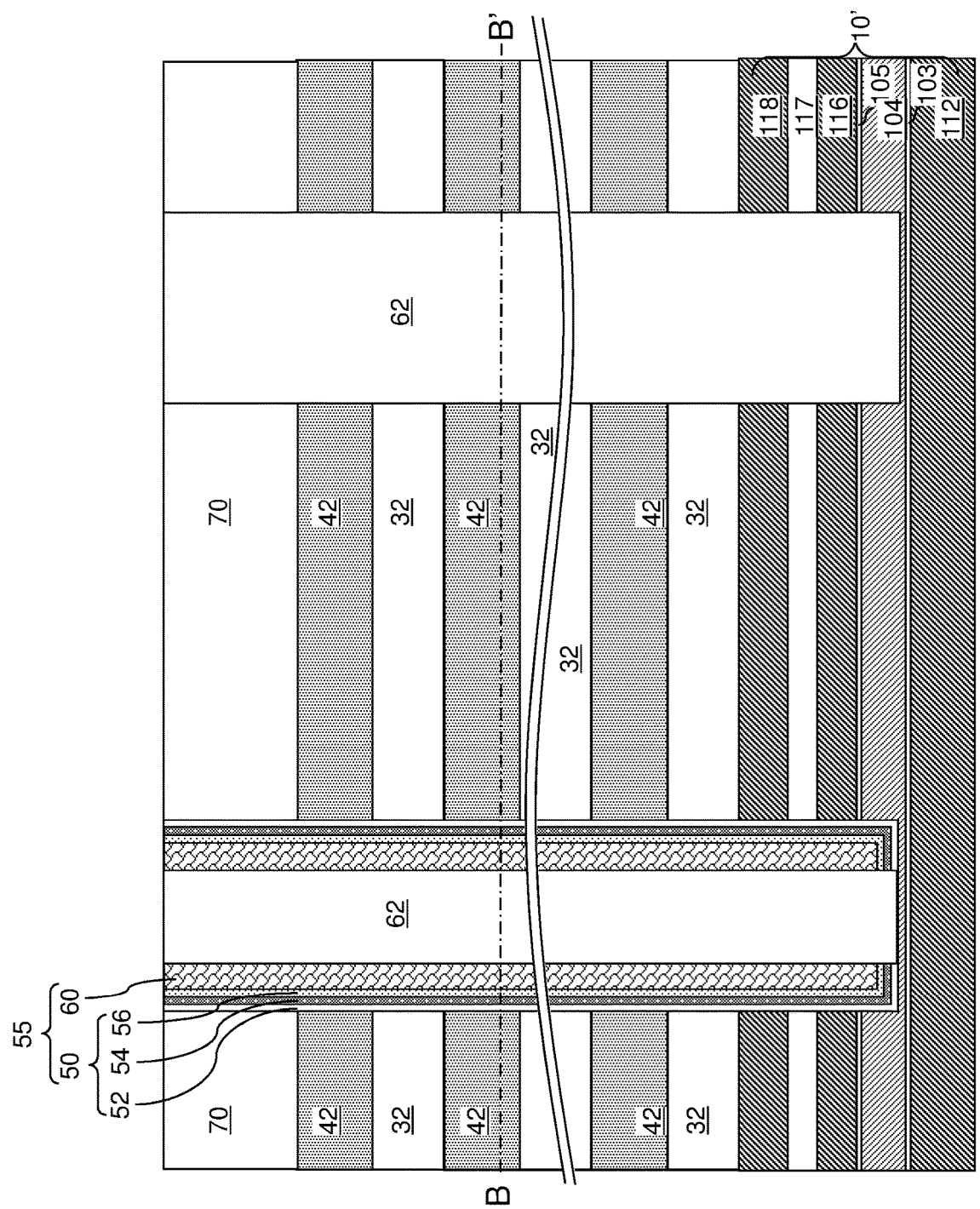
FIG. 12A is a vertical cross-sectional view of line trenches after formation of dielectric trench cores according to an embodiment of the present disclosure.
Figure 12B:
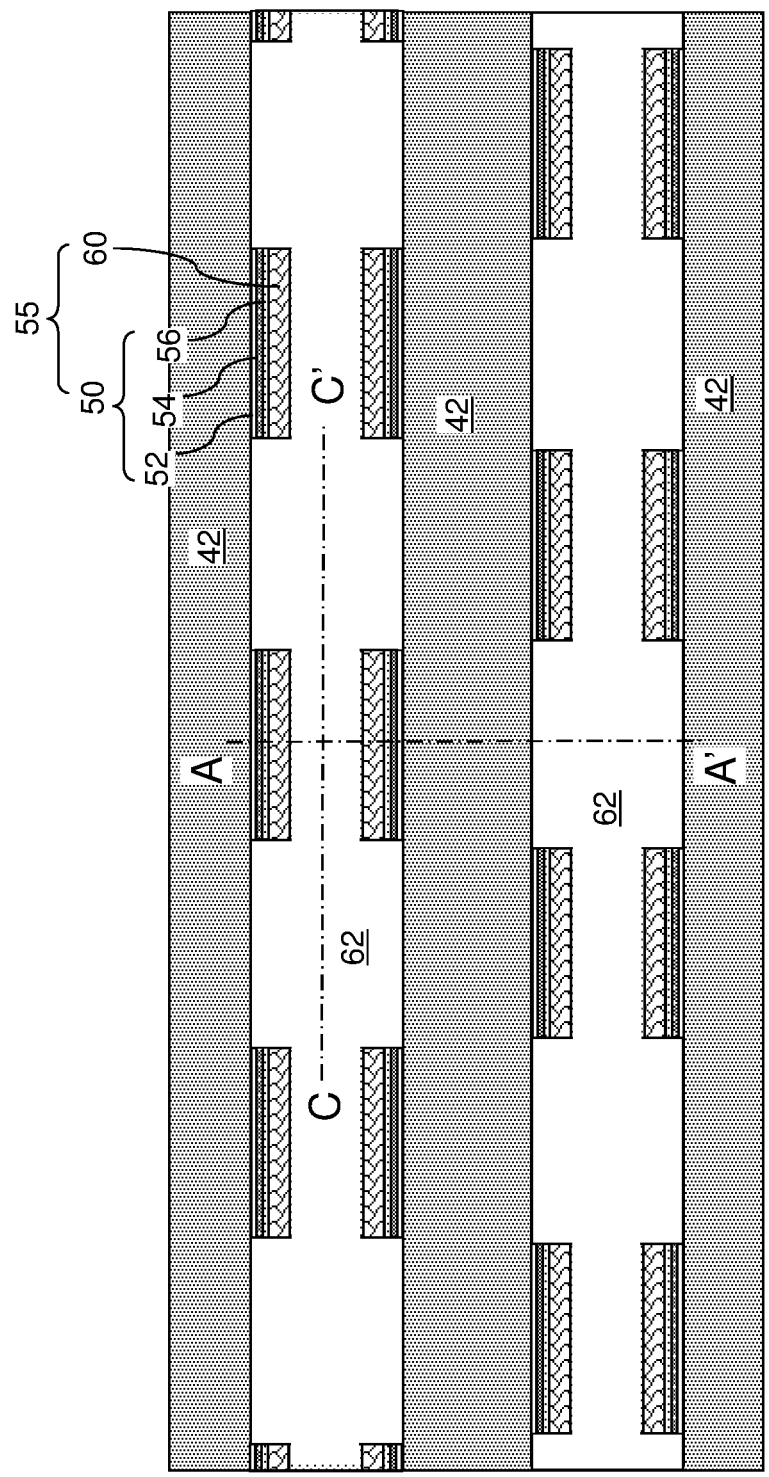
FIG. 12B is a horizontal cross-sectional view along the plane B-B' of FIG. 12A. The vertical plane A-A' corresponds to the plane of the vertical cross-sectional view of FIG. 12A.
Figure 12C:
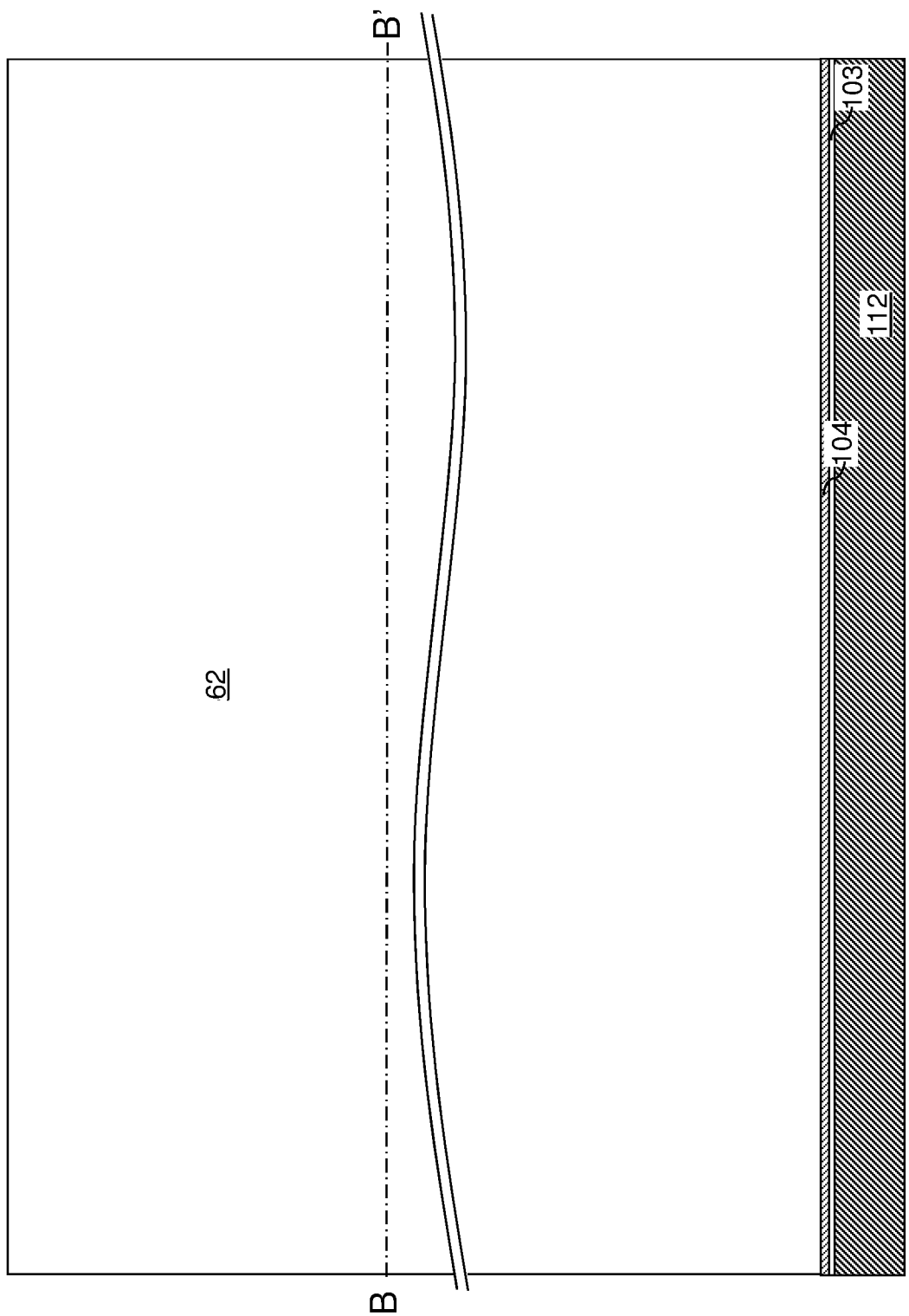
FIG. 12C is a vertical cross-sectional view along the vertical plane C-C' of FIG. 12B.

Referring to FIGS. 12A-12C, a dielectric material such as silicon oxide can be deposited in the width-modulated cavities (39, 49) by a conformal or non-conformal deposition process. For example, silicon oxide can be deposited by chemical vapor deposition or by spin-coating in the width-modulated cavities (39, 49). Excess portions of the dielectric material can be removed from above the horizontal plane including the top surface of the patterned portions of the insulating cap layer 70. Each remaining portion of the deposited dielectric material in the width-modulated cavities (39, 49) constitutes a dielectric trench core, which has a laterally undulating width and is also referred to as a width-modulated dielectric trench core 62. Each of the width-modulated dielectric trench cores 62 is formed directly on sidewalls of two rows of vertical semiconductor channels 60 and directly on a pair of alternating stacks of insulating strips 32 and sacrificial material strips 42. Each width-modulated dielectric trench core 62 has a laterally alternating sequence of neck portions having a first uniform width and bulbous portions having a second uniform width.

Figure 13A:
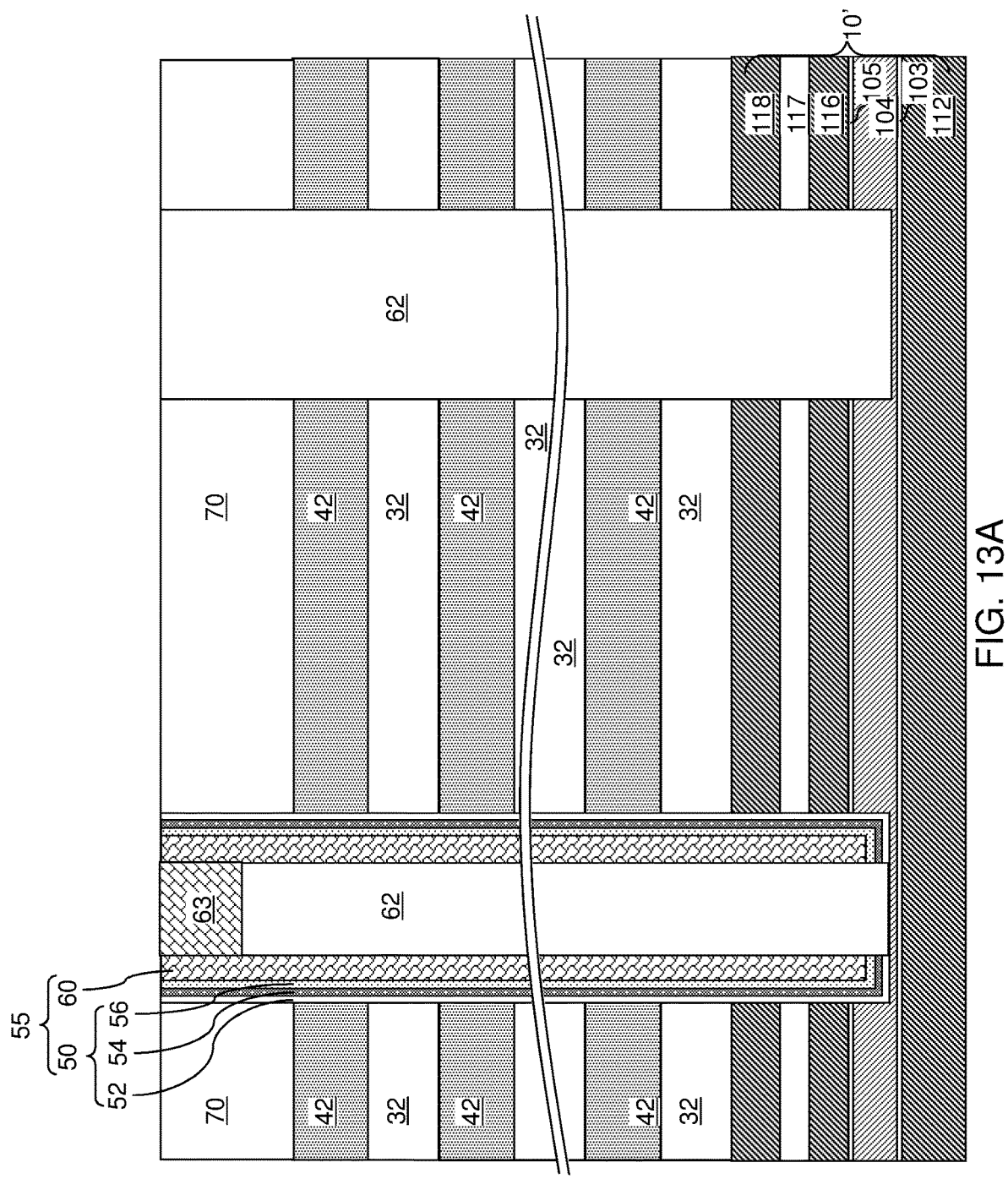
FIG. 13A is a vertical cross-sectional view of line trenches after formation of drain regions according to an embodiment of the present disclosure.
Figure 13B:
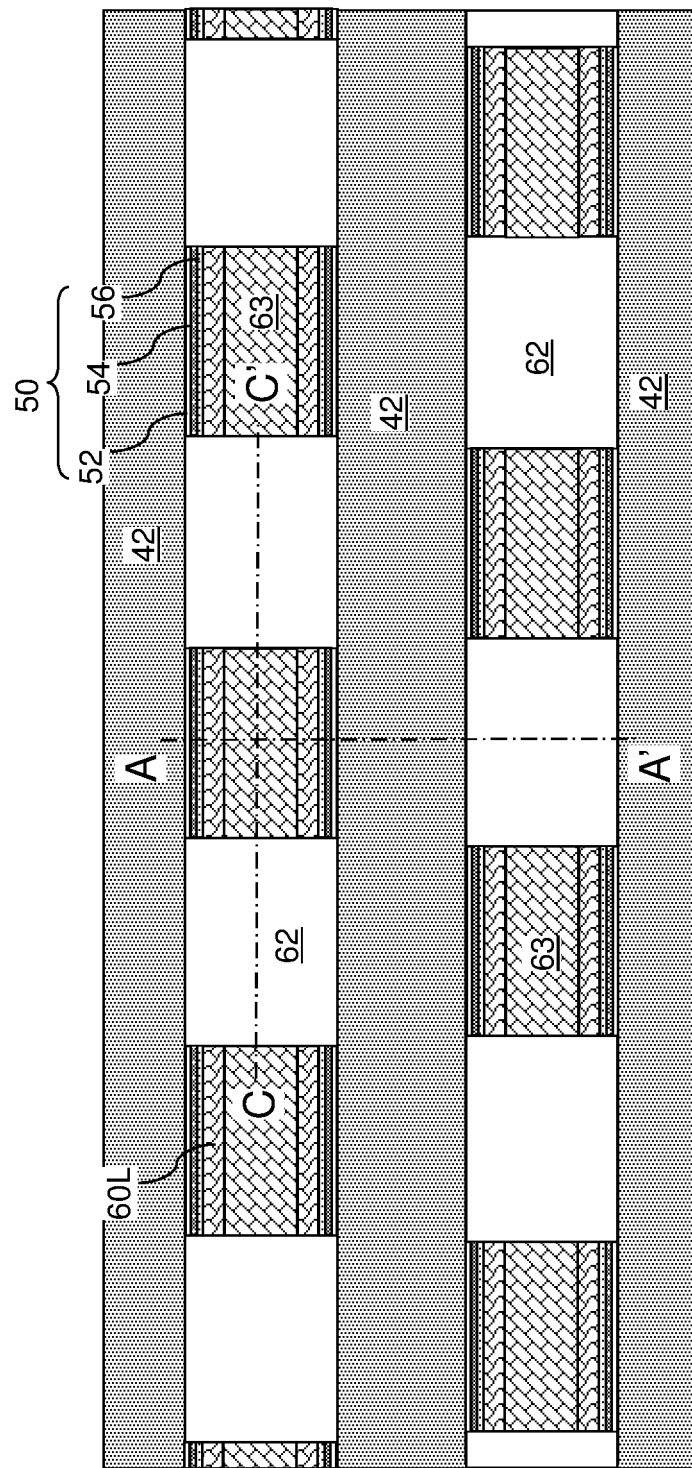
FIG. 13B is a top-down view of the exemplary structure of FIG. 13A. The vertical plane A-A' corresponds to the plane of the vertical cross-sectional view of FIG. 13A.
Figure 13C:
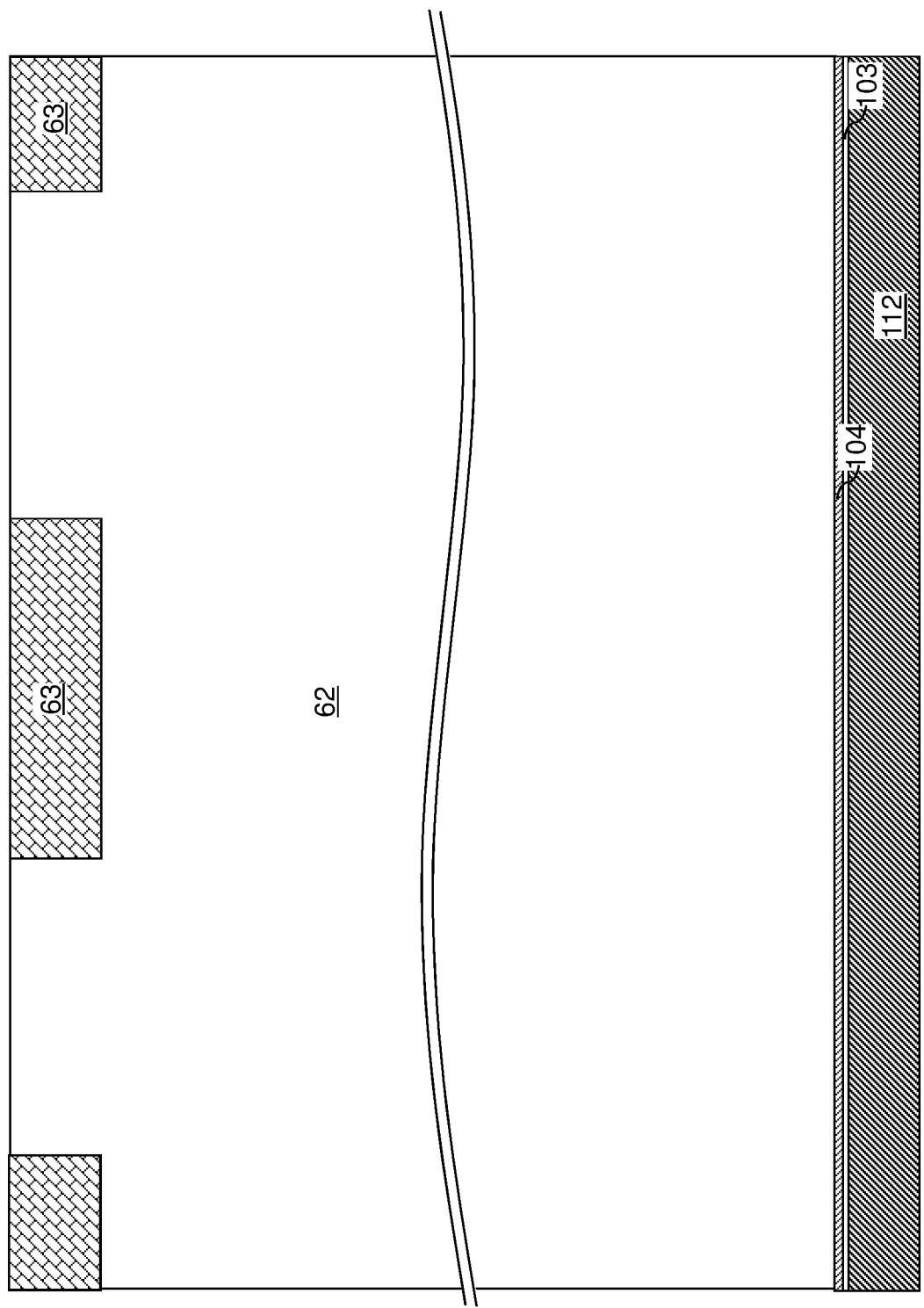
FIG. 13C is a vertical cross-sectional view along the vertical plane C-C' of FIG. 13B.
Figure 14A:
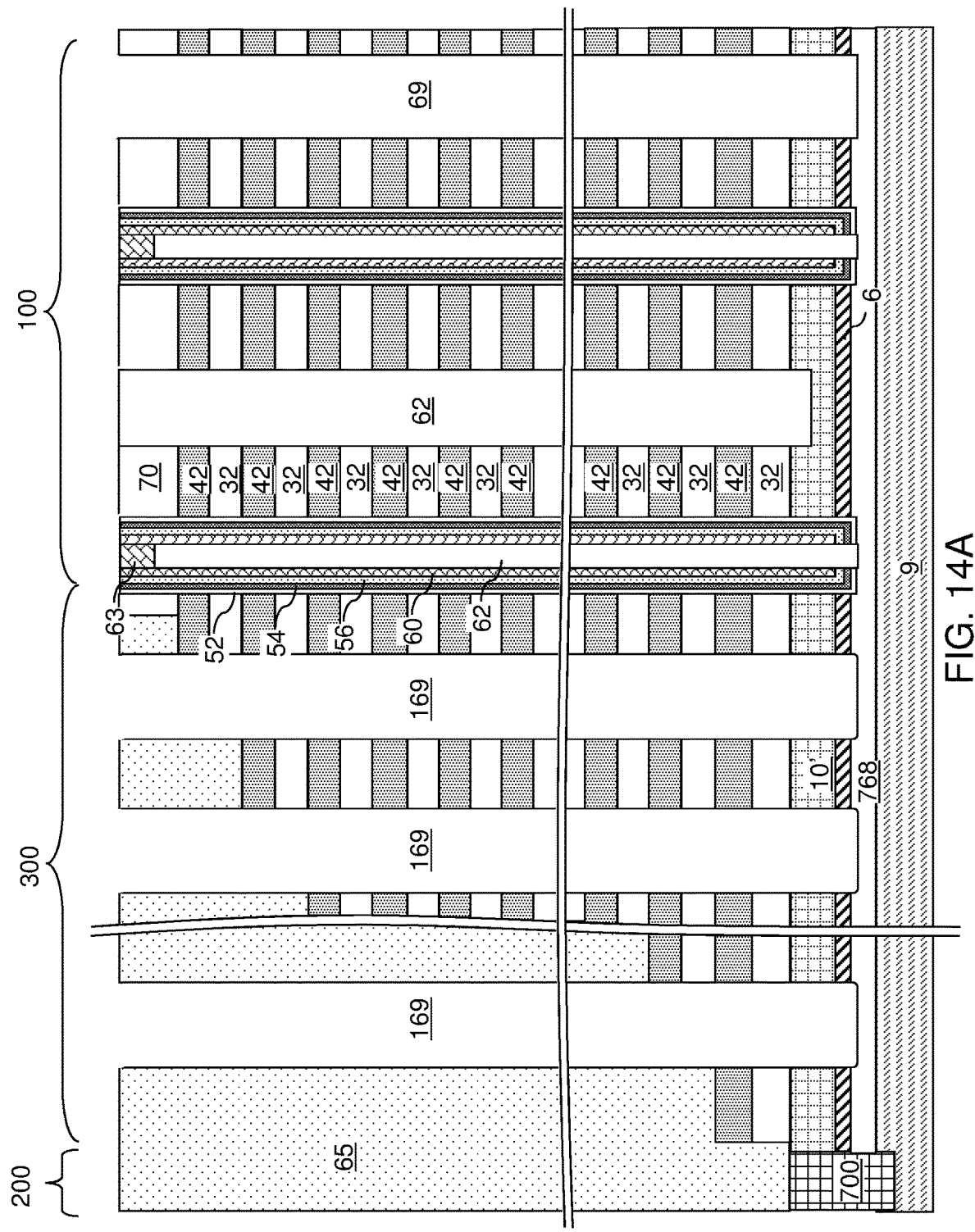
FIG. 14A is a vertical cross-sectional view of the exemplary structure after formation of backside via cavities according to an embodiment of the present disclosure.
Figure 14B:
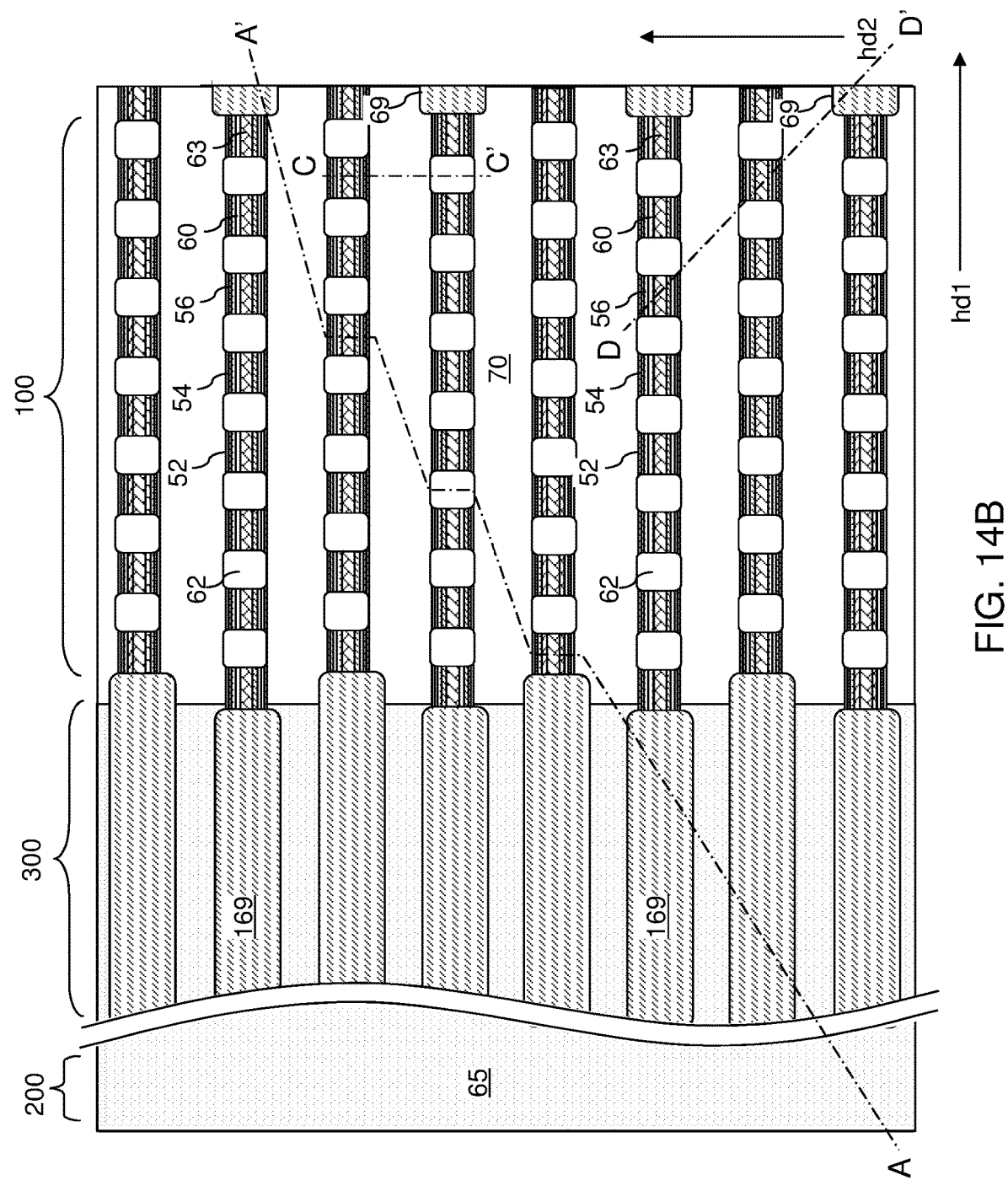
FIG. 14B is a top-down view of the exemplary structure of FIG. 14A. The vertical plane A-A' is the plane of the cross-section for FIG. 14A.
Figure 14C:
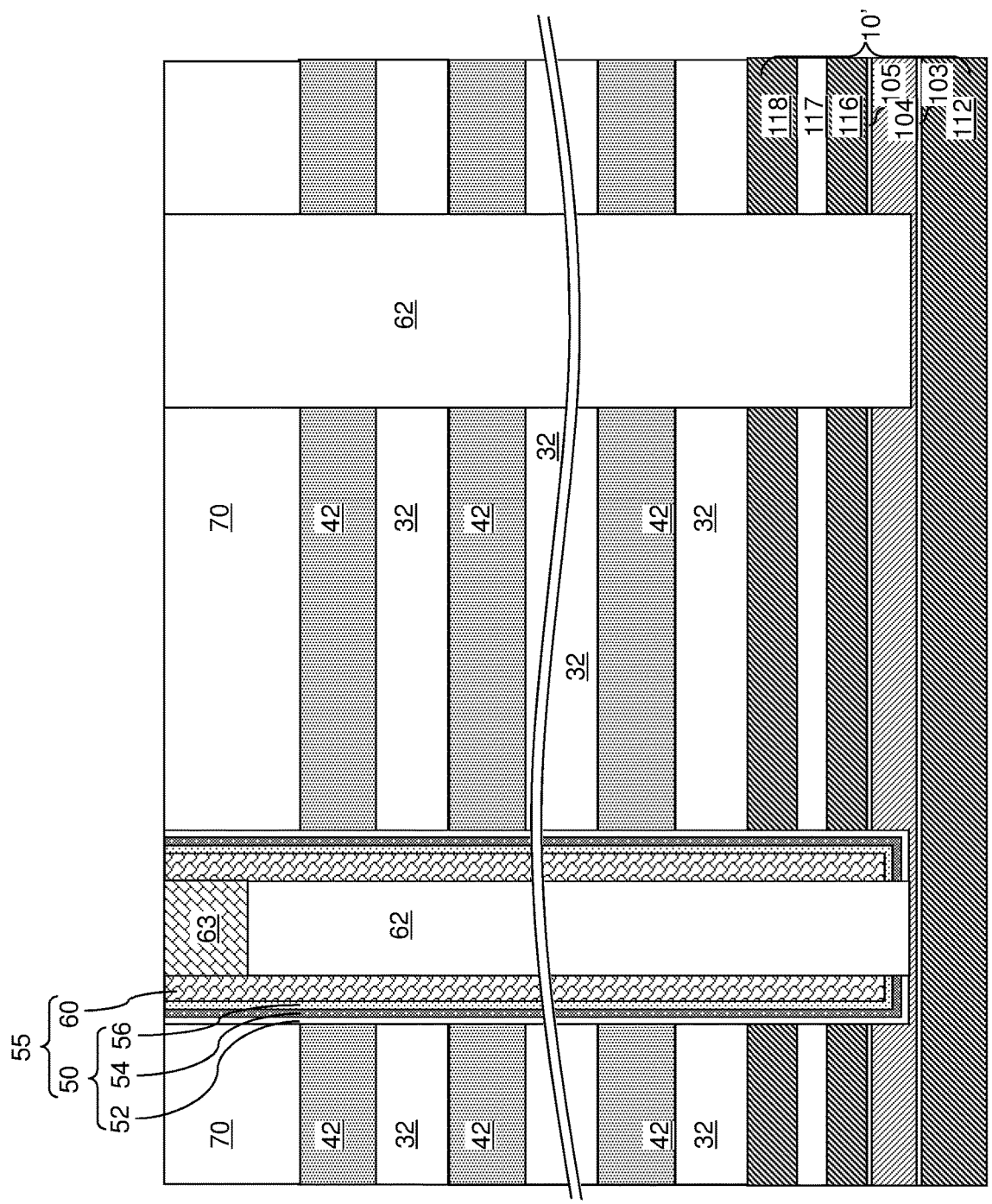
FIG. 14C is a vertical cross-sectional view along the plane C-C' of FIG. 14B.
Figure 14D:
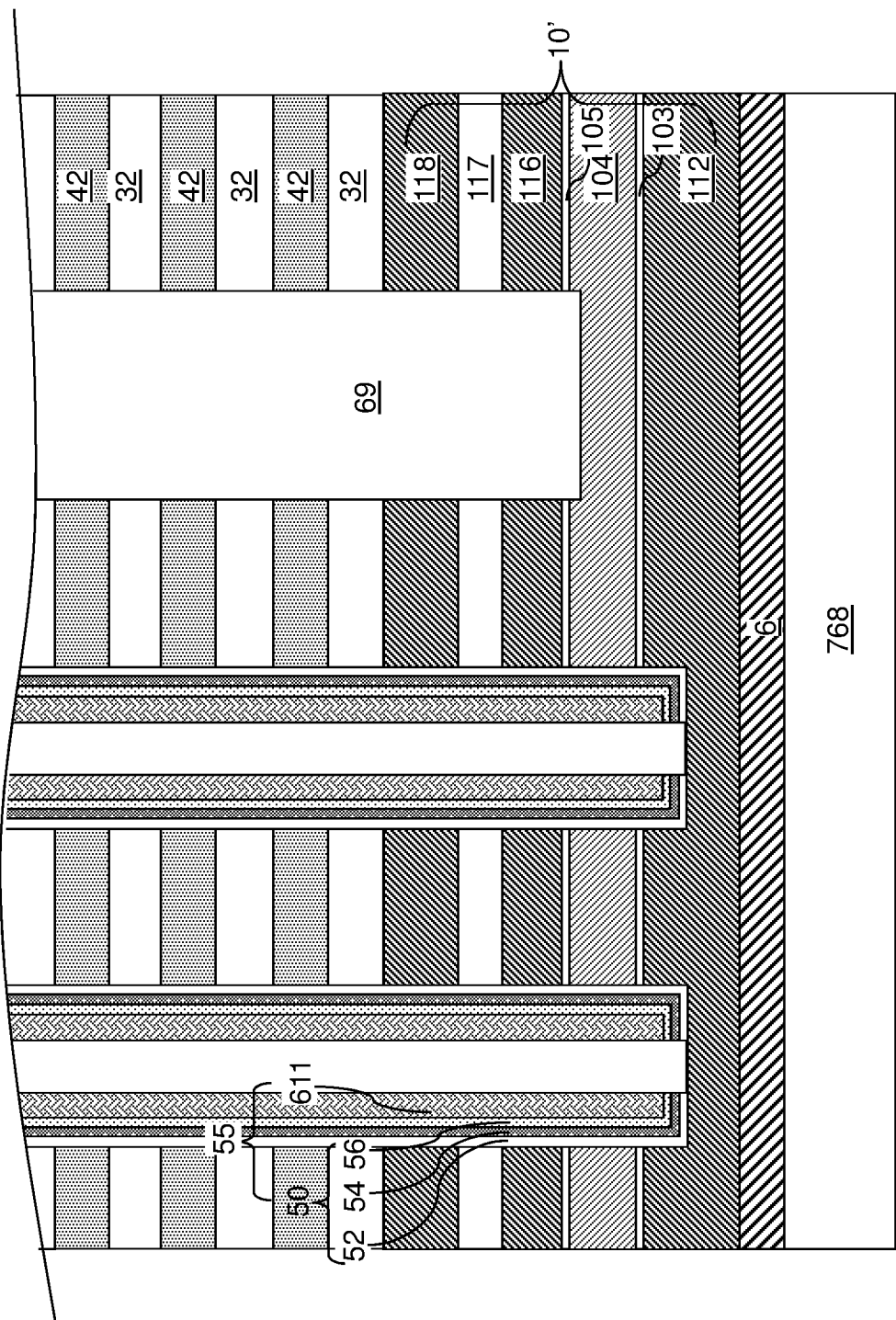
FIG. 14D is a vertical cross-sectional view along the plane D-D' of FIG. 14B.

Referring to FIGS. 13A-13C, in one embodiment, regions of the width-modulated dielectric trench cores 62 between a neighboring pair of vertical semiconductor channels 60 can be vertically recessed, for example, by applying and patterning a photoresist layer to provide openings in areas between the neighboring pairs of vertical semiconductor channels 60, and by anisotropically etching the physically exposed regions of the width-modulated dielectric trench cores 62. The depth of the recess can be selected such that the recessed surfaces of the width-modulated dielectric trench cores 62 are located between a horizontal plane including the top surfaces of the insulating cap layer 70 and a horizontal plane including the bottom surfaces of the insulating cap layer 70. A doped semiconductor material having a doping of a second conductivity type is formed in the recessed regions between neighboring pairs of vertical semiconductor channels 60. The second conductivity type is the opposite of the first conductivity type. The doped semiconductor material can include electrical dopants of the second conductivity type at an atomic concentration in a range from $5.0 \times 10^{19}/cm^3$ to $1.0 \times 10^{21}/cm^3$. Portions of the deposited doped semiconductor material of the second conductivity type that overlie the horizontal plane including the top surfaces of the patterned portions of the insulating cap layer 70 can be removed by a planarization process, which can be a recess etch that etches the semiconductor materials selective to the dielectric material of the insulating cap layer 70 or a chemical mechanical planarization (CMP) process. Each remaining portion of the doped semiconductor material of the second conductivity type constitutes a drain region 63.

In an alternative embodiment, the drain regions 63 can be formed by ion implantation of dopants of the second conductivity type into the exposed upper portions of the vertical semiconductor channels 60. In this alternative embodiment, the recess of the dielectric trench cores 62 and deposition of additional semiconductor material to form the drain regions 63 can be omitted.

Referring to FIGS. 14A-14D, backside via cavities 69 are formed in discrete locations that intersects the line trenches 149. The backside via cavities 69 can have substantially vertical sidewalls, and extend through portions of the width-modulated dielectric trench cores 62 in the memory array region 100. Sidewalls of the sacrificial material strips 42 within a neighboring pair of alternating stacks (32, 42) are physically exposed at each level of the sacrificial material strips 42. The bottom surfaces of the backside via cavities 69 can be at, or below, the horizontal plane including the bottommost surfaces of the sacrificial material strips 42 around each backside via cavity 69. In one embodiment, the backside via cavities 69 can be formed at regular intervals along the first horizontal direction hd1 for each of the line trenches 149.

Elongated backside trenches 169 are formed through portions of the line trenches 149 located in the contact region 300. The elongated backside trenches 169 laterally extend along the first horizontal direction hd1 within the volumes of the line trenches 149 in the contact region 300. In case the line trenches 149 do not divide the vertically alternating sequence of the insulating layers 32 and the sacrificial material layers 42 into discrete alternating stacks (32, 42) of insulating strips 32 and sacrificial material strips 42, the elongated backside trenches 169 divide the vertically alternating sequence of the insulating layers 32 and the sacrificial material layers 42 into discrete alternating stacks (32, 42) of insulating strips 32 and sacrificial material strips 42. Sidewalls of the sacrificial material strips 42 within a neighboring pair of alternating stacks (32, 42) are physically exposed at each level of the sacrificial material strips 42 around each elongated backside trench 169. The bottom surfaces of the elongated backside trenches 169 can be at, or below, the horizontal plane including the bottommost surfaces of the sacrificial material strips 42.

The line trenches 149 can be modified by the backside via cavities 69 and the elongated backside cavities 169. The widths of the backside via cavities 69 and the elongated backside cavities 169 can be greater than the maximum width of the line trenches 149 to ensure that sidewalls of the sacrificial material strips 42 are physically exposed on both sides of each of the backside via cavities 69 and the elongated backside cavities 169.

Figure 15A:
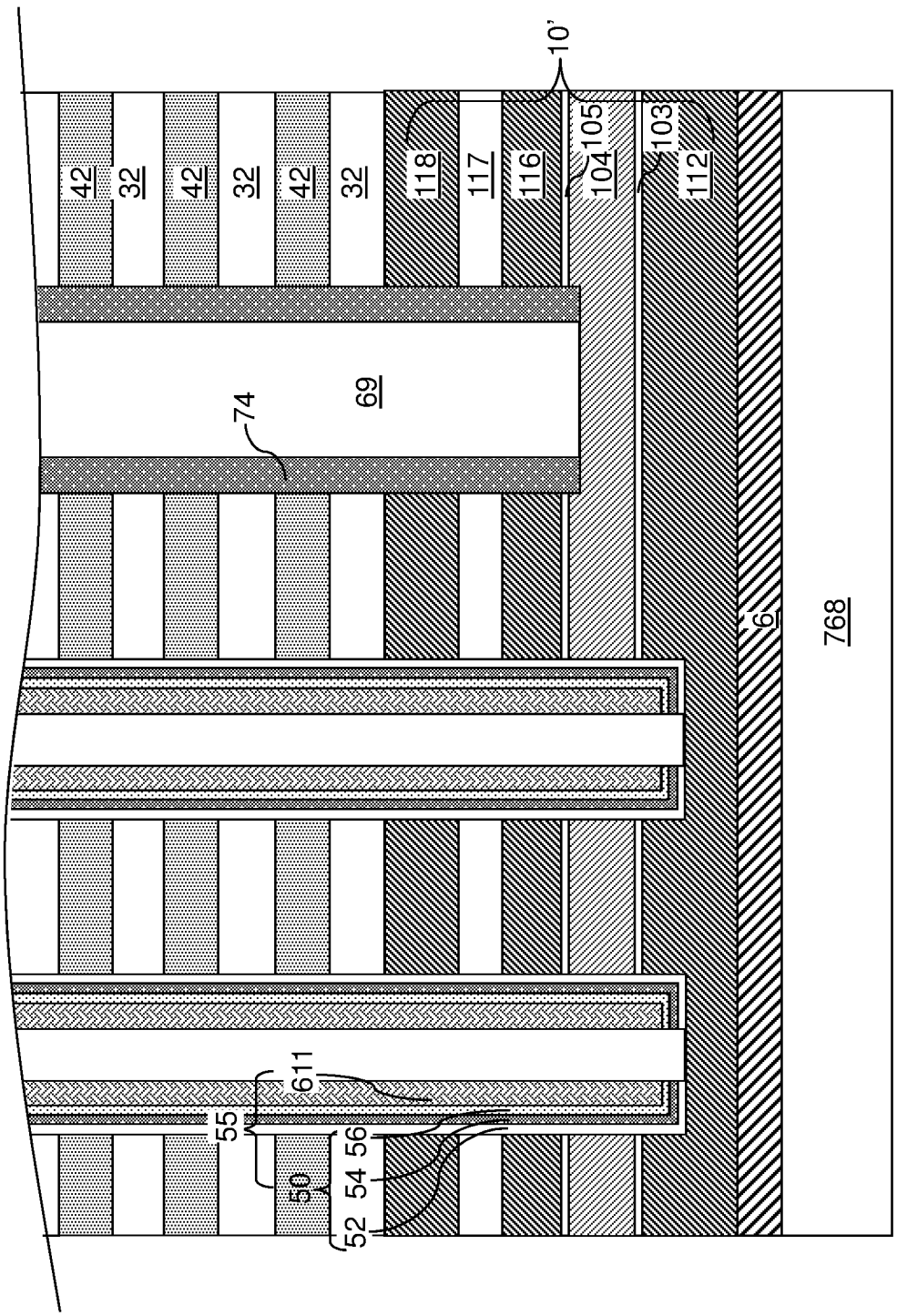
FIGS. 15A-15G are sequential vertical cross-sectional views of a region of the exemplary structure during replacement of the in-process source-level material layers with source-level material layers and replacement of the sacrificial material layers with electrically conductive strips according to an embodiment of the present disclosure.

Referring to FIG. 15A, an etch stop material can be conformally deposited and anisotropically etched to form a backside trench spacer 74 within each backside via cavity 69 and each elongated backside cavity 169. The backside trench spacers 74 are sacrificial spacers that protect the alternating stack (32, 42) during replacement of the in-process source-level material layers 10' with source-level material layers 10. In one embodiment, the backside trench spacers 74 include silicon nitride. The thickness of the backside trench spacers 74 can be in a range from 2 nm to 20 nm, such as from 3 nm to 10 nm, although lesser and greater thicknesses can also be employed.

Figure 15B:
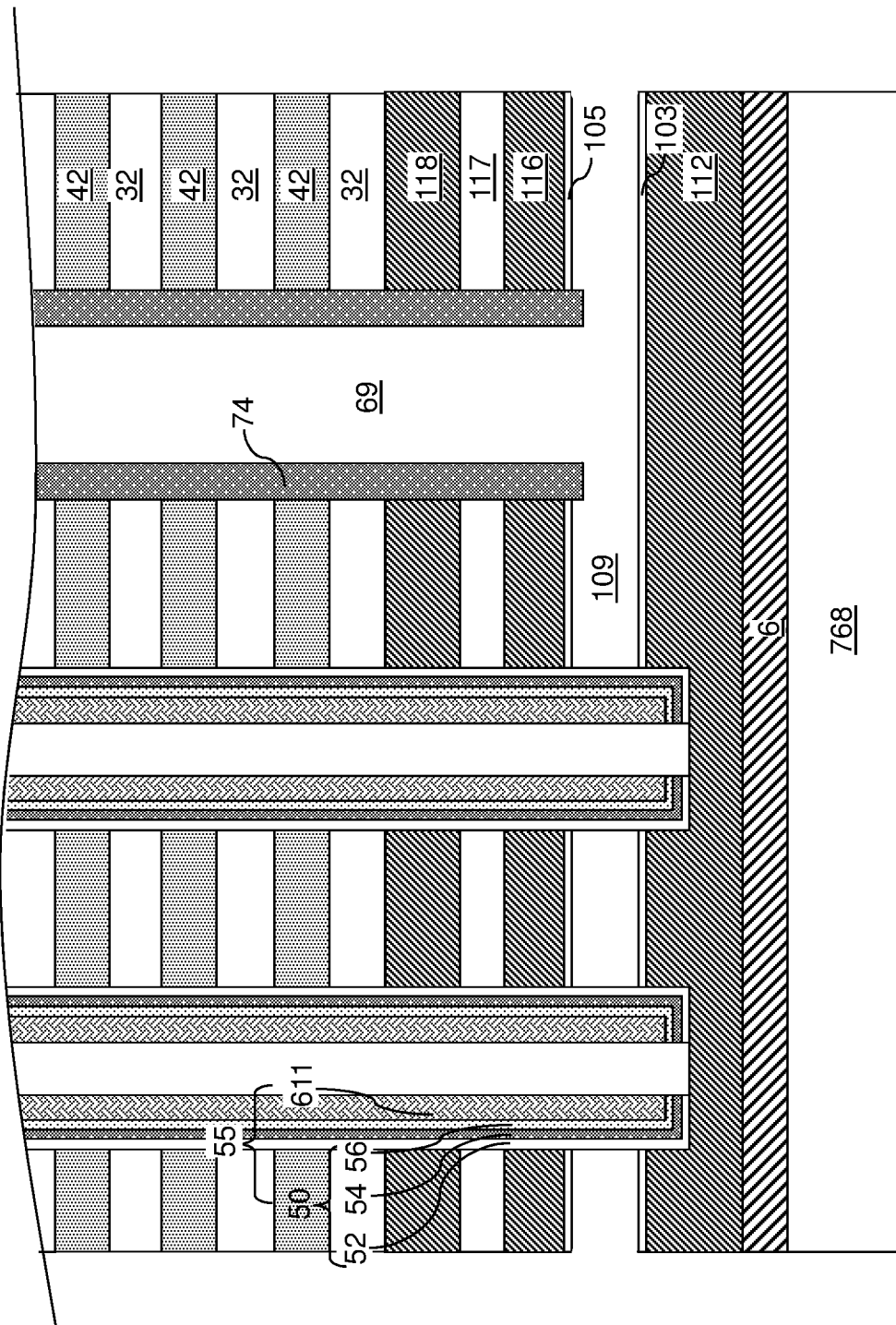

Referring to FIG. 15B, an etchant that etches the material of the source-level sacrificial layer 104 selective to the materials of the alternating stack (32, 42), the insulating cap layer 70, the backside trench spacers 74, and the width-modulated dielectric trench cores 62 can be introduced into the backside via cavities 69 and the elongated backside cavities 169 in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 15C:
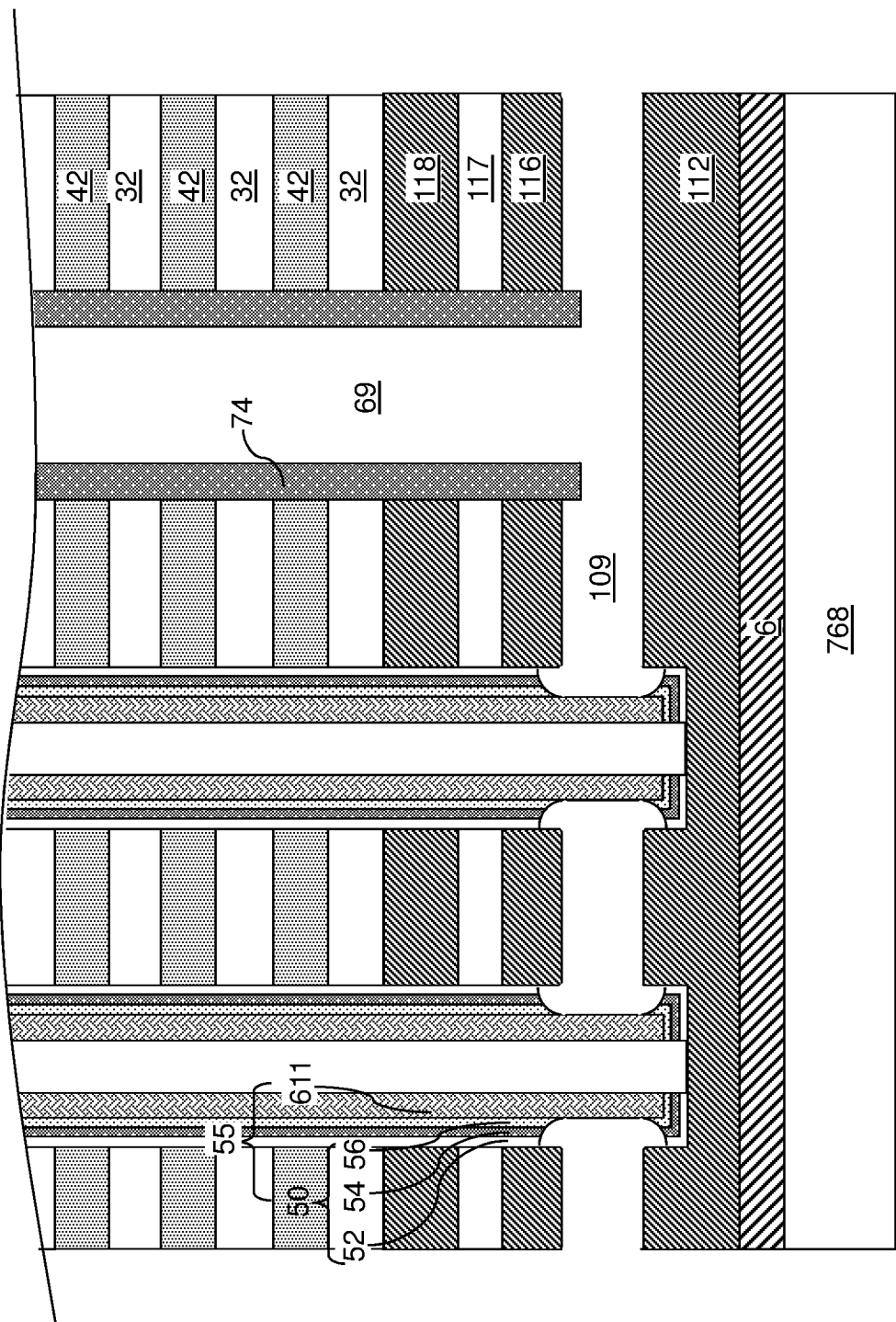

Referring to FIG. 15C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 15D:
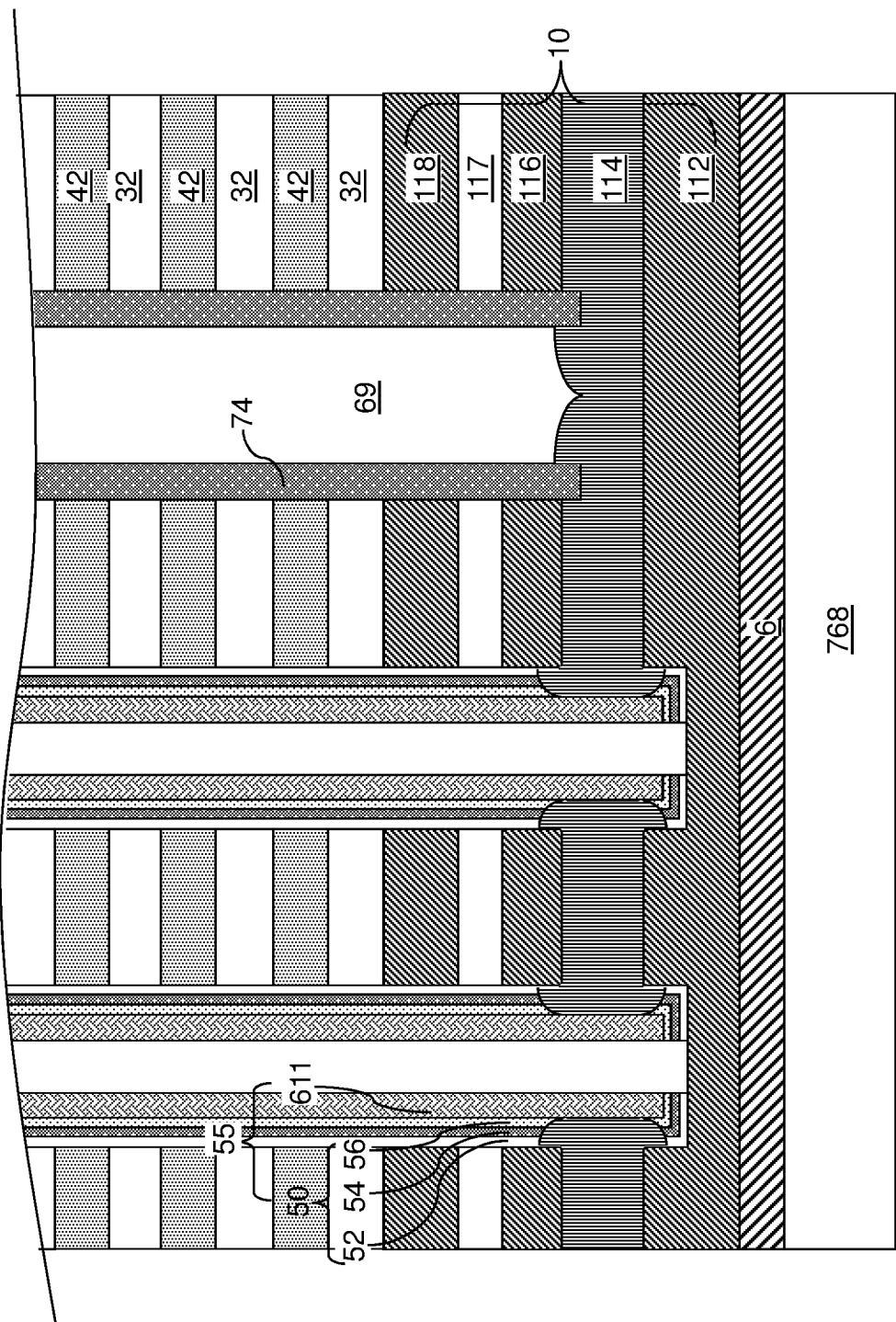

Referring to FIG. 15D, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity 109 is filled with the source contact layer 114, and the source contact layer 114 contacts bottom end portions of inner sidewalls of the backside trench spacers 74. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating strip 117, and the optional source-select-level conductive layer 118 constitutes source-level material layers 10, which replaces the in-process source-level material layers 10'.

Figure 15E:
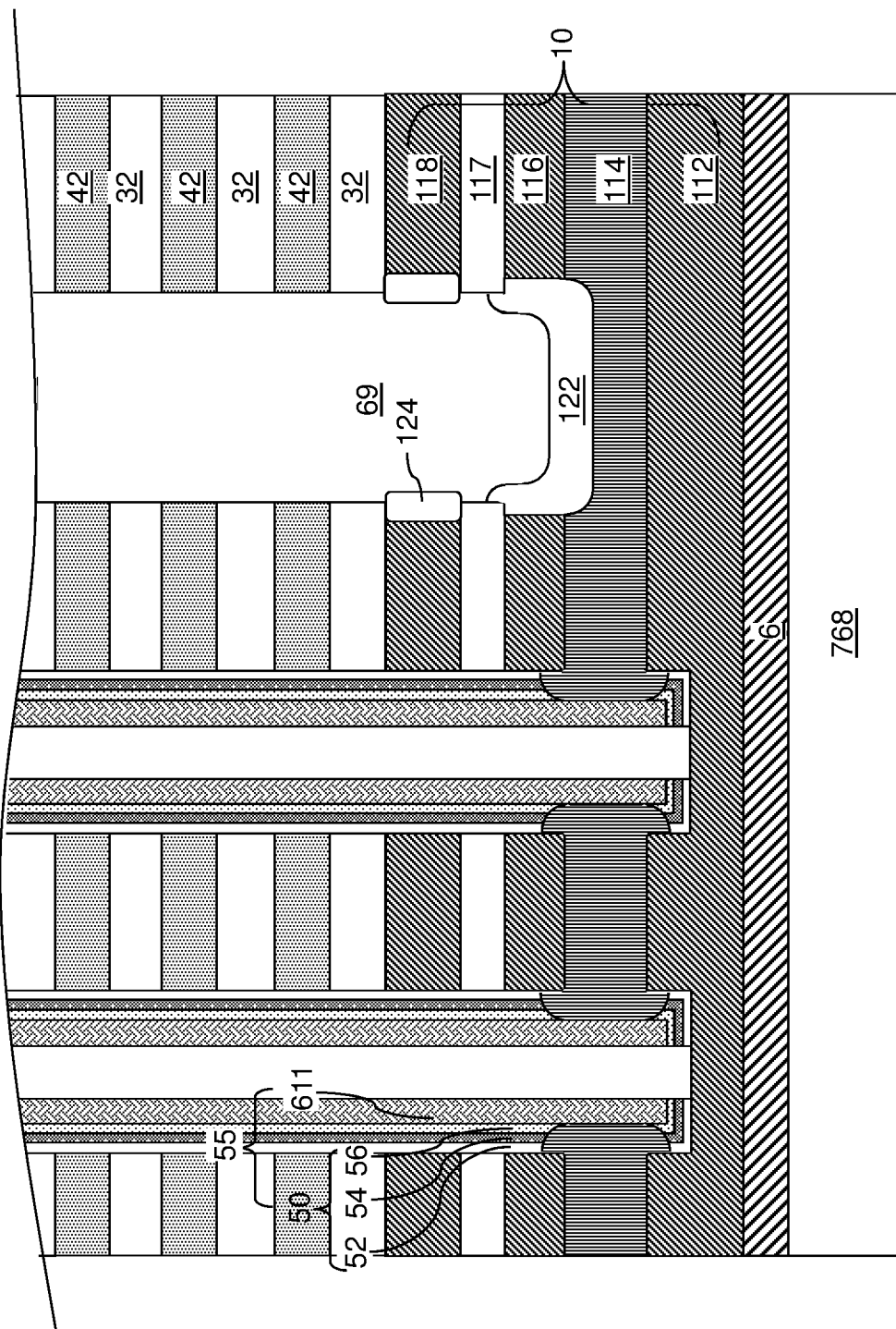

Referring to FIG. 15E, the backside trench spacers 74 can be removed selective to the insulating strips 32, the insulating cap layer 70, and the source contact layer 114 employing an isotropic etch process. For example, if the backside trench spacers 74 include silicon nitride, a wet etch process employing hot phosphoric acid can be performed to remove the backside trench spacers 74. In one embodiment, the isotropic etch process that removes the backside trench spacers 74 can be combined with a subsequent isotropic etch process that etches the sacrificial material strips 42 selective to the insulating strips 32, the insulating cap layer 70, and the source contact layer 114.

An oxidation process can be performed to convert physically exposed surface portions of semiconductor materials into dielectric semiconductor oxide portions. For example, surfaces portions of the source contact layer 114 and the upper source-level material layer 116 can be converted into dielectric semiconductor oxide plates 122, and surface portions of the optional source-select-level conductive layer 118 can be converted into annular dielectric semiconductor oxide spacers 124.

Figure 15F:
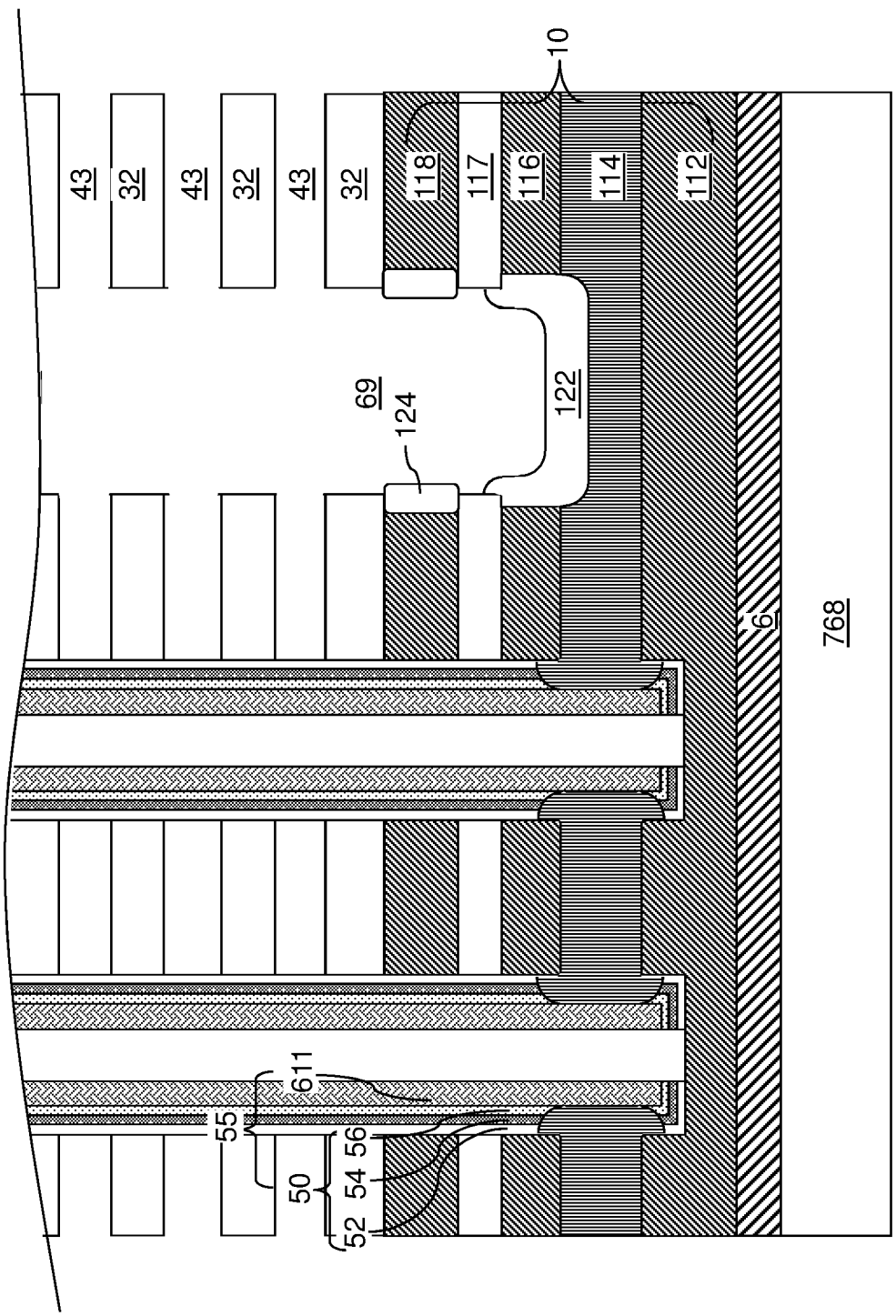

Referring to FIG. 15F, the sacrificial material strips 42 are can be removed selective to the insulating strips 32, the insulating cap layer 70, the source contact layer 114, the dielectric semiconductor oxide plates 122, the annular dielectric semiconductor oxide spacers 124, and the width-modulated dielectric trench cores 62. For example, an etchant that selectively etches the materials of the sacrificial material strips 42 with respect to the materials of the insulating strips 32, the insulating cap layer 70, the retro-stepped dielectric material portion 65, and the material of the outermost layer of the memory films 50 can be introduced into the cavities (69, 169), for example, employing an isotropic etch process.

The isotropic etch process can be a wet etch process employing a wet etch solution, or can be a gas phase (dry) etch process in which the etchant is introduced in a vapor phase into the cavities (69, 169). For example, if the sacrificial material strips 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. A plurality of backside recesses 43 can be formed in the volumes from which the material of the sacrificial material strips 42 is removed. Each of the backside recesses 43 can extend substantially parallel to the top surface of the substrate semiconductor layer 9. A backside recess 43 can be vertically bounded by a top surface of an underlying insulating strip 32 and a bottom surface of an overlying insulating strip 32. In one embodiment, each of the backside recesses 43 can have a uniform height throughout.

Figure 15G:
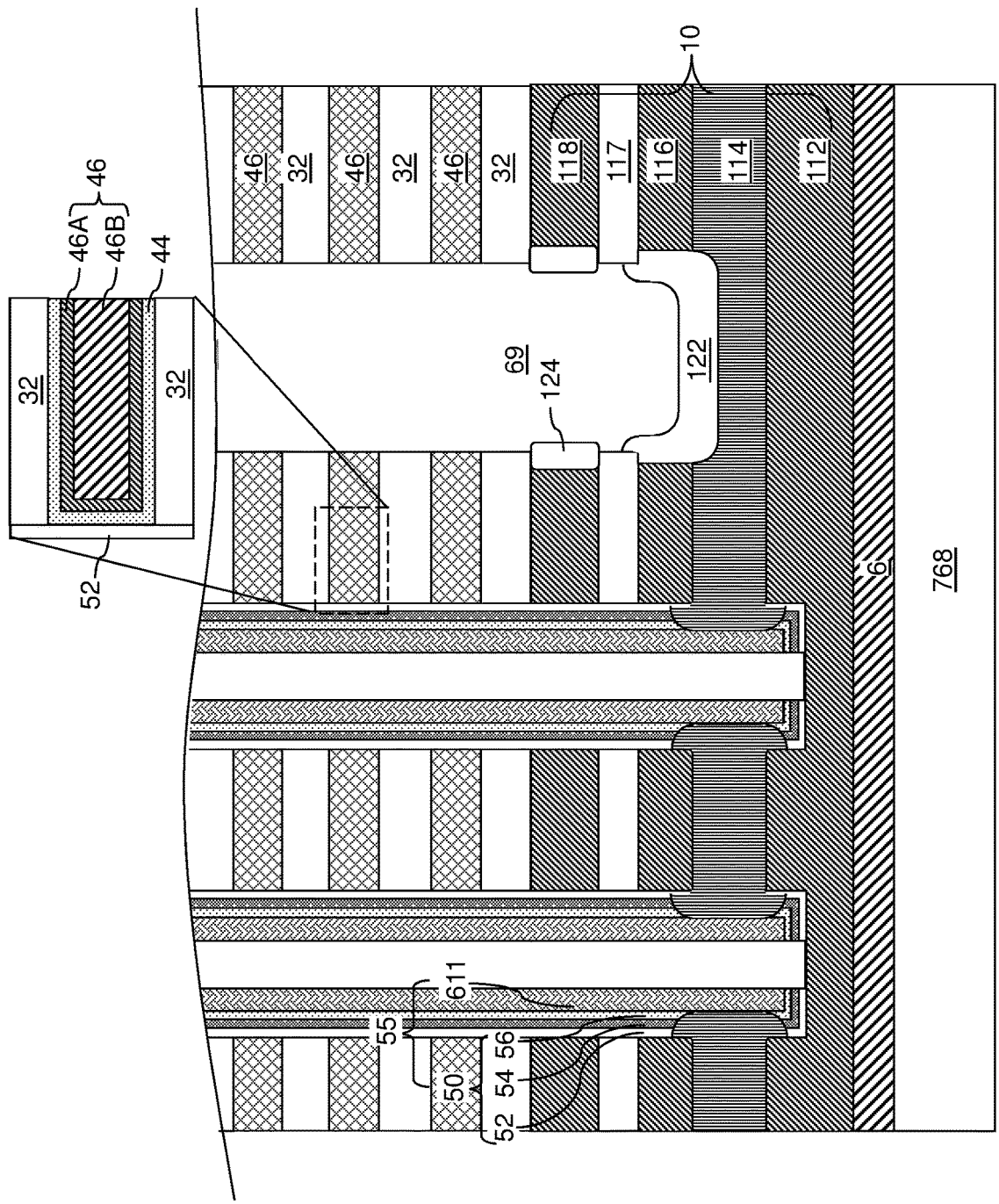

Referring to FIG. 15G, a backside blocking dielectric layer 44 can be subsequently formed in the backside recesses 43. The backside blocking dielectric layer 44 can include at least one dielectric material that is subsequently employed to prevent charge tunneling between the charge storage layers 54 and electrically conductive strips to be subsequently formed in the backside recesses 43. For example, the backside blocking dielectric layer 44 can include silicon oxide and/or a dielectric metal oxide such as aluminum oxide. The backside blocking dielectric layer 44 can be formed by a conformal deposition process such as chemical vapor deposition or atomic layer deposition. The thickness of the backside blocking dielectric layer 44 can be in a range from 1 nm to 6 nm, such as 2 nm to 4 nm, although lesser and greater thicknesses can also be employed.

At least one metallic material can be subsequently deposited in the backside recesses 43 and at peripheral portions of the backside via cavities 69 and the elongated backside cavities 169. For example, a metallic barrier layer 46A can be conformally deposited in the backside recesses 43, for example, by chemical vapor deposition. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, on the sidewalls of each backside via cavity 69 and each elongated backside cavity 169, and over the top surface of the insulating cap layer 70 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. Alternatively, the metallic fill material layer 46B can include a different metallic material such as cobalt, ruthenium, and/or molybdenum. The metallic fill material layer 46B is spaced from the insulating strips 32 and the memory stack structures 55 by the metallic barrier layer 46A, which is a metallic barrier layer that blocks diffusion of fluorine atoms therethrough.

A plurality of electrically conductive strips 46 can be formed in the plurality of backside recesses 43, and a continuous metallic material layer can be formed on the sidewalls of each backside via cavity 69 and each elongated backside cavity 169 and over the insulating cap layer 70. Each electrically conductive strip 46 includes a portion of the metallic barrier layer 46A and a portion of the metallic fill material layer 46B that are located between a vertically neighboring pair of dielectric material layers such as a pair of insulating strips 32. The continuous metallic material layer includes a continuous portion of the metallic barrier layer 46A and a continuous portion of the metallic fill material layer 46B that are located in the backside via cavities 69 and the elongated backside cavities 169 or above the insulating cap layer 70.

The deposited metallic material of the continuous electrically conductive material layer is etched back from the sidewalls of each backside via cavity 69 and each elongated backside cavity 169 and from above the insulating cap layer 70, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the vertical memory devices including the memory stack structures 55. In other words, each electrically conductive strip 46 can be a word line that functions as a common control gate electrode, or a select gate electrode, for the plurality of vertical memory devices.

Figure 16A:
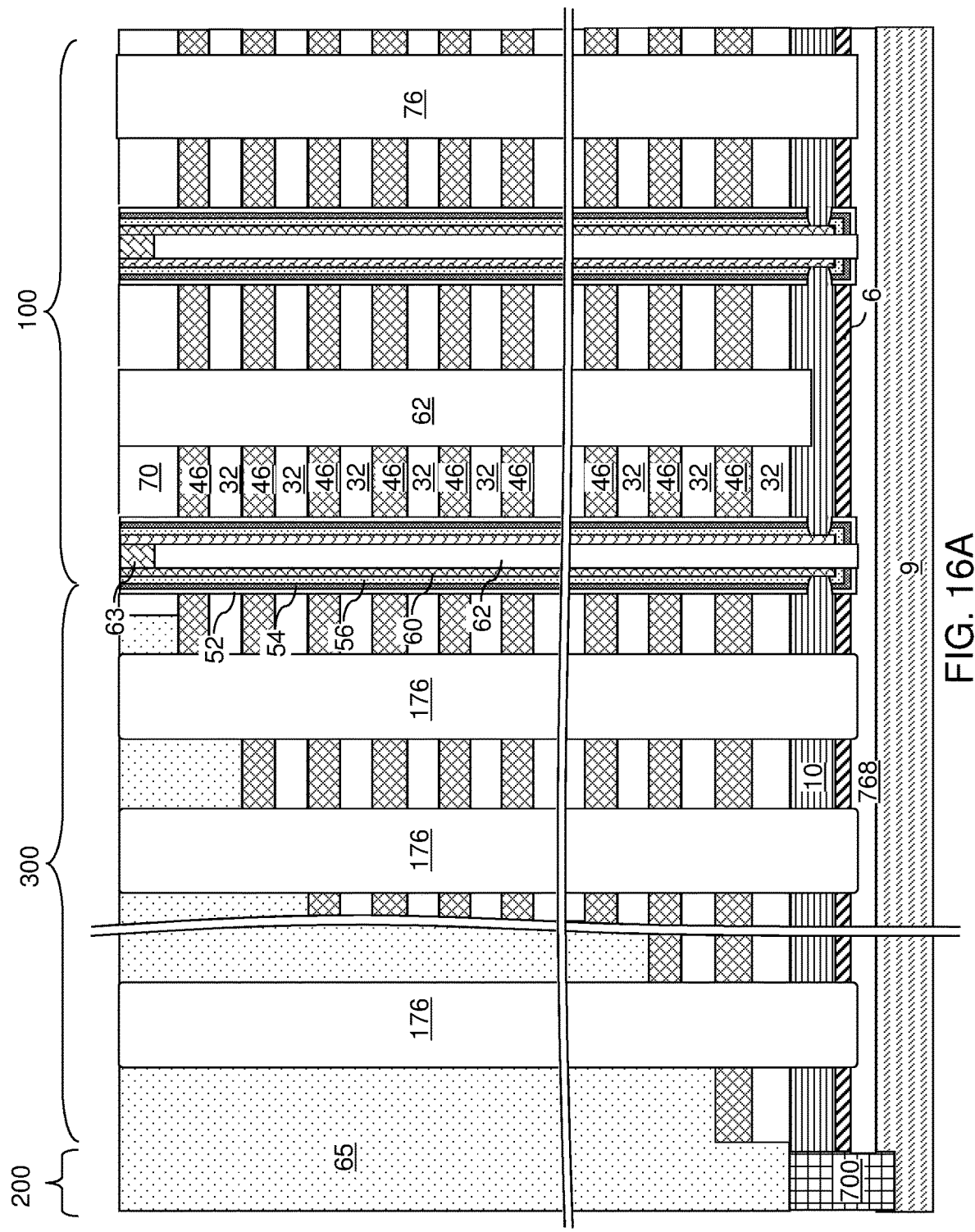
FIG. 16A is a vertical cross-sectional view of the exemplary structure after formation of dielectric isolation structures in the backside via cavities according to an embodiment of the present disclosure.
Figure 16B:
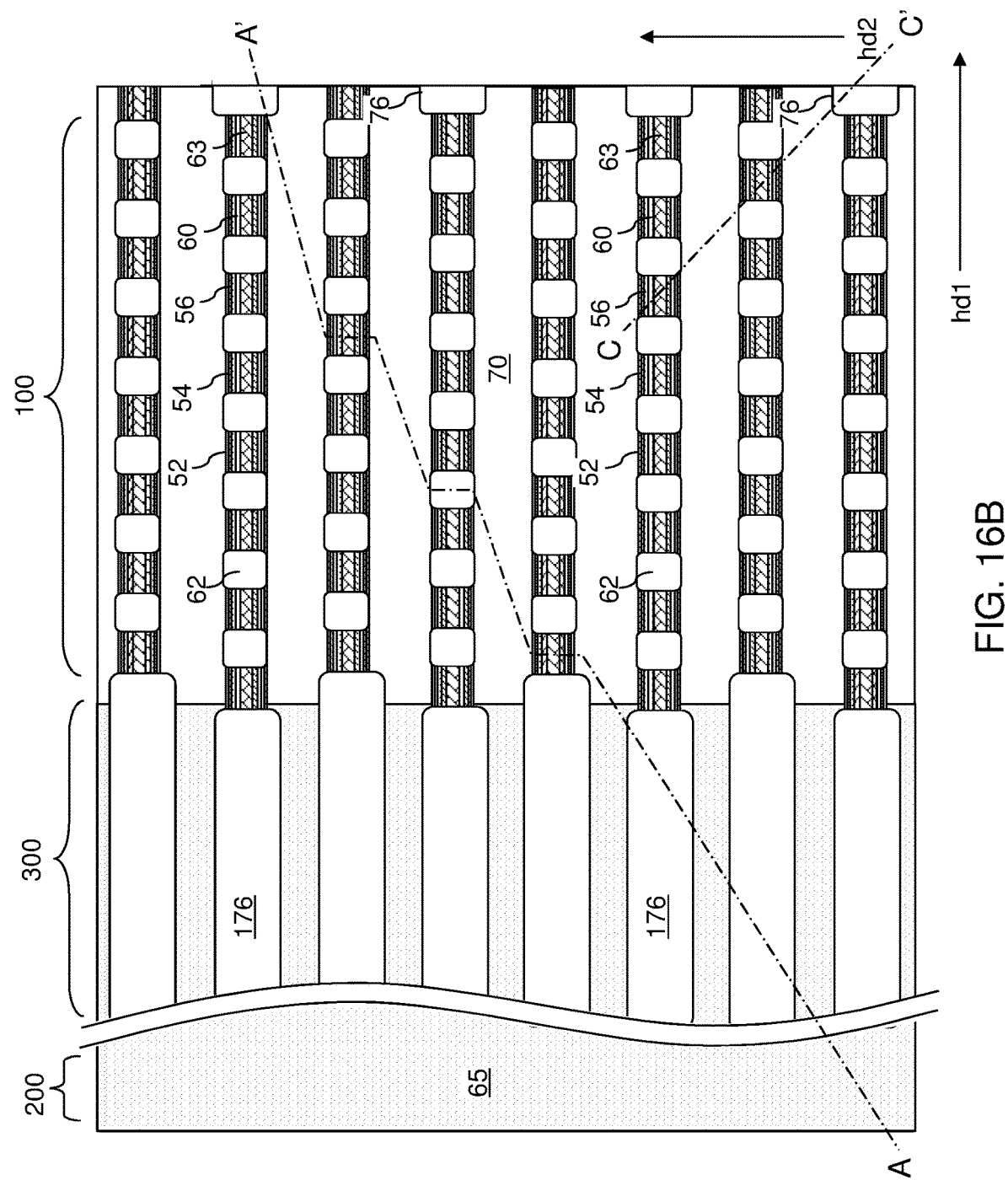
FIG. 16B is a top-down view of the exemplary structure of FIG. 16A. The vertical plane A-A' is the plane of the cross-section for FIG. 16A.
Figure 16C:
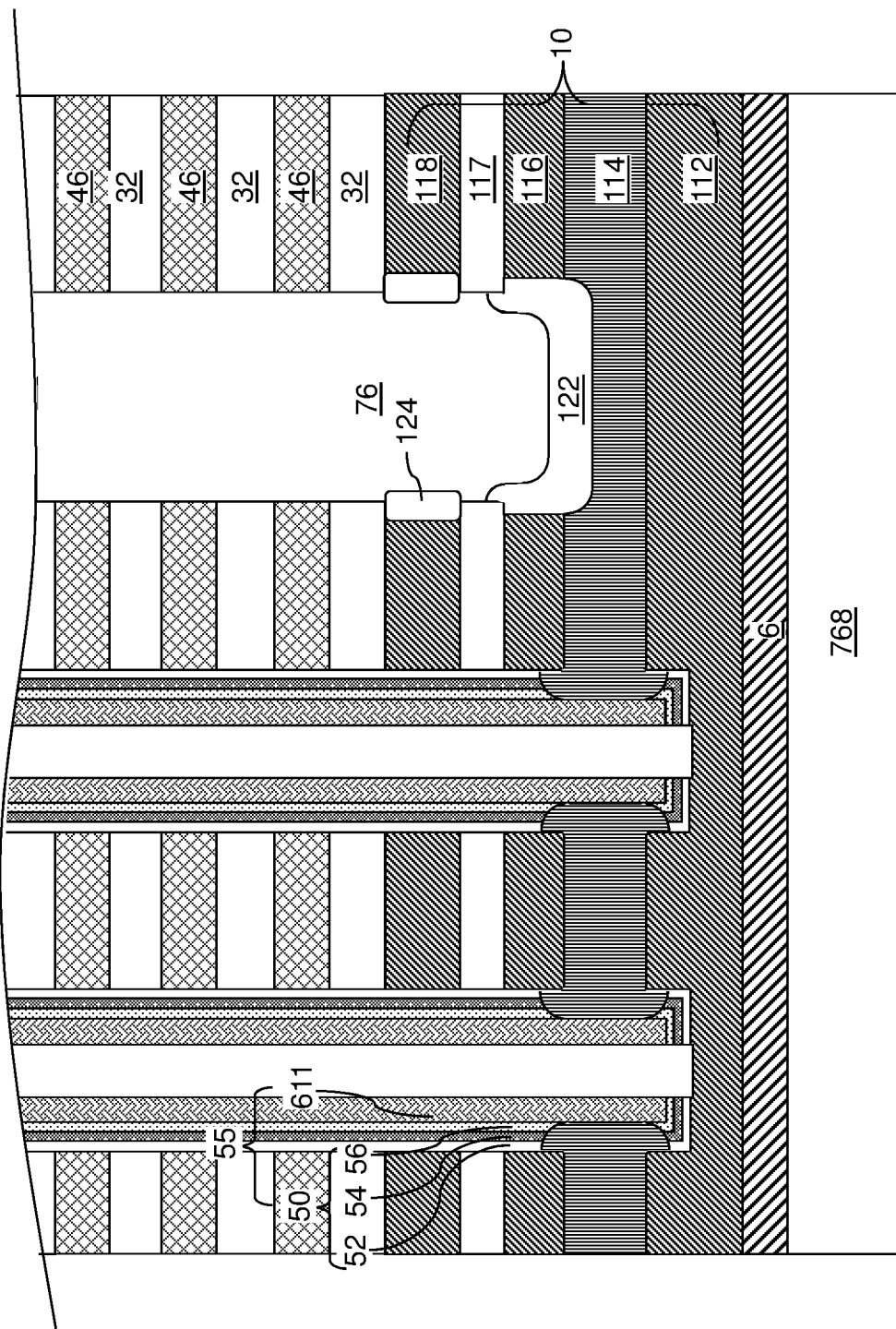
FIG. 16C is a vertical cross-sectional view along the plane C-C' of FIG. 16B.

Referring to FIGS. 16A-16C, a dielectric material is deposited in the backside via cavities 69 and the elongated backside cavities 169 to form dielectric pillar structures 76 and dielectric wall structures 176. Each dielectric pillar structure 76 fills a respective backside via cavity 69. Each dielectric wall structure 176 fills a respective elongated backside cavity 169. Each of the dielectric wall structures 176 can laterally extend along the first horizontal direction hd1. Each of the dielectric pillar structures 76 and the dielectric wall structures 176 can vertically extend through each layer of an alternating stack of the insulating strips 32 and the electrically conductive strips 46.

Figure 17A:
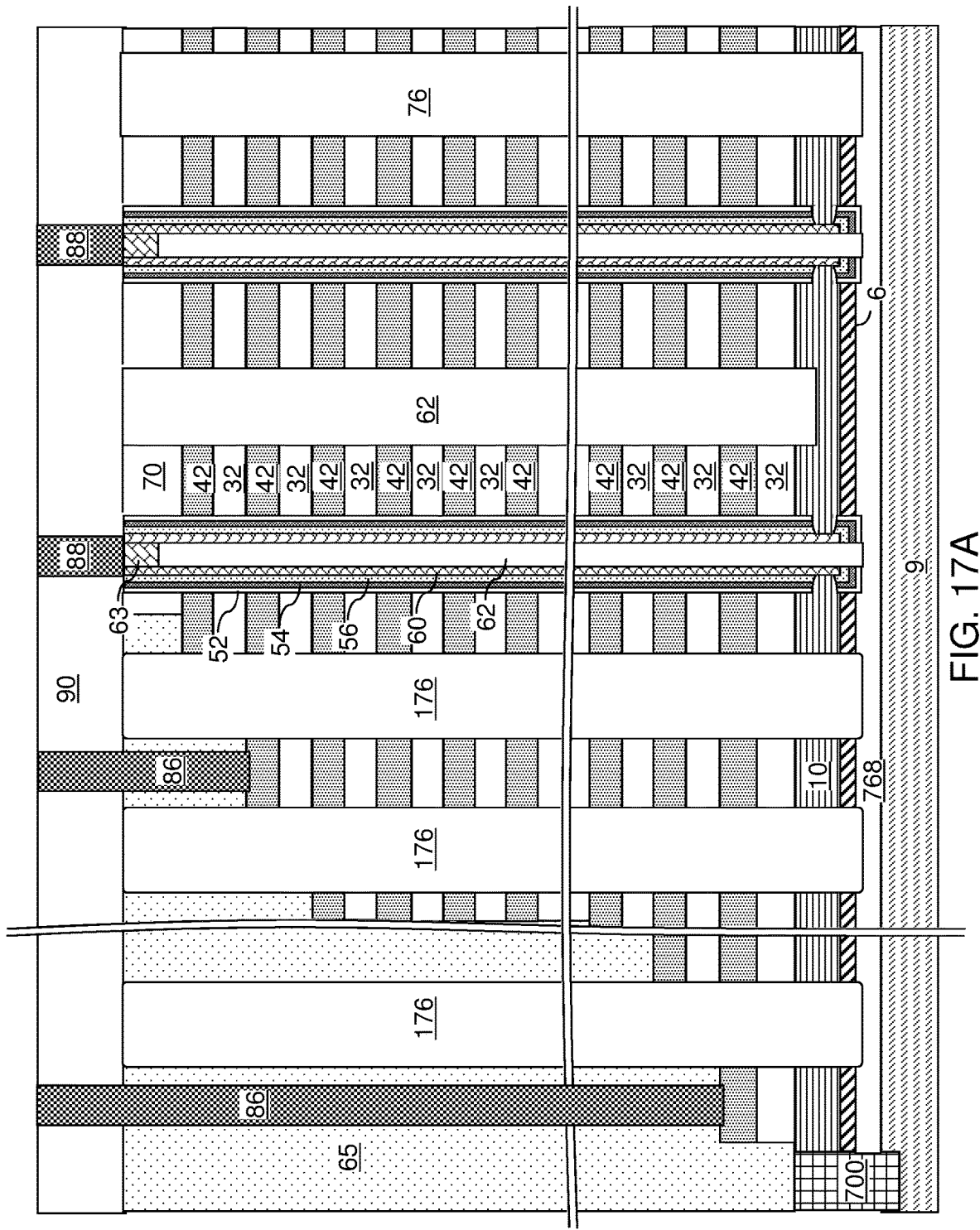
FIG. 17A is a vertical cross-sectional view of the exemplary structure after formation of various contact via structures according to an embodiment of the present disclosure.
Figure 17B:
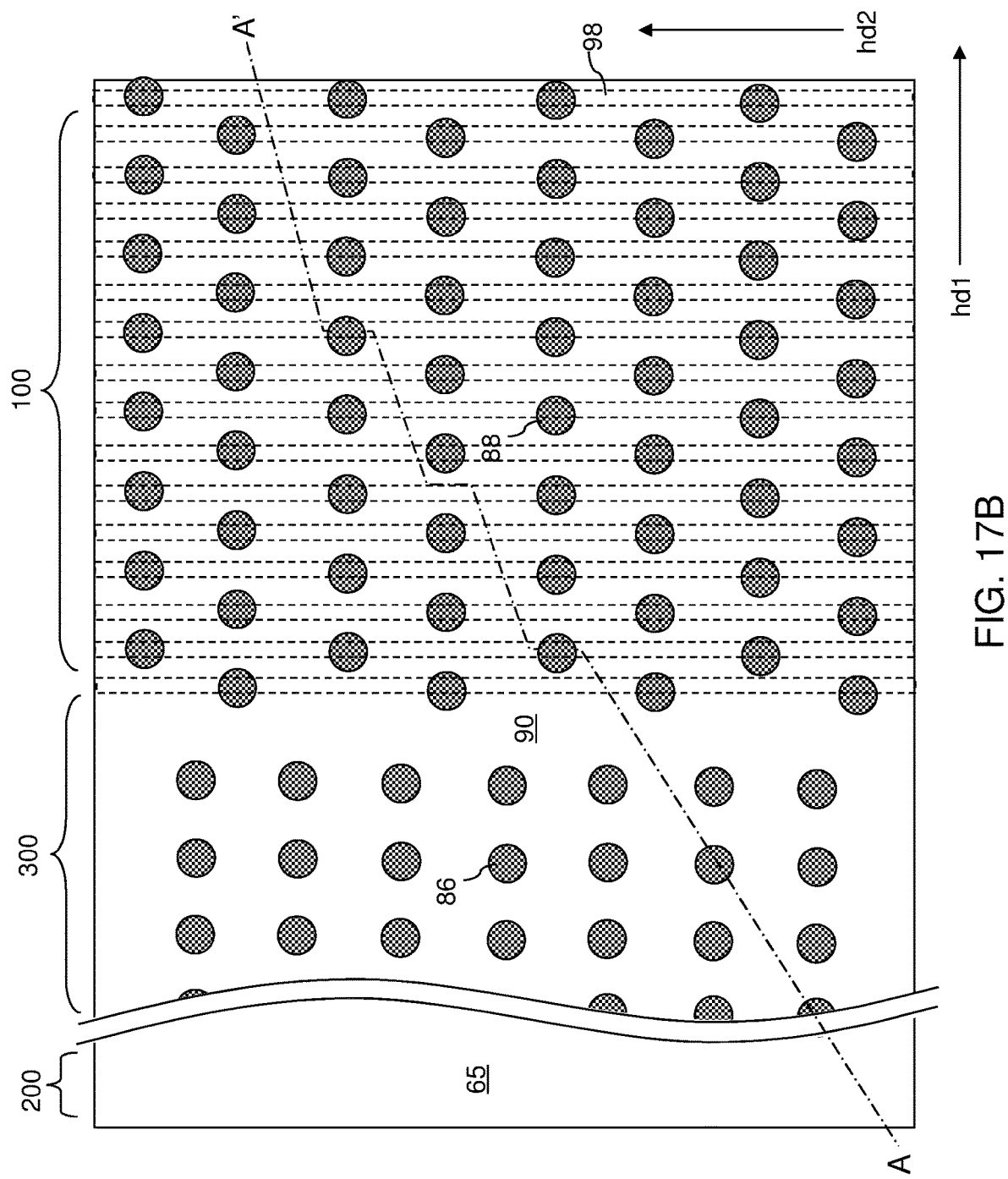
FIG. 17B is a top-down view of the exemplary structure of FIG. 17A. The vertical plane A-A' is the plane of the cross-section for FIG. 17A.

Referring to FIGS. 17A and 17B, a dielectric material such as silicon oxide or organosilicate glass can be deposited over the insulating cap layer 70 to form a contact level dielectric layer 90. For example, plasma enhanced chemical vapor deposition (PECVD) or atmospheric pressure chemical vapor deposition (APCVD) can be employed to deposit the dielectric material. The thickness of the contact level dielectric layer 90 can be in a range from 20 nm to 200 nm, although lesser and greater thicknesses can also be employed.

Drain contact via structures 88 and word line contact via structures 86 can be formed through the contact level dielectric layer 90. The drain contact via structures 88 can be formed on a respective one of the drain regions 63. The word line contact via structures 86 can be formed on a respective one of the electrically conductive strips 46 within the region of the stepped surfaces. Additional metal contact structures can be formed to provide electrical wiring among the various nodes of the exemplary device. Subsequently, bit lines 98 extending along the second horizontal direction can be formed over and in electrical contact with a respective set of drain contact via structures 88.

Referring to all drawings and according to various embodiments of the present disclosure, a three-dimensional memory device is provided, which comprises: alternating stacks of insulating strips 32 and electrically conductive strips 46 located over a substrate 8 and laterally spaced apart among one another by line trenches 149 laterally extending along a first horizontal direction hd1 and are spaced apart along a second horizontal direction hd2; and memory stack structures 55 arranged in rows extending along the first horizontal direction hd1, wherein: each row of memory stack structures 55 is located on a respective sidewall of the line trenches 149; each of the memory stack structures 55 comprises: a vertical semiconductor channel 60, a tunneling dielectric 56 contacting the vertical semiconductor channel 60, a charge storage layer 54 contacting the tunneling dielectric 56, and a composite blocking dielectric 52 contacting the charge storage layer 54 and insulating strips 32 within one of the alternating stacks (32, 46), wherein the composite blocking dielectric 52 comprises, from one side to another, a first dipole-containing blocking dielectric layer stack (521, 522), a homogeneous blocking dielectric layer 523, and a second dipole-containing blocking dielectric layer stack (524, 525).

In one embodiment, the first dipole-containing blocking dielectric layer stack (521, 522) comprises a first dielectric metal oxide layer 521 and a second dielectric metal oxide layer 522; and the second dipole-containing blocking dielectric layer stack (524, 525) comprises a third dielectric metal oxide layer 524 and a fourth dielectric metal oxide layer 525. In one embodiment, the second dielectric metal oxide layer 522 and the third dielectric metal oxide layer 524 comprise, and/or consist essentially of, aluminum oxide. In one embodiment, at least one of the first dielectric metal oxide layer 521 and the fourth dielectric metal oxide layer 525 comprises zirconium oxide. In one embodiment, at least one of the first dielectric metal oxide layer 521 and the fourth dielectric metal oxide layer 525 comprises hafnium oxide.

In one embodiment, the first dielectric metal oxide layer 521 has a higher permittivity and a lower energy barrier height than the second dielectric metal oxide layer 522; and the fourth dielectric metal oxide layer 525 has a higher permittivity and a lower energy barrier height than the third dielectric metal oxide layer 524.

In one embodiment, the homogeneous blocking dielectric layer 523 comprises silicon oxide. In one embodiment, the composite blocking dielectric 52 is symmetric in composition and in thickness with respect to a symmetry plane passing through the homogeneous blocking dielectric layer 523.

In one embodiment, interfaces between each row of memory stack structures 55 and a respective alternating stack of insulating strips 32 and electrically conductive strips 46 are located within a respective two-dimensional vertical plane.

In one embodiment, the three-dimensional memory device comprises width-modulated dielectric trench cores 62 contacting sidewalls of two rows of vertical semiconductor channels 60 and contacting a pair of alternating stacks of insulating strips 32 and electrically conductive strips 46.

In one embodiment, a buried source layer 114 can be embedded within the substrate 8. The buried source layer 114 can contact bottom ends of the vertical semiconductor channels 60 and bottom ends of the composite blocking dielectrics 52.

In one embodiment, drain regions 63 can contact top ends of a respective pair of vertical semiconductor channels 60.

In one embodiment, the three-dimensional memory device can comprise: a contact region 300 in which each of the alternating stacks (32, 46) has respective stepped surfaces that extend from the substrate 8 to a topmost strip within a respective alternating stack (32, 46); and a two-dimensional array of contact via structures 86 contacting a top surface of a respective one of the electrically conductive strips 46 within the alternating stacks (32, 46) in the contact region 300.

The three-dimensional memory devices of the embodiments of the present disclosure provide lower programming and erase voltages through use of a pair of dipole moments within a blocking dielectric 52 and through band gap modification within the blocking dielectric 52. In some embodiments, two dipole moments located within the blocking dielectric can be equal in magnitude and opposite in directions. Use of zirconium oxide or hafnium oxide within each dipole-containing blocking dielectric layer stack provides higher permittivity with a lower energy barrier, thereby improving programming and erasing characteristics.

The threshold voltage characteristics of the device depend on the charge state in the charge storage layer 54, i.e., whether electrons are trapped or not in the charge storage layer 54. Use of the composite blocking dielectric layer 52 including a first dipole-containing blocking dielectric layer stack (521, 522), a homogeneous blocking dielectric layer 523, and a second dipole-containing blocking dielectric layer stack (524, 525) lowers the transition voltage in both states, thereby providing superior performance during programming and erasing.

In one embodiment, and without wishing to be bound by a particular theory, the combination of the inner zirconium oxide blocking layer 521 and the inner aluminum oxide dipole layer 522 improves the device programming. Specifically, the combination is believed to improve program saturation because the inner aluminum oxide dipole layer 522 provides a higher energy barrier for the charge carriers trapped at the interface of the inner zirconium oxide blocking layer 521 and the silicon nitride charge storage layer 54. The inner zirconium oxide blocking layer 521 is also believed to capture charge carriers at low barrier height in the conduction band. Furthermore, the combination is believed to improve program speed and slope because the inner zirconium oxide blocking layer 521 may also decelerate ballistic electrons and exhibit quantum well type behavior to better confine the charge carriers.

In one embodiment, and without wishing to be bound by a particular theory, the combination of the outer zirconium oxide blocking layer 525 and the outer aluminum oxide dipole layer 524 may improves the device erasing due to a lower electric field to reduce back tunneling.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming a vertically alternating sequence of insulating layers and sacrificial material layers over a substrate;
   forming line trenches laterally extending along a first horizontal direction through the vertically alternating sequence, wherein alternating stacks of insulating strips and sacrificial material strips are formed by remaining portions of the vertically alternating sequence;
   forming memory stack structures arranged in rows extending along the first horizontal direction in the line trenches, wherein each row of memory stack structures is formed on a respective sidewall of the line trenches, and each of the memory stack structures comprises:
   a vertical semiconductor channel, a tunneling dielectric contacting the vertical semiconductor channel, a charge storage layer contacting the tunneling dielectric, and a composite blocking dielectric contacting the charge storage layer and contacting the sacrificial material strips within one of the alternating stacks and comprising, from one side to another, a first dipole-containing blocking dielectric layer stack, a homogeneous blocking dielectric layer, and a second dipole-containing blocking dielectric layer stack; and
   replacing the sacrificial material strips with electrically conductive strips;
   wherein:
   the first dipole-containing blocking dielectric layer stack comprises a first dielectric metal oxide layer and a second dielectric metal oxide layer; and
   the second dipole-containing blocking dielectric layer stack comprises a third dielectric metal oxide layer and a fourth dielectric metal oxide layer.

2. The method of claim 1, wherein the memory stack structures are formed by:
   depositing a continuous layer stack including a continuous blocking dielectric layer, a continuous charge storage layer, a continuous tunneling dielectric layer, and a continuous semiconductor channel layer in the line trenches; and dividing the continuous layer stack into discrete layer stacks, wherein each of the discrete layer stacks constitutes a respective memory stack structure.

3. The method of claim 2, further comprising:
forming a sacrificial fill material layer in unfilled volumes of the line trenches after deposition of the continuous layer stack;
patterning the sacrificial fill material layer by forming an array of isolation cavities in areas of the line trenches; and
removing portions of the continuous layer stack around the array of isolation cavities.

4. The method of claim 3, further comprising:
removing the sacrificial fill material layer after removing the portions of the continuous layer stack; and
anisotropically etching horizontal portions of the continuous layer stack, wherein the continuous layer stack is divided into the memory stack structures.

5. The method of claim 1, wherein:
the homogeneous blocking dielectric layer comprises silicon oxide;
the second dielectric metal oxide layer and the third dielectric metal oxide layer comprise aluminum oxide; and
at least one of the first dielectric metal oxide layer and the fourth dielectric metal oxide layer comprises zirconium oxide or hafnium oxide.

6. The method of claim 1, wherein the composite blocking dielectric is symmetric in composition and in thickness with respect to a symmetry plane passing through the homogeneous blocking dielectric layer.

7. A method of forming a three-dimensional memory device, comprising:
forming a vertically alternating sequence of insulating layers and sacrificial material layers over a substrate;
forming line trenches laterally extending along a first horizontal direction through the vertically alternating sequence, wherein alternating stacks of insulating strips and sacrificial material strips are formed by remaining portions of the vertically alternating sequence;
forming memory stack structures arranged in rows extending along the first horizontal direction in the line trenches, wherein each row of memory stack structures is formed on a respective sidewall of the line trenches, and each of the memory stack structures comprises:
a vertical semiconductor channel, a tunneling dielectric contacting the vertical semiconductor channel, a charge storage layer contacting the tunneling dielectric, and a composite blocking dielectric contacting the charge storage layer and contacting the sacrificial material strips within one of the alternating stacks and comprising, from one side to another, a first dipole-containing blocking dielectric layer stack, a homogeneous blocking dielectric layer, and a second dipole-containing blocking dielectric layer stack, wherein the memory stack structures are formed by depositing a continuous layer stack including a continuous blocking dielectric layer, a continuous charge storage layer, a continuous tunneling dielectric layer, and a continuous semiconductor channel layer in the line trenches, and dividing the continuous layer stack into discrete layer stacks, wherein each of the discrete layer stacks constitutes a respective memory stack structure;
replacing the sacrificial material strips with electrically conductive strips;
forming a sacrificial fill material layer in unfilled volumes of the line trenches after deposition of the continuous layer stack;
patterning the sacrificial fill material layer by forming an array of isolation cavities in areas of the line trenches;
removing portions of the continuous layer stack around the array of isolation cavities;
removing the sacrificial fill material layer after removing the portions of the continuous layer stack;
anisotropically etching horizontal portions of the continuous layer stack, wherein the continuous layer stack is divided into the memory stack structures; and
forming width-modulated dielectric trench cores in remaining volumes of the line trenches, wherein each of the width-modulated dielectric trench cores is formed directly on sidewalls of two rows of vertical semiconductor channels and directly on a pair of alternating stacks of insulating strips and electrically conductive strips.

* * * * *